(12) United States Patent
Miyake

(10) Patent No.: US 11,605,655 B2
(45) Date of Patent: Mar. 14, 2023

(54) SEMICONDUCTOR DEVICE, AND MODULE AND ELECTRONIC APPLIANCE INCLUDING THE SAME

(71) Applicant: Semiconductor Energy Laboratory Co., Ltd., Kanagawa-ken (JP)

(72) Inventor: Hiroyuki Miyake, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 506 days.

(21) Appl. No.: 16/683,871

(22) Filed: Nov. 14, 2019

(65) Prior Publication Data

US 2020/0083260 A1 Mar. 12, 2020

Related U.S. Application Data

(63) Continuation of application No. 14/628,657, filed on Feb. 23, 2015, now Pat. No. 10,483,293.

(30) Foreign Application Priority Data

Feb. 27, 2014 (JP) .............................. JP2014-037156

(51) Int. Cl.
*G09G 3/3291* (2016.01)
*H01L 27/12* (2006.01)
(Continued)

(52) U.S. Cl.
CPC ....... *H01L 27/1255* (2013.01); *G09G 3/3233* (2013.01); *G09G 3/3266* (2013.01);
(Continued)

(58) Field of Classification Search
CPC .. G09G 3/3233; G09G 3/3266; G09G 3/3291; G09G 2300/0819;
(Continued)

(56) References Cited

U.S. PATENT DOCUMENTS 5,550,066 A 8/1996 Tang et al.
6,048,573 A 4/2000 Tang et al.
(Continued)

FOREIGN PATENT DOCUMENTS

EP 2 525 405 A2 11/2012
JP 2007-179042 A 7/2007
(Continued)

*Primary Examiner* — Stacy Khoo
(74) *Attorney, Agent, or Firm* — Husch Blackwell LLP

(57) ABSTRACT

First to fourth switches are provided so that conduction states are able to be controlled independently of each other. The first switch, the third switch, and the second switch are electrically connected in series between a first wiring and a third wiring. The fourth switch has a function of controlling a conduction state between the light-emitting element and a fourth wiring. In a first transistor, a gate is electrically connected to a node to which the third switch and the second switch are electrically connected, one of a source and a drain is electrically connected to a second wiring, and the other is electrically connected to the light-emitting element. A capacitor includes first and second electrodes, the first electrode is electrically connected to a node to which the first switch and the third switch are electrically connected, and the second electrode is electrically connected to the light-emitting element.

6 Claims, 39 Drawing Sheets

(51) Int. Cl.
*G09G 3/3233* (2016.01)
*G09G 3/3266* (2016.01)
*H01L 29/786* (2006.01)

(52) U.S. Cl.
CPC ......... *G09G 3/3291* (2013.01); *H01L 27/124* (2013.01); *H01L 27/1225* (2013.01); *H01L 27/1251* (2013.01); *H01L 29/78648* (2013.01); *G09G 2300/0819* (2013.01); *G09G 2300/0842* (2013.01); *G09G 2300/0861* (2013.01); *G09G 2310/0248* (2013.01); *G09G 2310/0286* (2013.01); *G09G 2310/0297* (2013.01)

(58) Field of Classification Search
CPC ... G09G 2300/0842; G09G 2300/0861; G09G 2310/0248; G09G 2310/0286; G09G 2310/029; H01L 27/1225; H01L 27/124; H01L 27/1251; H01L 27/1255; H01L 29/78648
See application file for complete search history.

(56) References Cited

U.S. PATENT DOCUMENTS

| | | | |
|---|---|---|---|
| 6,229,506 B1 | 5/2001 | Dawson et al. |
| 6,362,798 B1 | 3/2002 | Kimura et al. |
| 6,583,775 B1 | 6/2003 | Sekiya et al. |
| 6,611,130 B2 | 8/2003 | Chang |
| 6,750,833 B2 | 6/2004 | Kasai |
| 6,859,193 B1 | 2/2005 | Yumoto |
| 6,891,356 B2 | 5/2005 | Kimura et al. |
| 7,015,884 B2 | 3/2006 | Kwon |
| 7,173,584 B2 | 2/2007 | Kimura et al. |
| 7,253,665 B2 | 8/2007 | Kimura |
| 7,324,101 B2 | 1/2008 | Miyazawa |
| 7,365,713 B2 | 4/2008 | Kimura |
| 7,429,985 B2 | 9/2008 | Kimura et al. |
| 7,456,810 B2 | 11/2008 | Kimura |
| 7,671,826 B2 | 3/2010 | Kimura |
| 7,679,585 B2 | 3/2010 | Kimura |
| 7,817,117 B2 | 10/2010 | Kimura |
| 7,924,244 B2 | 4/2011 | Kimura et al. |
| 7,982,696 B2 | 7/2011 | Kimura |
| 8,164,547 B2 | 4/2012 | Kimura |
| 8,242,496 B2 | 8/2012 | Yamazaki et al. |
| 8,264,430 B2 | 9/2012 | Kimura |
| 8,384,079 B2 | 2/2013 | Yamazaki et al. |
| 8,445,905 B2 | 5/2013 | Yamazaki et al. |
| 8,599,115 B2 | 12/2013 | Kimura |
| 8,618,546 B2 | 12/2013 | Jeong et al. |
| 8,717,261 B2 | 5/2014 | Kimura |
| 8,772,093 B2 | 7/2014 | Yamazaki et al. |
| 8,796,785 B2 | 8/2014 | Shishido |
| 8,809,856 B2 | 8/2014 | Yamazaki et al. |
| 8,872,739 B2 | 10/2014 | Kimura |
| 8,878,589 B2 | 11/2014 | Kimura |
| 9,041,630 B2 | 5/2015 | Kimura |
| 9,048,257 B2 | 6/2015 | Jeong et al. |
| 9,111,893 B2 | 8/2015 | Ebisuno et al. |
| 9,123,297 B2 | 9/2015 | Tsuge |
| 9,142,568 B2 | 9/2015 | Yamazaki et al. |
| 9,142,570 B2 | 9/2015 | Yamazaki et al. |
| 9,240,425 B2 | 1/2016 | Yamazaki et al. |
| 9,276,037 B2 | 3/2016 | Kimura |
| 9,379,142 B2 | 6/2016 | Kimura |
| 9,401,112 B2 | 7/2016 | Ohara et al. |
| 9,484,365 B2 | 11/2016 | Shishido |
| 9,515,192 B2 | 12/2016 | Yamazaki et al. |
| 9,569,996 B2 | 2/2017 | Kimura |
| 9,852,687 B2 | 12/2017 | Tsuge et al. |
| 10,079,306 B2 | 9/2018 | Yamazaki et al. |
| 10,483,293 B2 | 11/2019 | Miyake |
| 10,680,111 B2 | 6/2020 | Yamazaki et al. |
| 11,106,101 B2 | 8/2021 | Yamazaki et al. |
| 2002/0070913 A1 | 6/2002 | Kimura et al. |
| 2003/0090481 A1 | 5/2003 | Kimura |
| 2006/0208977 A1 | 9/2006 | Kimura |
| 2006/0256047 A1 | 11/2006 | Kimura et al. |
| 2006/0290617 A1 | 12/2006 | Miyazawa |
| 2007/0126664 A1 | 6/2007 | Kimura |
| 2008/0225061 A1 | 9/2008 | Kimura et al. |
| 2008/0316152 A1 | 12/2008 | Kimura et al. |
| 2009/0009676 A1 | 1/2009 | Kimura et al. |
| 2009/0051674 A1 | 2/2009 | Kimura et al. |
| 2009/0225010 A1 | 9/2009 | Kimura |
| 2010/0220092 A1 | 9/2010 | Kimura |
| 2010/0220117 A1 | 9/2010 | Kimura |
| 2011/0205144 A1 | 8/2011 | Kimura et al. |
| 2012/0287177 A1 | 11/2012 | Koyama et al. |
| 2013/0021316 A1 | 1/2013 | Inoue et al. |
| 2015/0268763 A1* | 9/2015 | Zhou .................. G06F 3/042 345/82 |
| 2022/0043314 A1 | 2/2022 | Yamazaki et al. |

FOREIGN PATENT DOCUMENTS

| | | |
|---|---|---|
| JP | 2007-298973 A | 11/2007 |
| JP | 2008-039843 A | 2/2008 |
| JP | 2011-040726 A | 2/2011 |
| JP | 2011-049548 A | 3/2011 |
| JP | 2011-164591 A | 8/2011 |
| JP | 2012-080096 A | 4/2012 |
| JP | 2012-242834 A | 12/2012 |
| JP | 2012-256032 A | 12/2012 |
| JP | 2013-033228 A | 2/2013 |
| JP | 2013-044847 A | 3/2013 |
| JP | 2013-137498 A | 7/2013 |
| JP | 2015-179259 A | 10/2015 |
| WO | WO 2007/063814 A1 | 6/2007 |
| WO | WO 2011/007677 A1 | 1/2011 |
| WO | WO 2011/013522 A1 | 2/2011 |
| WO | WO 2011/086837 A1 | 7/2011 |
| WO | WO 2013/021623 A1 | 2/2013 |
| WO | WO 2013/171938 A1 | 11/2013 |
| WO | WO 2014/021158 A1 | 2/2014 |
| WO | WO 2015/033496 A1 | 3/2015 |

* cited by examiner $Id2 = 0.5\beta(Vgs2-Vth)^2$
$= 0.5\beta(Vdata-V0+Vth2-Vth2)^2$
$= 0.5\beta(Vdata-V0)^2$

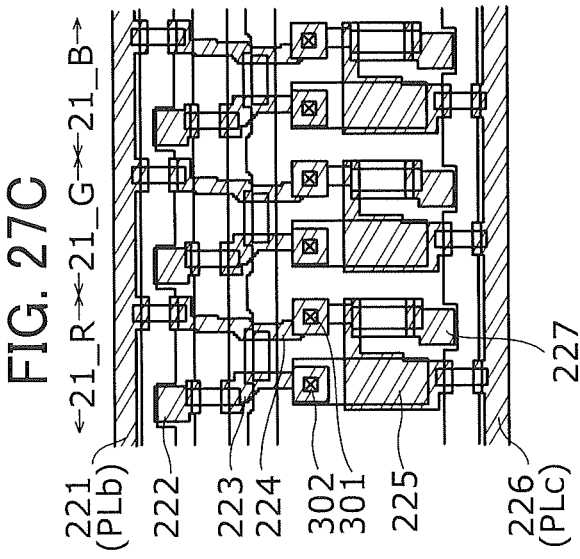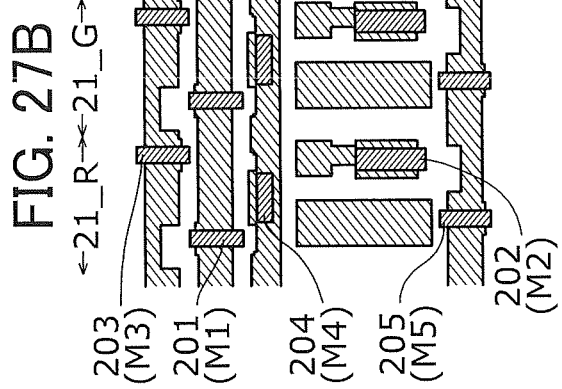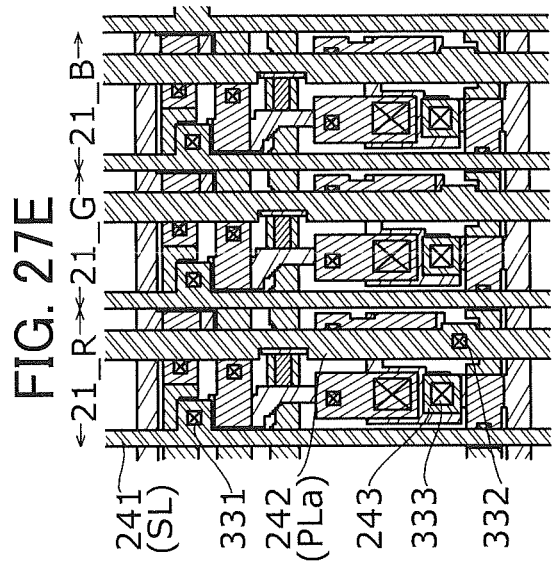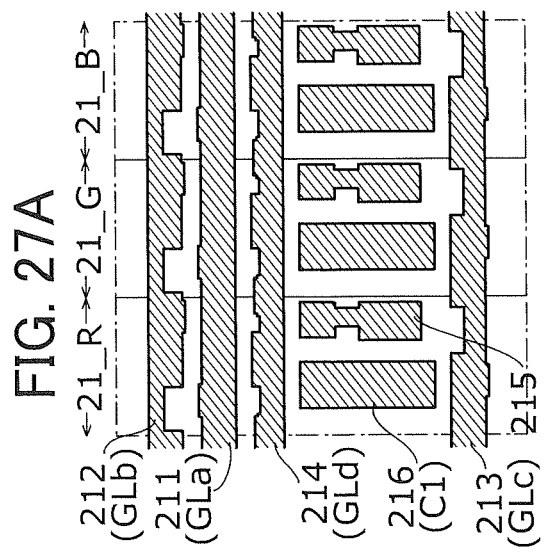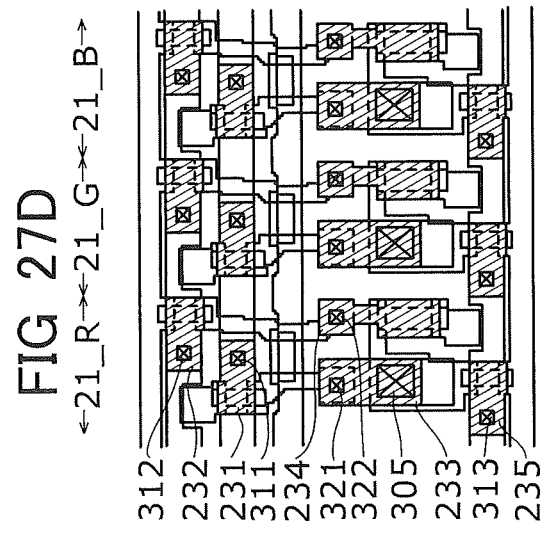

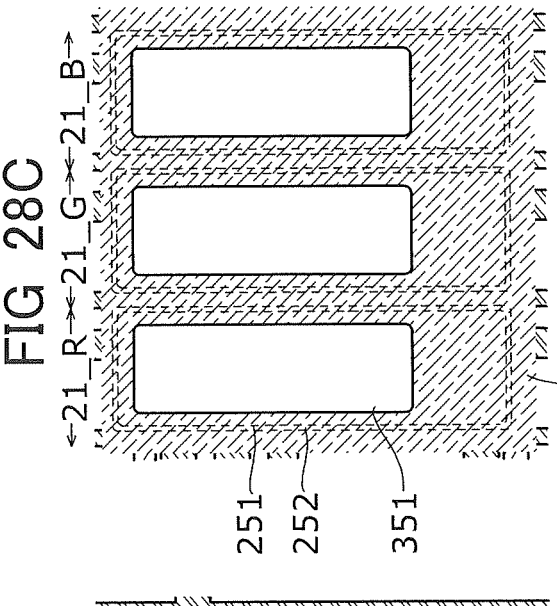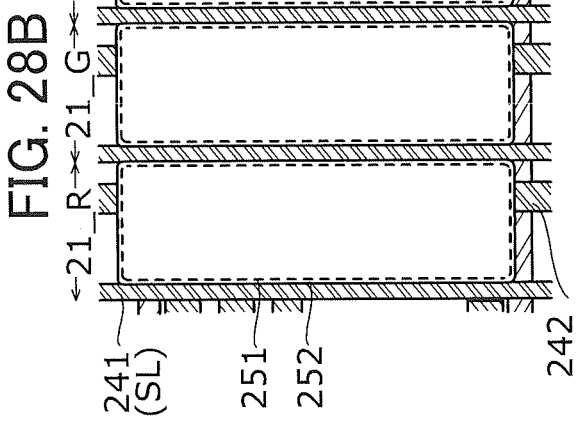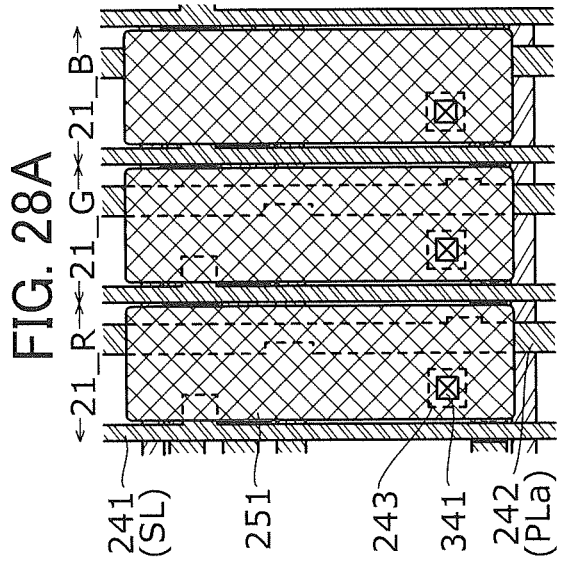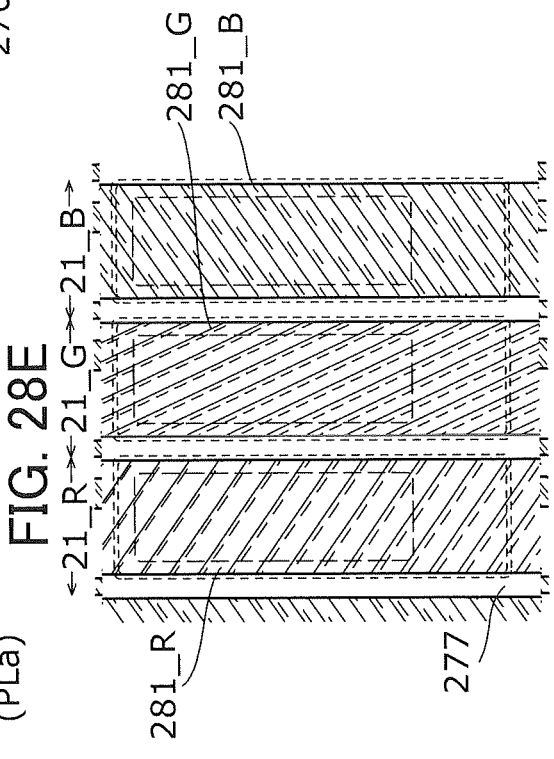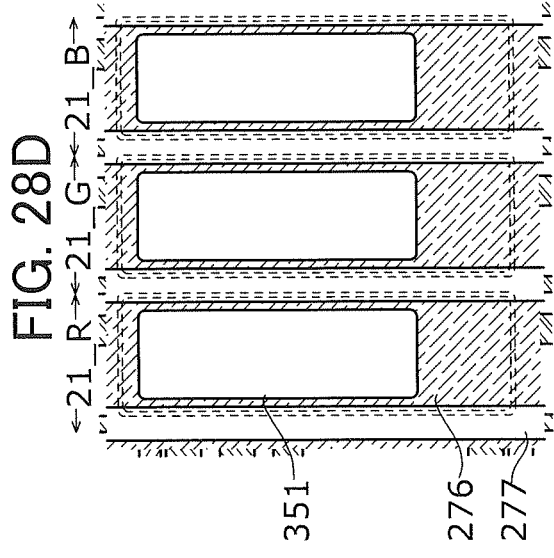

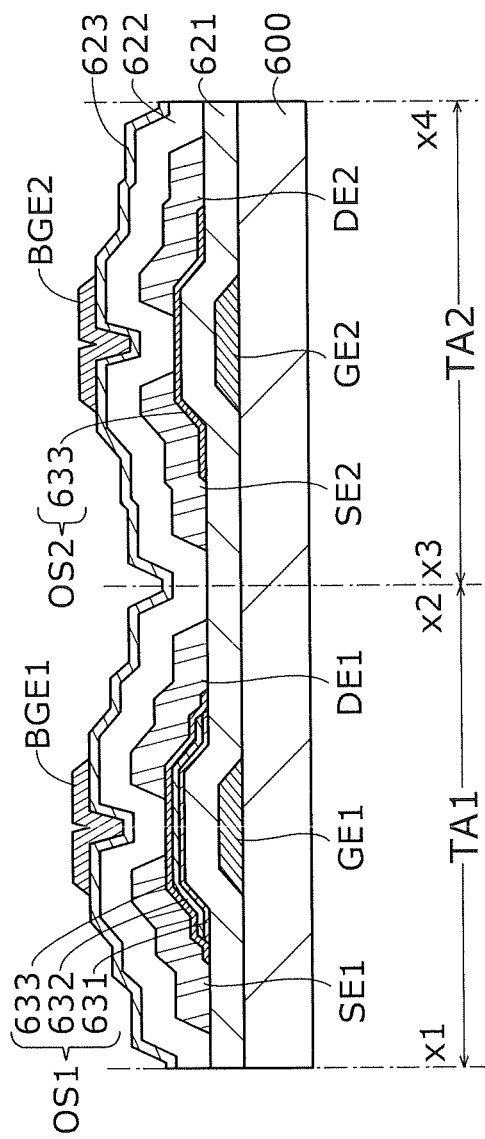
FIG. 29A
FIG. 29C
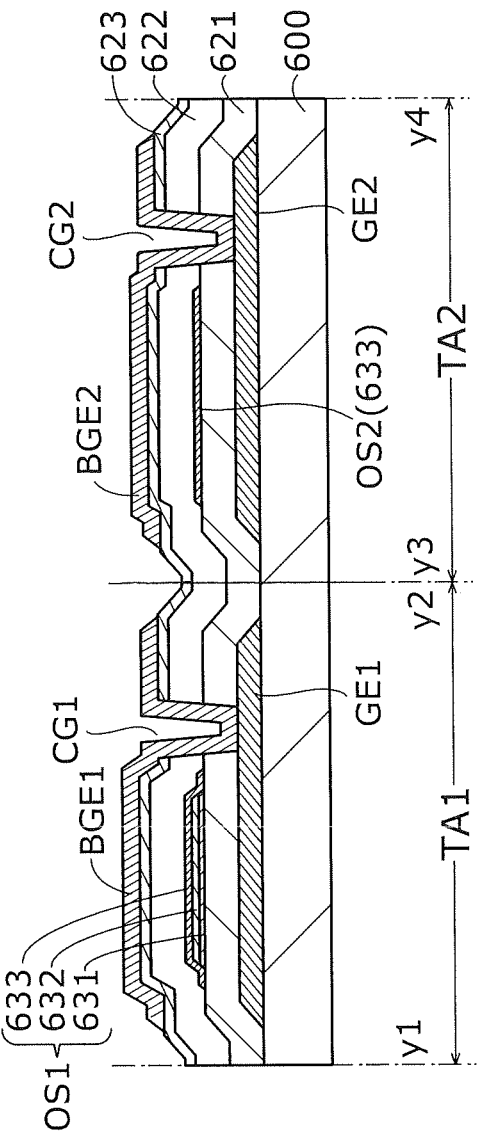
FIG. 29B
FIG. 29D

SEMICONDUCTOR DEVICE, AND MODULE AND ELECTRONIC APPLIANCE INCLUDING THE SAME

This application is a continuation of copending U.S. application Ser. No. 14/628,657, filed on Feb. 23, 2015 which is incorporated herein by reference.

BACKGROUND OF THE INVENTION

1. Field of the Invention

One embodiment of the present invention relates to a semiconductor device, a driving method thereof, a manufacturing method thereof, and the like.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition (a composition of matter). Therefore, more specifically, as the technical field of one embodiment of the present invention disclosed in this specification, a semiconductor device, a display device, a liquid crystal display device, a light-emitting device, a lighting device, a power storage device, a storage device, a driving method of them, or a manufacturing method of them can be given.

2. Description of the Related Art

As for pixels of active matrix display devices using light-emitting elements, a variety of circuit configurations are proposed by every manufacturer. In general, a pixel is provided with at least a light-emitting element, a transistor which controls input of a video signal to the pixel (switching transistor), and a transistor which controls a current supplied to a light-emitting element (driving transistor). Supplying a source-drain current (hereinafter, referred to as a drain current in some cases) flowing in the driving transistor to the light-emitting element makes the light-emitting element emit light at a luminance corresponding to the value of the drain current. The drain current value of the driving transistor is controlled by the potential of a video signal.

Therefore, when there is variation in the threshold voltage of the driving transistor between a plurality of pixels included in a screen of a display device, even when video signals with the same potential are supplied to these pixels, variation in the luminance of the light-emitting element is caused. The variation in the threshold voltage of the driving transistor between a plurality of pixels is one cause of a reduction in the display quality of the display device. Meanwhile, an increase in the number of pixels in an active matrix display device is advanced to increase the resolution, and as many as hundreds of thousands to tens of millions of pixels are provided in one display device. For example, in the case of a resolution of full-HD, the number of pixels is 1366×768×3 (RGB)=1,049,088; and in the case of 8k4k (Super Hi-Vision), it is 7,680×4,320×3 (RGB)=33,177,600. It is highly difficult to make the threshold voltages of driving transistors in such a large number of pixels completely equal to each other. Thus, to suppress an influence of the variation in the threshold voltage, a pixel which is capable of correcting the threshold voltage of a driving transistor is proposed (see Patent Documents 1 and 2).

PRIOR ART DOCUMENT

Patent Documents

[Patent Document 1] Japanese Published Patent Application No. 2012-256032
[Patent Document 2] Japanese Published Patent Application No. 2013-137498

SUMMARY OF THE INVENTION

An object of one embodiment of the present invention is to provide a novel semiconductor device, a novel driving method thereof, a novel manufacturing method thereof, or the like. For example, an object of one embodiment of the present invention is to provide a semiconductor device whose display quality can be improved or a driving method thereof, to provide a high-resolution semiconductor device or a driving method thereof, to provide a semiconductor device in which variation in luminance between pixels can be reduced or a driving method thereof, to provide a semiconductor device whose number of terminals can be reduced or a driving method thereof, or the like.

Note that the description of a plurality of objects does not mutually preclude the existence. Furthermore, one embodiment of the present invention does not necessarily achieve all the objects described above as an examples. In addition, objects other than those described as examples are apparent from the description of the specification, drawings, claims, and the like, and also these objects could be an object of one embodiment of the present invention.

One embodiment of the present invention is a semiconductor device which includes a first transistor, a first capacitor including first and second electrodes, a pixel electrode, first to fourth switches, and first to fourth wirings, and which is characterized in that the first to fourth switches are provided so that the conduction states can be controlled independently of each other; the first switch, the third switch, and the second switch are electrically connected in series between the first wiring and the third wiring; the first electrode is electrically connected to a first node to which the first switch and the third switch are electrically connected; the fourth switch has a function of controlling a conduction state between the pixel electrode and the fourth wiring; the second electrode is electrically connected to the pixel electrode; a gate of the first transistor is electrically connected to a second node to which the third switch and the second switch are electrically connected; one of a source and a drain of the first transistor is electrically connected to the second wiring; and the other of the source and the drain of the first transistor is electrically connected to the pixel electrode.

In the above embodiment, second to fifth transistors functioning as the first to fourth switches may be provided. In this case, the first to fifth transistors may include an oxide semiconductor layer including a region where a channel is formed. Alternatively, in the above embodiment, a light-emitting element provided with a pixel electrode may be included.

The semiconductor device in this specification indicates all the devices that operate by utilizing semiconductor characteristics. A semiconductor element such as a transistor or a diode, a semiconductor circuit, an arithmetic device, a storage device, an imaging device, a display device, a light-emitting device, and the like are each one embodiment of a semiconductor device. Moreover, an imaging device, a display device, a liquid crystal display device, a light-emitting device, an electro-optical device, a power generation device (including a thin film solar cell, an organic thin film solar cell, and the like), an electronic appliance, an electrical appliance, a mechanical device, and the like may include a semiconductor device.

In this specification, a display device and a light-emitting device include, in their category, a panel including pixels where display elements are formed, a module with a form in which an IC including a driver circuit or a controller and the like are incorporated in the panel, and the like. In the case of a light-emitting device, a display element can be formed using a light-emitting element. Furthermore, a display device and a light-emitting device include, in their category, an element substrate corresponding to a form of uncompleted panel and an element substrate corresponding to a form of an uncompleted display element, in the process for manufacturing the panel. For example, an element substrate includes a semiconductor device in which a transistor and a pixel electrode supplied with a potential or a current through the transistor are formed over the same substrate. The pixel electrode corresponds to an electrode included in the display element.

In this specification and the like, the ordinal numbers such as "first", "second", and "third" not only represent the order but also are used to avoid confusion among components in some cases. In such a case, use of the ordinal numbers does not limit the number of the components. For example, it is possible to replace "first" with "second", "third", or the like as appropriate in describing one embodiment of the present invention.

In this specification and the like, "parallel" indicates that two straight lines are disposed at an angle of greater than or equal to −10° and less than or equal to 10°. Accordingly, it also includes the case where the angle is greater than or equal to −5° and less than or equal to 5°. Furthermore, "perpendicular" indicates that two straight lines are disposed at an angle of greater than or equal to 80° and less than or equal to 100°. Accordingly, it also includes the case where the angle is greater than or equal to 85° and less than or equal to 95°.

Furthermore, in this specification and the like, when a crystal is a trigonal or rhombohedral crystal system, the crystal is represented as a hexagonal crystal system.

In this specification and the like, when it is explicitly described that X and Y are connected, the case where X and Y are electrically connected, the case where X and Y are functionally connected, and the case where X and Y are directly connected are included. Here, X and Y each denote an object (e.g., a device, an element, a circuit, a wiring, an electrode, a terminal, a conductive film, a layer, or the like). Accordingly, another connection relation shown in drawings or texts is included without being limited to a predetermined connection relation, for example, the connection relation shown in the drawings or the texts.

Electrical connection between components in a circuit includes a configuration in which current, voltage, or a potential can be supplied or transmitted. Accordingly, connection between two components in a circuit is not limited to a circuit configuration in which they are directly connected but also includes, in its category, a configuration in which they are electrically connected through an element such as a wiring, a resistor, a diode, or a transistor so that current, voltage, or a potential can be supplied or transmitted.

In addition, even when independent components are connected to each other in a circuit diagram, there is actually a case where one conductive film has functions of a plurality of components, such as a case where part of a wiring serves as an electrode. Connection in this specification also includes, in its category, such a case where one conductive film has functions of a plurality of components.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed as follows.

For example, it can be expressed as "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to these above examples, a source (or a first terminal or the like) and a drain (or a second terminal or the like) of a transistor can be distinguished from each other to specify the technical scope. Note that these expressions are examples and there is no limitation on these expressions. Here, X, Y, Z1, and Z2 each denote an object (e.g., a device, an element, a circuit, a wiring, an electrode, a terminal, a conductive film, and a layer).

Note that a voltage refers to a potential difference between two points, and a potential refers to electrostatic energy (electric potential energy) of a unit charge at a given point in an electrostatic field. Note that in general, a potential difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

Note that a transistor has three terminals which are referred to as a gate, a source, and a drain. Depending on the channel type of the transistor or levels of potentials applied to the terminals, one of two terminals functioning as a source or drain functions as a source and the other functions as a drain. In general, in an n-channel transistor, a terminal to which a lower potential is applied is called a source, and a terminal to which a higher potential is applied is called a drain. In contrast, in a p-channel transistor, a terminal to which a low potential is applied is referred to as a drain, and a terminal to which a high potential is applied is referred to as a source. In the following description, to clarify a circuit configuration and operation thereof, one of two terminals of a transistor is fixed as a source and the other of the two terminals is fixed as a drain in some cases. It is needless to say that, depending on a driving method, the magnitude relationship between voltages applied to the terminals of the transistor might be changed, and the source and the drain might be interchanged.

In the case of an n-channel transistor, a terminal (electrode) to which high-level (H-level) signal and power supply potential are mainly input is referred to as a drain, and a terminal (electrode) to which low-level (L-level) signal and power supply potential are mainly input is referred to as a source. The opposite is employed in the case of a p-channel transistor. It is needless to say that, depending on a driving method, the magnitude relationship between voltages applied to the terminals of the transistor might be changed, and the source and the drain might be interchanged. Thus, in one embodiment of the present invention, the distinction between the source and drain of the transistor is not limited to that described in this specification.

In one embodiment of the present invention, a variety of switches can be used as a switch. A switch has a function of determining whether current flows or not by being in a conduction state (on state) or a non-conduction state (off state). Alternatively, the switch has a function of determining and changing a current path, and for example, has a function of determining whether current can flow through a path 1 or a path 2 and changing the path. As an example of the switch, an electrical switch, a mechanical switch, or the like can be used. That is, anything can be used as a switch as long as it can control current, without limitation to a certain thing. As an example of the switch, a transistor (e.g., a bipolar transistor or a MOS (Metal Oxide Semiconductor) transistor), a diode (e.g., a PN diode, a PIN diode, a Schottky diode, a MIM (Metal Insulator Metal) diode, a MIS (Metal Insulator Semiconductor) diode, or a diode-connected transistor), a logic circuit in which these are combined, or the like can be given. An example of a mechanical switch is a switch formed using a MEMS (micro electro mechanical system) technology, such as a digital micromirror device (DMD). Such a switch includes an electrode which can be moved mechanically, and operates by controlling conduction and non-conduction in accordance with movement of the electrode.

In one embodiment of the present invention, there is no particular limitation on the device structure of a capacitor intentionally provided as an element. For example, either a MIM capacitor or a MOS capacitor can be used.

According to one embodiment of the present invention, it is possible to provide a novel semiconductor device, a novel driving method thereof, a novel manufacturing method thereof, or the like. For example, according to one embodiment of the present invention, it is possible to provide a semiconductor device with improved display quality or a driving method thereof, to provide a high-resolution semiconductor device or a driving method thereof, to provide a semiconductor device in which variation in luminance between pixels can be reduced or a driving method thereof, to provide a semiconductor device whose number of terminals can be reduced or a driving method thereof, or the like.

Note that the description of these effects does not disturb the existence of other effects. Furthermore, in one embodiment of the present invention, there is no need to achieve all the effects described above. Furthermore, in one embodiment of the present invention, an object other than the above objects, an effect other than the above effects, and a novel feature will be apparent from the description of the specification and the drawings

BRIEF DESCRIPTION OF THE DRAWINGS

FIGS. 27A to 27E show plan views illustrating an example of a method for manufacturing an element substrate.

FIGS. 28A to 28E show plan views illustrating an example of a method for manufacturing an element substrate.

FIGS. 29A and 29B show cross-sectional views illustrating examples of a structure of transistor. FIGS. 29C and 29D show cross-sectional views illustrating examples of a structure of a transistor.

DETAILED DESCRIPTION OF THE INVENTION

Figure 1:
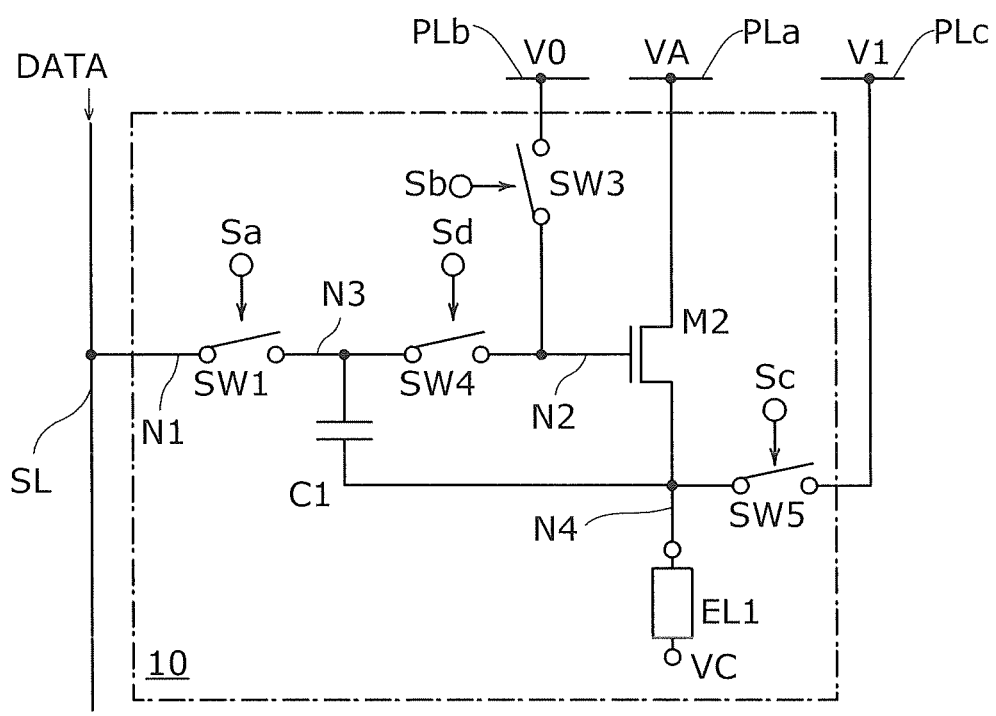
FIG. 1 shows a circuit diagram illustrating an example of a configuration of a pixel.

Hereinafter, embodiments of the present invention will be described in detail with reference to the drawings. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

Furthermore, a plurality of embodiments of the present invention are described below, and any of the embodiments can be combined as appropriate. In addition, in the case where structural examples are given in one embodiment, any of the structure examples can be combined as appropriate.

In this specification, the same portions or portions having similar functions in the drawings used for the description of embodiments of the present invention are denoted by the same reference numerals, and the description thereof is not repeated in some cases.

In addition, in this specification, a clock signal CLK is abbreviated to a signal CLK, CLK, or the like in some cases. The same applies to other signals, voltages, potentials, circuits, elements, and the like.

Embodiment 1

In this embodiment, a light-emitting device including a light-emitting element is described as an example of a semiconductor device. The light-emitting device of this embodiment can function as a display device.
<<Configuration Example 1 of Pixel>>

FIG. 1 illustrates an example of a configuration of a pixel of the light-emitting device. As illustrated in FIG. 1, a pixel 10 includes a switch SW1, a switch SW3, a switch SW4, a switch SW5, a transistor M2, a capacitor C1, and a light-emitting element EL1. The pixel 10 is electrically connected to a wiring SL, a wiring PLa, a wiring PLb, and a wiring PLc. A pixel portion of the light-emitting device is provided with a plurality of pixels 10 arranged in array.

The conduction state of SW1 is controlled by a signal Sa. The conduction state of SW3 is controlled by a signal Sb. The conduction state of SW4 is controlled by a signal Sd. The conduction state of the switch SW5 is controlled by a signal Sc. In the example of FIG. 1, the conduction states of the four switches (SW1, SW3, SW4, SW5) are controlled by signals different from each other.

A data signal DATA is a signal showing a gray scale, and the wiring SL can function as a wiring for supplying the data signal DATA to the pixel 10. The wiring PLa, the wiring PLb, and the wiring PLc can function as wirings for supplying a potential VA, a potential V0, and a potential V1 to the pixel 10, respectively. The wirings (PLa, PLb, PLc) can also function as wirings for supplying signals to the pixel 10.

As illustrated in FIG. 1, a node N1 is an input node of the signal DATA. A node N2 is a gate of the transistor M2. A node N3 and a node N4 are nodes corresponding to a pair of terminals (electrodes) of the capacitor C1. The light-emitting element EL1 includes a pair of terminals (anode and cathode), and the node N4 corresponds to one terminal of the light-emitting element EL1. A potential VC is supplied to the other terminal of the light-emitting element.

As the light-emitting element EL1 an element whose luminance can be controlled by a current or a voltage can be used. As the light-emitting element EL1 LED (Light Emitting Diode) and OLED (Organic Light Emitting Diode) are typically given. For example, in the case of OLED, the light-emitting element EL1 includes at least an EL (electroluminescence) layer, an anode, and a cathode. The EL layer is provided between the anode and the cathode and is formed of a single layer or a plurality of layers. The EL layer includes at least a layer containing a light-emitting substance (light-emitting layer).

One of a source and a drain of the transistor M2 is connected to the wiring PLa, and the other is connected to the node N4 (one terminal of EU). SW1, SW4, and SW3 are connected in series. A connection portion of the switch SW3 and the switch SW4 is connected to the gate of the transistor M2 (the node N2). A connection portion of the switch SW1 and the switch SW4 is connected to the terminal of the capacitor C1 (the node N3).

SW1 functions as a switch which controls a conduction state between the wiring SL and the node N3. By SW1, supply of the signal DATA to the pixel 10 is controlled. SW3 controls a conduction state between the node N2 and the wiring PLb. SW3 has a function of a reset circuit which resets the potential of the node N2 to the constant potential V0. SW4 functions as a switch which controls a conduction state between the node N3 and the node N2. Furthermore, a switch circuit formed of SW4 and SW3 connected in series can function as a reset circuit which resets the potential of the node N3 to the constant potential (V0). SW5 controls a conduction state between the node N4 and the wiring PLc. SW5 can function as a reset circuit which resets the potential of the node N4 to a constant potential (V1). The capacitor C1 can function as a storage capacitor for retaining the potential of the node N4.

By a drain current of the transistor M2 (hereinafter referred to as a "drain current Id2" in some cases), the potential of the node N4 is changed. Accordingly, a potential difference between the pair of terminals of the light-emitting element EL1 is changed, and when this potential difference is greater than or equal to a threshold voltage VthEL of the light-emitting element EL1, the light-emitting element EL1 emits light. The drain current Id2 is controlled by the potential of the node N2. The potential of the node N2 is controlled to a value corresponding to the potential of the signal DATA supplied from the wiring SL. The transistor M2 is a transistor corresponding to a driving transistor. Variation in the threshold voltage of the transistor M2 between the plurality of pixels 10 causes variation in luminance between these pixels 10. Thus, the pixel 10 has a function of correcting the threshold voltage of the transistor M2. Specifically, the threshold voltage is corrected by a circuit formed using the switches SW3-SW5 and the capacitor C1. The circuit formed using the switches SW3-SW5 and the capacitor C1 has a function of charging and discharging a charge retained in the gate of the transistor M2 (the node N2) by controlling the conduction states of the switches SW3-SW5. A specific circuit configuration of the pixel 10 is described and the functions of the pixel 10 and the like are explained below.

<Circuit Configuration Example of Pixel>

Figure 2:
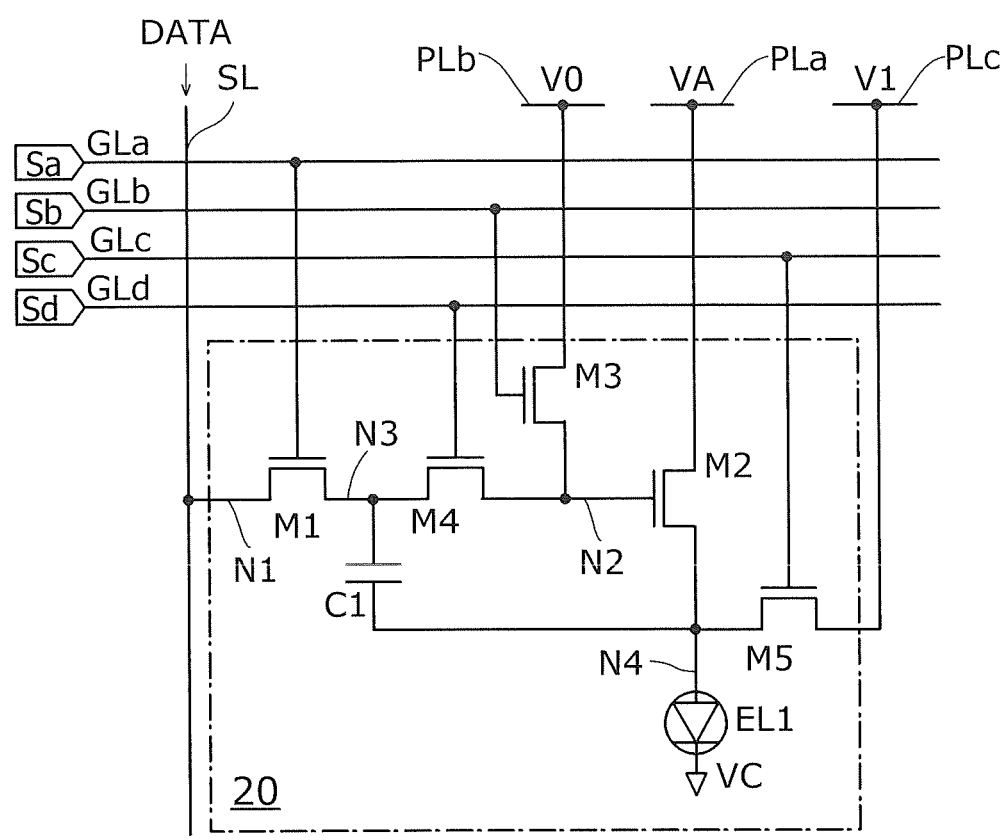
FIG. 2 shows a circuit diagram illustrating an example of a configuration of a pixel.

FIG. 2 illustrates an example of a more specific circuit configuration of the pixel 10. A pixel 20 in FIG. 2 corresponds to a circuit in which the four switches (SW1, SW3, SW4, SW5) of the pixel 10 are formed of transistors (M1, M3, M4, M5). As illustrated in FIG. 2, the pixel 20 includes five transistors (M1, M2, M3, M4, M5), the capacitor C1, and the light-emitting element EL1 In the example of FIG. 2, the transistors M1-M5 are n-channel transistors. The anode of the light-emitting element EL1 corresponds to the node N4. The potential VC is supplied to the cathode of the light-emitting element EL1 As described later, the light-emitting device includes a pixel portion in which a plurality of pixels 20 are arranged in array. In the pixel portion, the cathode of each light-emitting element EL1 can be formed using one common electrode. In this case, a circuit configuration in which the potential VC is supplied to the common electrode is obtained.

A gate of the transistor M1 is connected to a wiring GLa, a gate of the transistor M3 is connected to a wiring GLb, a gate of the transistor M4 is connected to a wiring GLd, and a gate of the transistor M5 is connected to a wiring GLc. Thus, the conduction states of the transistors (M1, M3, M4, M5) are controlled by respective signals input from the wirings (GLa, GLb, GLd, GLc). Here, the signal Sa, the signal Sb, the signal Sc, and the signal Sd are input to the wiring GLa, the wiring GLb, the wiring GLc, and the wiring GLd, respectively.

<Example of Method for Driving Pixel>

An example of a method for driving the pixel 20 is described with reference to FIG. 3-FIG. 6.

Figure 3:
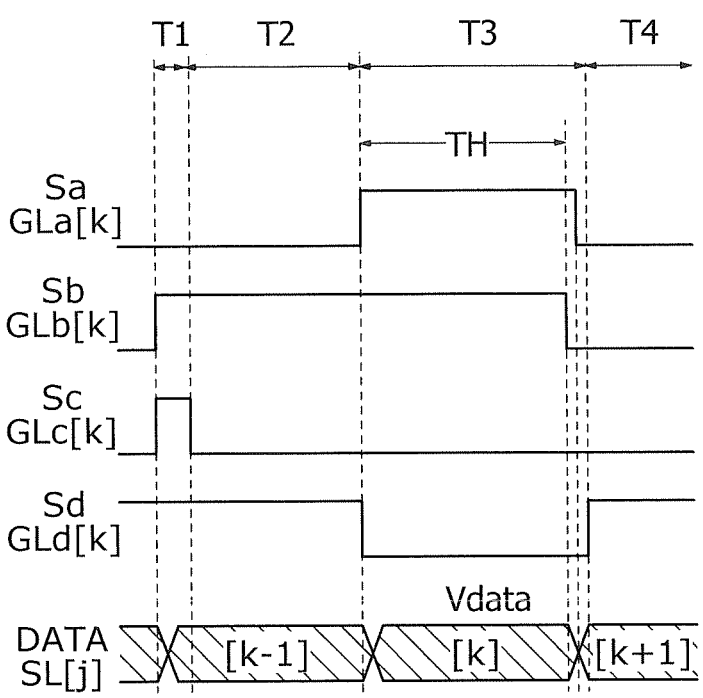
FIG. 3 shows a timing chart showing an example of a method for driving a pixel.

FIG. 3 illustrates an example of the method for driving the pixel 20. FIG. 3 is a timing chart showing a method for driving a pixel 20[k, j] (k and j are integers greater than or equal to 1) provided in the k-th low and the j-th column. In FIG. 3, signals (Sa, Sb, Sc) input to wirings in the k-th row (GLa[k], GLb[k], GLc[k]) and the signal DATA input to a wiring SL[j] in the j-th column.

Note that in order to identify wirings, pixels, signals, and the like with the use of row numbers and/or column numbers, identification symbols such as [k] and [k, j] are also used in the following description.

As illustrated in FIG. 3, the operations of the pixel 20 can be roughly divided into four operations performed in a period T1, a period T2, a period T3, and a period T4. These operations are described with reference to FIG. 4-FIG. 6. Note that in FIG. 4-FIG. 6, the four transistors (M1, M3, M4, M5) are denoted by circuit symbols of switches as in FIG. 1 for easy understanding of the operations of the pixel 20. Furthermore, the source (S) and the drain (D) of the transistor M2 are distinguished from each other. Here, in the transistor M2, a terminal which is connected to the wiring PLa is the drain, and a terminal which is connected to the anode of the light-emitting element EL1 (node N4) is the source.

[Period T1: Initialization operation]

Figure 4A:
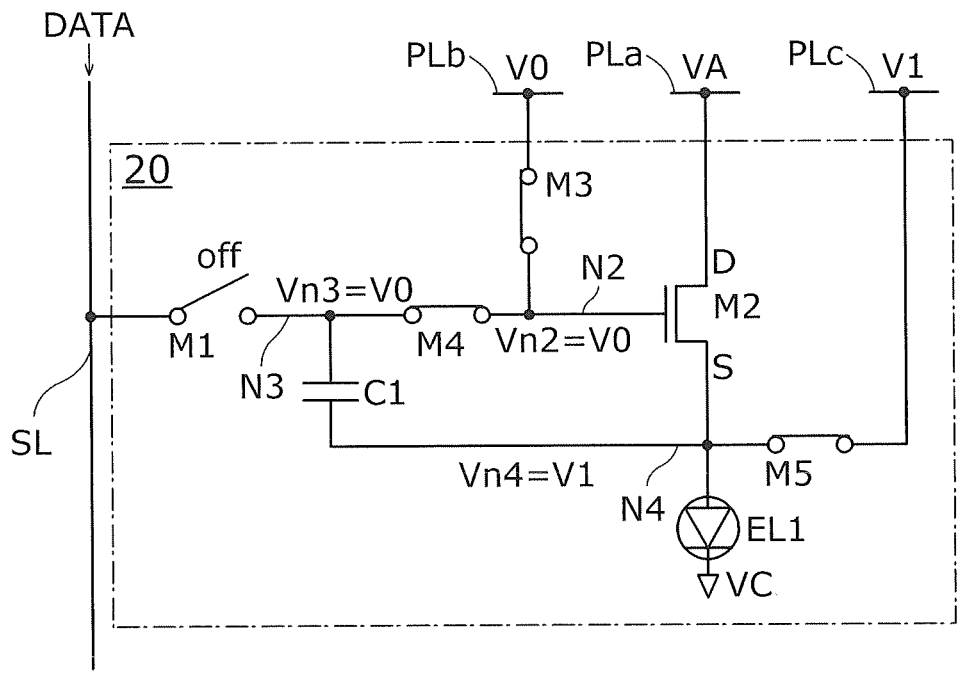
FIGS. 4A to 4B show circuit diagrams illustrating an example of operations of a pixel.

The period T1 is an initialization period in which an operation for initializing the potentials of the nodes N1, N3, and N4 of the pixel 20 is performed. FIG. 4A illustrates the operation of the pixel 20 in the initialization period T1. The initialization period T1 corresponds to a period in which the signal Sc is at a high level. In T1, the signal Sa is at a low level, and the signals Sb, Sc, and Sd are at a high level. Note that at any timing in T1, the signal Sb can be switched from a low level to a high level. Here, the signal Sb is set at a high level together with the signal Sc. In the initialization operation, the transistor M1 is brought into a non-conduction state, and the transistors (M3, M5, M4) are brought into a conduction state. The transistor M3 and the transistor M4 are brought into a conduction state, whereby a potential Vn2 of the node N2 and a potential Vn3 of the node N3 are reset to V0. Since the transistor M5 is brought into a conduction state, a potential Vn4 of the node N4 is reset to V1.

The potentials V0, V1, and VC are set to values satisfying the following formulae (1) and (2). Note that in the formulae (1) and (2), Vth2 is the threshold voltage of the transistor M2, and VthEL is the threshold voltage of the light-emitting element EL1 The threshold voltage of the light-emitting element is a minimum value of a potential difference between the cathode and the anode when the light-emitting element is in a light-emission state. When the potential difference between the cathode and the anode of the light-emitting element EL1 is greater than or equal to VthEL, the light-emitting element EL1 is brought into a light-emission state.

$$(V0-Vth2)-VC<VthEL \quad (1)$$

$$V0-Vth2>V1 \quad (2)$$

By satisfying the formula (1), in T1, T2, and T3, the light-emitting element EL can be brought into a non-light-emitting state. Furthermore, by satisfying the formula (2), in the period T1, a gate-source voltage Vgs2 of the transistor M2 is greater than Vth2; therefore, the transistor M2 can be brought into a conduction state.

[Period T2: Threshold-voltage correction operation]

Figure 4B:
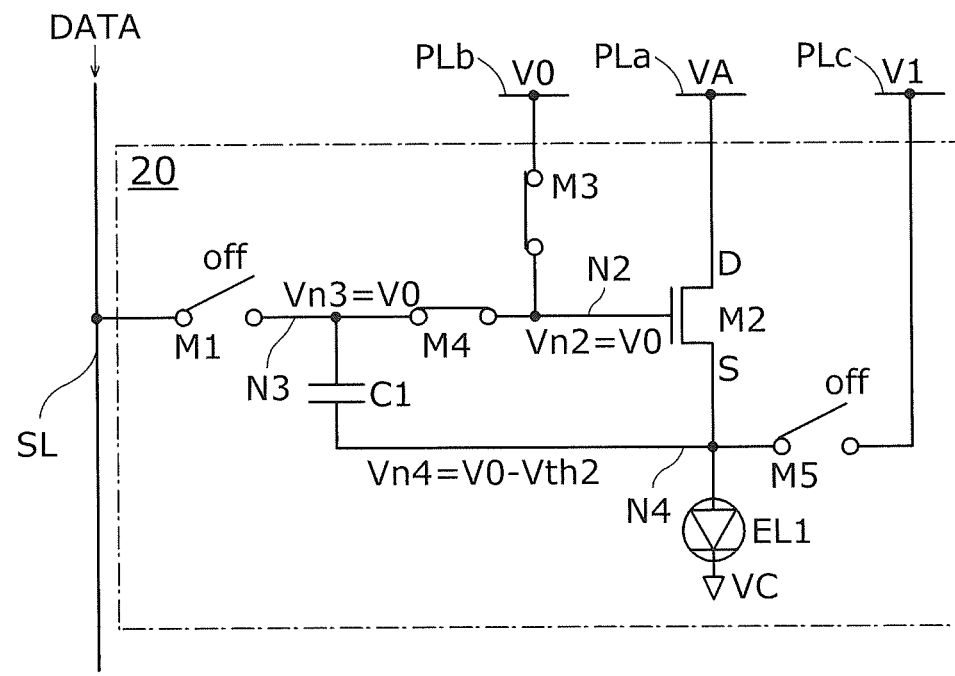

T2 is a period in which correction of the threshold voltage of the transistor M2 is performed. FIG. 4B is a diagram explaining an operation of the pixel 20 in the threshold-voltage correction period T2. In T2, the signal Sc is switched from a high level to a low level, and the potential levels of the other signals (Sa, Sb, Sd) do not change. The transistor M5 is brought from the conduction state into a non-conduction state. The states of the other transistors (M1, M3, M4) are the same as those of T1. In T2, since the conduction states of the transistor M3 and the transistor M4 are kept, Vn2 and Vn3 do not changed and are V0. Since Vgs2 is higher than Vth2, the transistor M2 is in a conduction state, and the drain current Id2 flows. The capacitor C1 is charged by this drain current Id2, and thus the potential Vn4 of the source of the transistor M2 (node N4) increases. In response to the increase of Vn4, the Vgs2=Vn2−Vn4 of the transistor M2 decreases. When Vgs2 decreases to Vth2, the transistor M2 is brought into a state in which the drain current Id2 does not flow, and the potential Vn4 of the source of the transistor M2 (node N4) becomes V0−Vth2.

The threshold-voltage correction operation is an operation for setting the drain current Id2 supplied to the light-emitting element EL1 in a light-emitting period (FIG. 6) to a value which is not influenced by Vth2, and in the driving method example of FIG. 3, it is an operation for setting the potential (Vn4) of the source of the transistor M2 to a potential corresponding to Vth2. More specifically, it is an operation for changing the potential Vn4 of this source to a potential obtained by subtracting the threshold voltage Vth2 of the transistor M2 from a certain constant potential (V0).

In T2, according to the formula (1), the voltage between the anode and the cathode of the light-emitting element EL1 does not exceed VthEL; therefore, the light-emitting element EL1 remains in a non-light-emitting state.

[Period T3: Data Writing Operation]

The period T3 is a period in which an operation for writing a data signal DATA[k] in the pixel 20 is performed. Specifically, an operation for setting the potential Vn3 of the node N3 to a potential Vdata corresponding to the signal DATA[k]. The operation of the pixel 20 in this period is described with reference to FIG. 3 and FIG. 5.

Figure 5A:
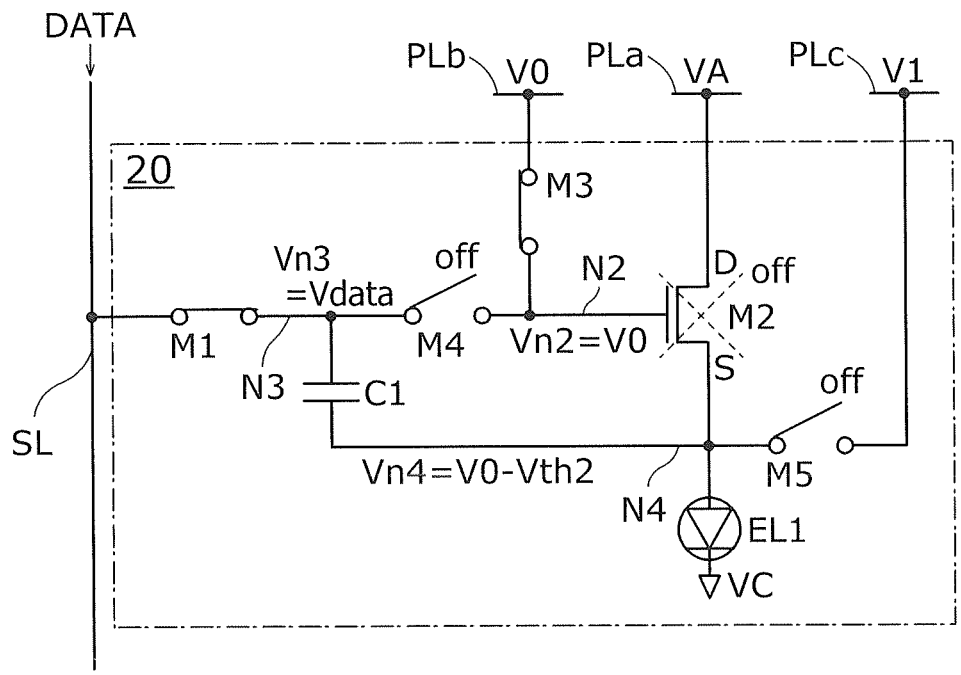
FIGS. 5A to 5B show circuit diagrams illustrating an example of operations of a pixel.

In the example of FIG. 3, the start of T3 is a rising time of the signal Sa, and the end of T3 is a rising time of the signal Sd. A period TH corresponds to one horizontal period in the corresponding row, and the signal Sa is at a high level continuously in the period TH. FIG. 5A illustrates a state of the pixel 20 in the period TH. In the example of FIG. 3, before the period VH ends, the signal Sb is switched from the high level to a low level. Furthermore, after the period TH ends, the signal Sd is switched from a low level to a high level. Thus, at the end point of the period T3 (FIG. 5B), a change in the potential Vn3 (=Vdata) written in the node N3 can be prevented.

In T3, first, the signal Sa becomes at a high level, and the signal Sd becomes at a low level. Thus, the transistor M1 is brought into a conduction state, the transistor M4 is brought into a non-conduction state, the data signal DATA[k] is written to the node N3, and the potential Vn3 thereof becomes the potential Vdata of the signal DATA[k]. The potential Vn3 of the node N3 is retained by the capacitor C1. Since the states of the transistor M3 and the transistor M5 are the same as those of T2, Vn2=V0, and Vn4=V0−Vth2. Accordingly, Vgs2 (=Vn2−Vn4) does not exceed Vth2, and thus the transistor M2 remains in the non-conduction state.

Figure 5B:
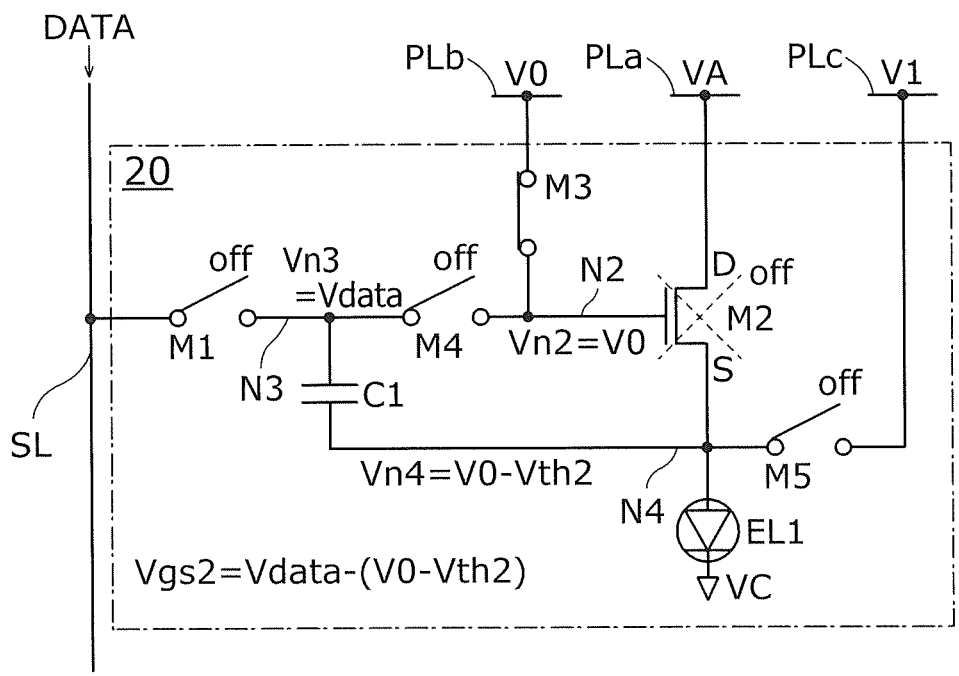
Figure 6:
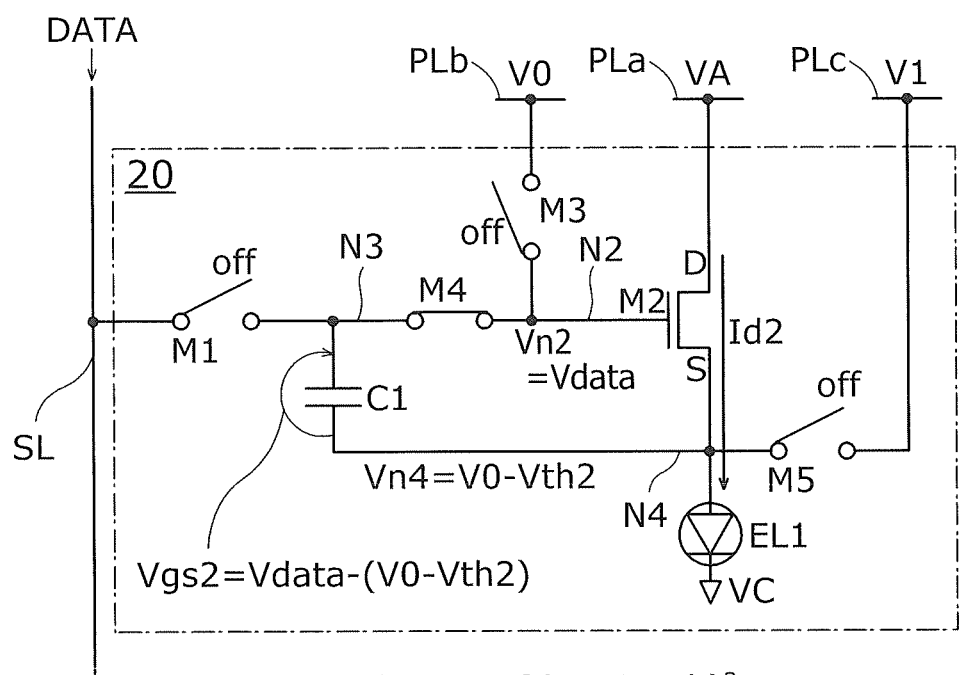
FIG. 6 shows a circuit diagram illustrating an example of an operation of a pixel.

After the signal DATA[k] is written in the node N3, first, the signal Sb is set at a low level, so that the transistor M3 is brought into a non-conduction state. Next, the signal Sa is set at a low level, so that the transistor M1 is brought into a non-conduction state. FIG. 5B illustrates a state of the pixel 20 at the end of the period T3. As illustrated in FIG. 5B, at the end point of the period T3, the transistors (M1, M2, M4, M5) are in a non-conduction state, the transistor M3 is in a conduction state, and the node N3 is in an electrically floating state. Note that the timing when the signal Sa is changed from a high level to a low level and the timing when the signal Sd is changed from a low level to a high level can be the same.

[Period T4: Light-emitting operation]

The period T4 is a light-emitting period in which the light-emitting element EL1 emits light at a luminance corresponding to the potential Vdata. The operation of the pixel 20 in this period is described with reference to FIG. 3 and FIG. 6.

In T4, only the signal Sd of the input signals (Sa-Sd) to the pixel 20 becomes at a high level. The transistor M4 is brought into a conduction state, and thus, the potential Vn2 of the gate of the transistor M2 becomes Vdata. The gate-source voltage Vgs2 of the transistor M2 is retained in the capacitor C1, and the value thereof is Vdata−(V0−Vth2). As shown in the following formula (3), the drain current Id2 of the transistor M2 has a value unrelated to Vth2. As shown in a formula (4), β is a constant determined by the size (the channel length L, the channel width W) of the transistor M2, gate capacitance $C_{OX}$, and electron mobility μ. In the case where the transistor M2 is a p-channel type, Hall mobility is used as μ.

$$Id = 0.5\beta(Vgs-Vth2)^2$$

$$= 0.5\beta(Vdata-V0+Vth2-Vth2)^2$$

$$= 0.5\beta(Vdata-V0)^2 \qquad (3)$$

$$\beta = \mu_{COX}(W/L) \qquad (4)$$

As shown in the formula (3), even when Vth2 differs from pixel 20 to pixel 20 at the time of the light-emitting operation of the light-emitting element EL1 the drain current Id2 flowing through the transistor M2 can be a value which is not influenced thereby. This indicates that the light-emitting element EL1 can emit light at a luminance which does not depend on the threshold voltage Vth2 of the transistor M2. That is, according to this embodiment, a light-emitting device (display device) with an excellent display quality can be provided.

In the driving method example of FIG. 3, in the period T2 in which threshold-voltage correction is performed in the pixel 20 in the k-th row, in the pixel 20 in the (k−1)-th row, writing of a signal DATA[k−1] is performed. In this manner, in the pixel 20 (pixel 10), the threshold-voltage correction operation and the data writing operation can be performed in different periods; therefore, dot sequential driving is possible in the light-emitting device (display device) provided with the pixels 20 (pixels 10) in the pixel portion. Description thereof is made in Embodiment 2 below.

Embodiment 2

In this embodiment, an active matrix display device is described as an example of a semiconductor device. Specifically, a configuration example, a driving method example, and the like of an active matrix display device including the pixels 10 in the pixel portion are described.

Configuration Example of Display Device

Figure 7:
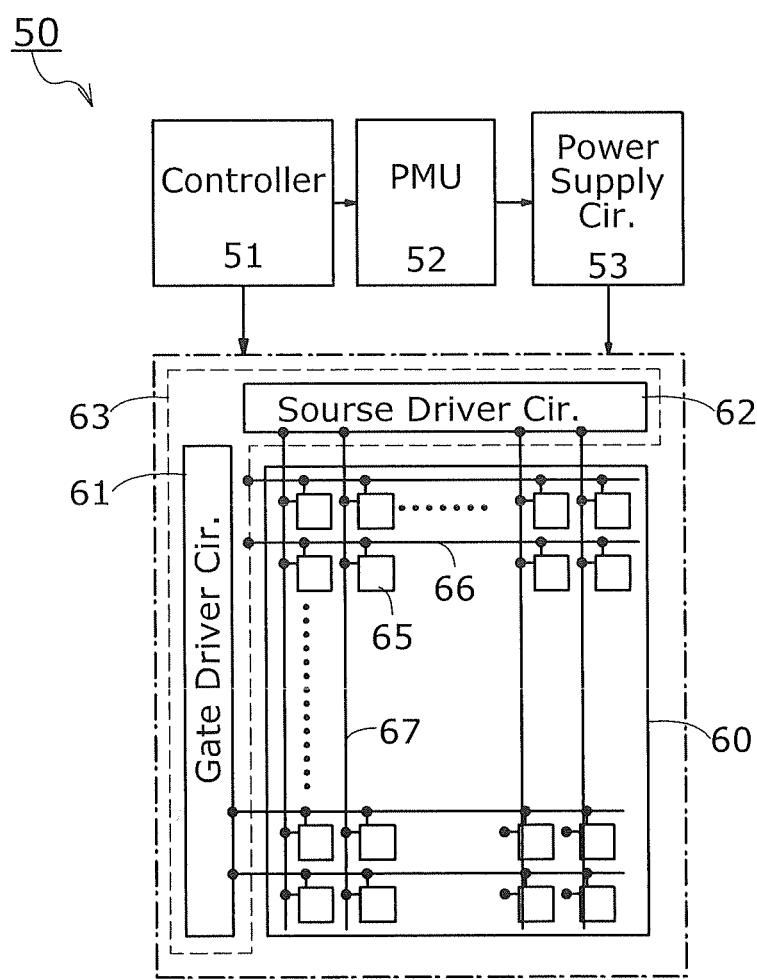
FIG. 7 shows a block diagram illustrating an example of a structure of a display device.

FIG. 7 is a block diagram illustrating an example of the configuration of a display device.

As illustrated in FIG. 7, a display device 50 includes a controller 51, a power management unit (PMU) 52, a power supply circuit 53, a pixel portion 60, a gate driver circuit 61, a source driver circuit 62, and the like. Here, the gate driver circuit 61 and the source driver circuit 62 may be collectively referred to as a peripheral circuit 63.

The pixel portion 60 includes a plurality of pixels 65 arranged in array, a plurality of wirings 66 arranged in the vertical direction, and a plurality of wirings 67 arranged in the horizontal direction. The pixels 65 in the same row are connected to the wiring 66 in the row, and the pixels 65 in the same column are connected to the wiring 67 in the column.

The controller 51 performs control of the display device 50. A video signal, a synchronization signal for controlling rewriting of the screen, and the like are input to the controller 51. As the synchronization signal, for example, a horizontal synchronization signal, a vertical synchronization signal, and a reference clock signal are given, and the controller 51 generates control signals of the peripheral circuit 63 from these signals. Furthermore, the controller 51 performs control of the PMU 52. The PMU 52 controls the power supply circuit 53 in accordance with a control signal from the controller 51 or the outside.

The wiring 66 is connected to the gate driver circuit 61. The gate driver circuit 61 has a function of outputting a control signal which controls the conduction state of a switch provided in the pixel portion 60 to the wiring 66 in accordance with the control signal from the controller 51. The wiring 66 corresponds to the wiring group (GLa, GLb, GLc, GLd) of the pixel 10. The wiring 67 is connected to the source driver circuit 62. The source driver circuit 62 has a function of outputting a video signal DATA input from the controller 51, to the wiring 67. The wiring 67 is a wiring corresponding to the wiring SL of the pixel 10.

Figure 8:
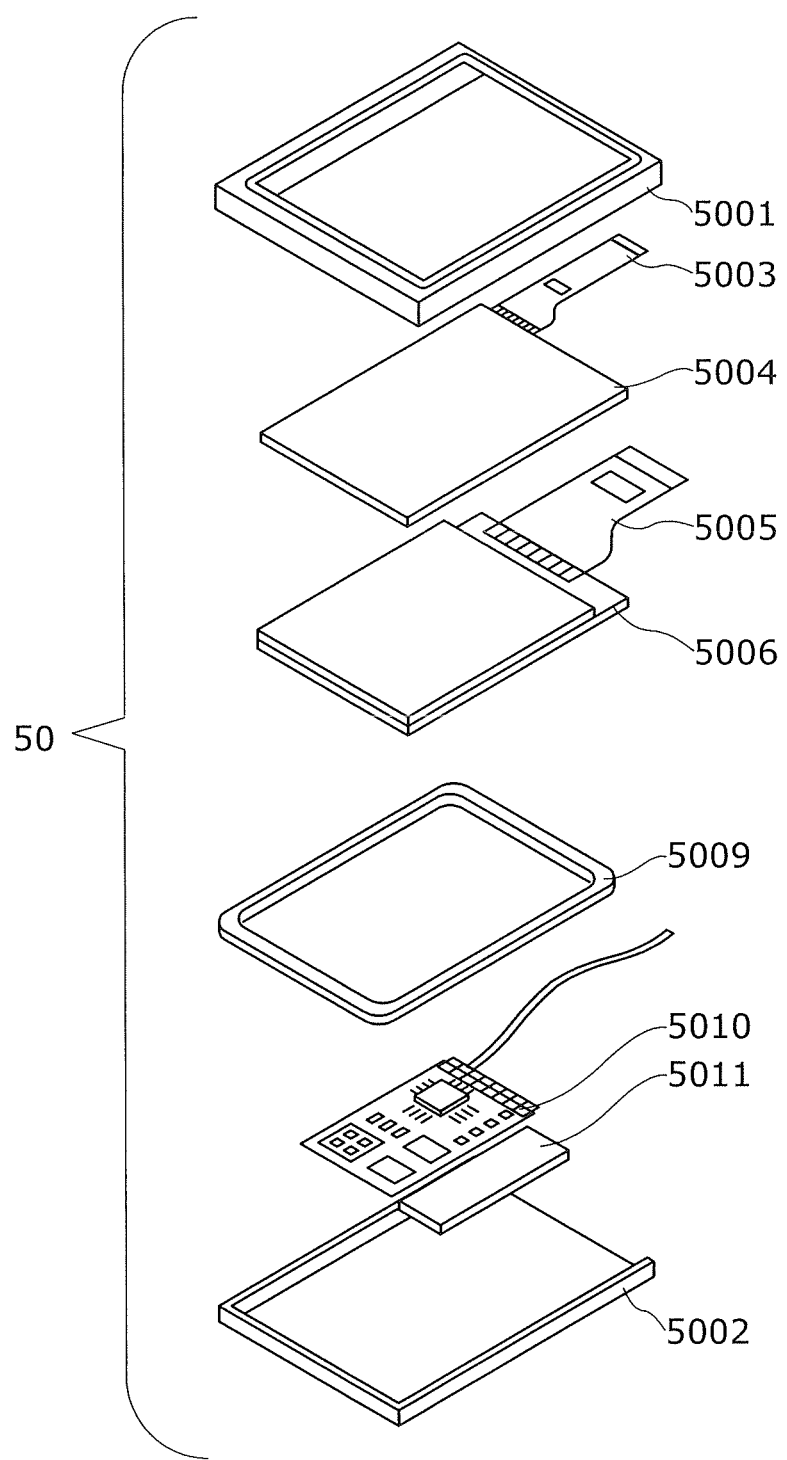
FIG. 8 shows an exploded perspective view illustrating an example of a structure of a display device.

A more specific structure of the display device 50 is described with reference to FIG. 8. FIG. 8 is an exploded perspective view illustrating a structure example of the display device 50.

As illustrated in FIG. 8, the display device 50 includes a touch panel unit 5004 to which an FPC 5003 is connected, a display panel 5006 to which an FPC 5005 is connected, a frame 5009, a printed board 5010, and a battery 5011, between an upper cover 5001 and a lower cover 5002. Note that there is a case where none of the battery 5011, the touch panel unit 5004, and the like are provided. The shapes and sizes of the upper cover 5001 and the lower cover 5002 can be changed as appropriate in accordance with the sizes of the touch panel unit 5004 and the display panel 5006.

As the touch panel unit 5004, a resistive or capacitive touch panel can be used to overlap with the display panel 5006. It is also possible to provide a touch panel function for a counter substrate (sealing substrate) of the display panel 5006. Alternatively, a photosensor can be provided in each pixel of the display panel 5006 so that an optical touch panel is obtained. Alternatively, an electrode for a touch can be provided in each pixel of the display panel 5006 so that a capacitive touch panel is obtained.

The frame 5009 has, in addition to a function of protecting the display panel 5006, a function of an electromagnetic shield for blocking electromagnetic waves generated by the operation of the printed board 5010. Furthermore, the frame 5009 may have a function of a radiator plate. The printed board 5010 includes a power supply circuit and a signal processing circuit for outputting a video signal and a clock signal. As a power source for supplying electric power to the power supply circuit, an external commercial power source may be used or a power source using a battery 5011 separately provided may be used. The battery 5011 can be omitted when a commercial power source is used. Furthermore, the display device 50 may be additionally provided with a member such as a polarizing plate, a retardation plate, or a prism sheet.

<<Structure Example of Display Panel>>

Structure examples of a display panel included in the display device are described below with reference to FIG. 9.

Figure 9A:
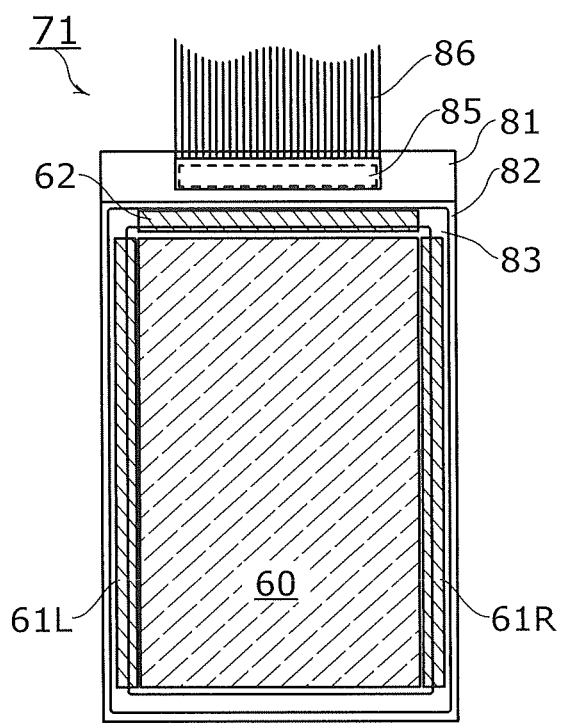
FIGS. 9A to 9D show plan views illustrating examples of structures of display panels.

FIG. 9A illustrates a structure example of a display panel with a structure in which the pixel portion 60 and the peripheral circuit 63 are integrated over the same substrate. A display panel 71 includes a substrate 81 and a substrate 82. Over the substrate 81, the pixel portion 60, the peripheral circuit 63, and a terminal portion 85 are formed. In an example of FIG. 9A, the gate driver circuit 61 is divided into two circuits of a gate driver circuit 61L and a gate driver circuit 61R. For example, the gate driver circuit 61L is connected to the wirings 66 in odd-numbered rows, and supplies signals to these wirings. Meanwhile, the gate driver circuit 61R is connected to the wirings 66 in even-numbered rows, and supplies signals to these wirings 66.

In the terminal portion 85, a plurality of terminals for connecting the pixel portion 60 and the peripheral circuit 63 to an external circuit is formed. An FPC (Flexible printed circuits) 86 is connected to the terminal portion 85. Here, a device with a structure in which the FPC 86 is not connected to the terminal portion 85 is included in the display panel.

The substrate 81 and the substrate 82 face each other with a space (cell gap) maintained by a sealant 83. Furthermore, as illustrated in FIG. 9A, the sealant 83 is provided so as to overlap with the peripheral circuit 63, whereby the display panel 71 with a narrow bezel can be obtained.

It is also possible to incorporate some circuits of the peripheral circuit 63 in an IC chip and mount this IC chip on the substrate 81 or the FPC 86. Examples of a display panel with such a structure are illustrated in FIG. 9B-FIG. 9D.

Figure 9B:
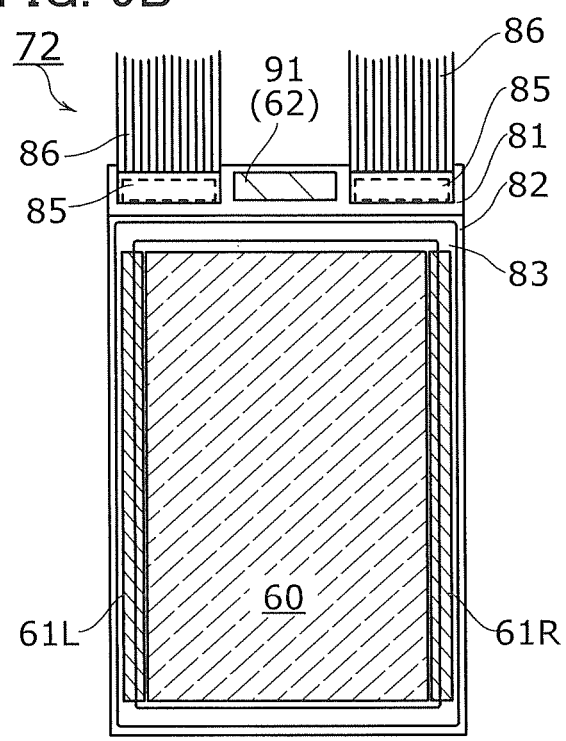

As illustrated in FIG. 9B, in a display panel 72, an IC chip 91 incorporating the source driver circuit 62 is mounted on the substrate 81.

Figure 9C:
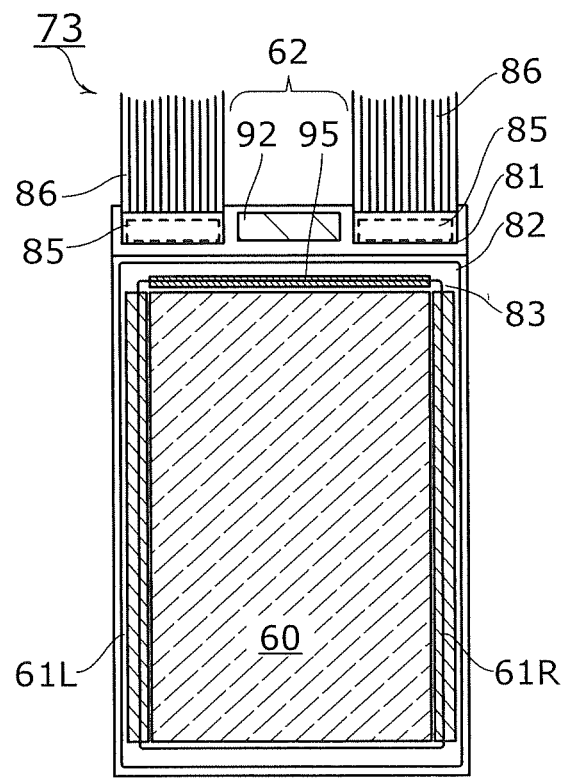
Figure 9D:
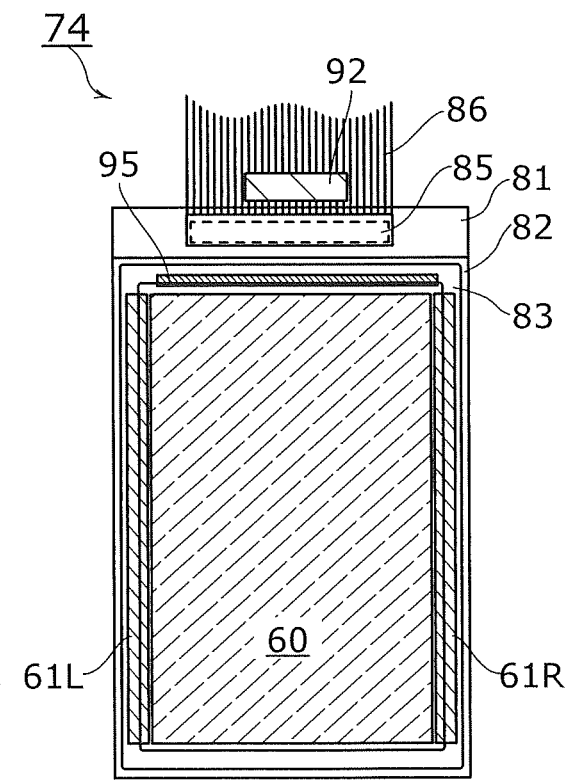

FIG. 9C and FIG. 9D illustrate display panels in which some circuits of the source driver circuit 62 are incorporated in an IC chip 92, and the some circuits 95 are integrated in the substrate 81 together with the pixel portion 60 and the gate drivers (61L, 61R). In a display panel 73 of FIG. 9C, the IC chip 92 is mounted on the substrate 81 by a COG (Chip on Glass) method. In a display panel 74 of FIG. 9D, the IC chip is mounted on the FPC by a COF (Chip on Film) method. Note that there is no particular limitation on a method for mounting the IC chip 91 and the IC chip 92. Alternatively, instead of TCP, an IC chip may be incorporated in SOF (System on Film), and the SOF may be attached to the substrate 81.

In the display panel 71 (FIG. 9A), since the circuits (60, 61L, 61R, 62) are formed over the substrate 81, the number of components that are provided outside, such as an IC chip, can be reduced, leading to a reduction in cost. For reasons such as a limitation on the performance of a semiconductor element that can be manufactured over the substrate 81, all the circuits of the peripheral circuit 63 cannot be manufactured together with the pixel portion 60 in some cases. In this case, as in the display panels 72 to 74, some circuits of the peripheral circuit 63 are incorporated in an IC chip. In order that this IC chip is connected to the peripheral circuit 63 and/or the pixel portion 60 over the substrate 81, a terminal needs to be provided over the substrate 81; therefore, the number of terminals over the substrate 81 in the display panels 72 to 74 is increased as compared to that of the display panel 71. The increase in the number of terminals causes obstruction for obtaining a narrow bezel of a display device, and an increase in the manufacturing cost due to a step for connecting the terminals and the FPC.

Thus, a configuration example of a display panel in which the number of terminals can be reduced is described below.

<<Configuration Example 1 of Display Panel>>

Figure 10:
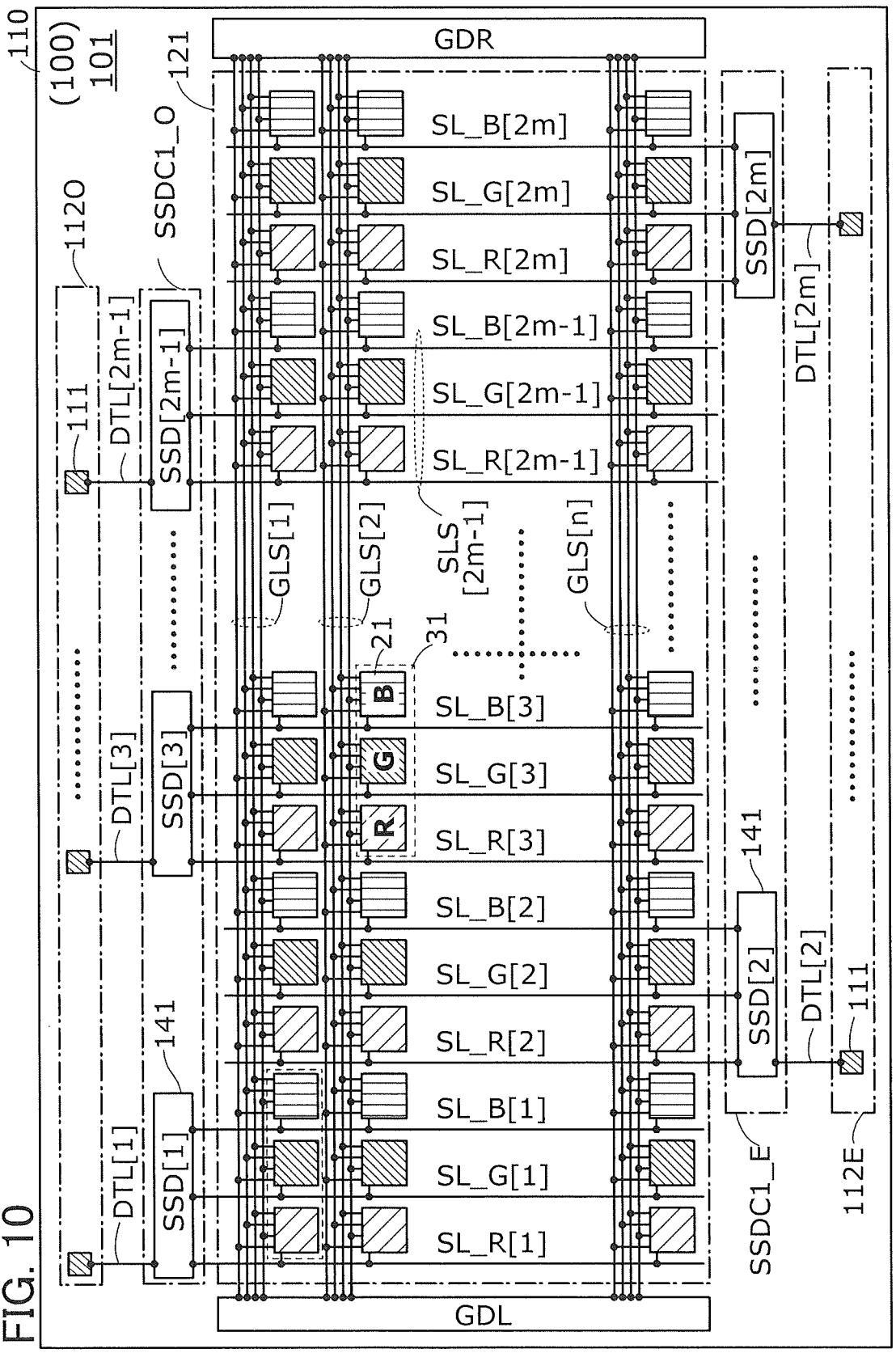
FIG. 10 shows a diagram illustrating an example of a structure of a display panel (element substrate).

FIG. 10 illustrates a configuration example of a display panel. Specifically, FIG. 10 is a diagram explaining a configuration example of an element substrate included in a display panel. An element substrate 101 of a display panel 100 includes, over a substrate 110, a pixel portion 121, a gate driver circuit GDL, a gate driver circuit GDR, a circuit SSDC1_E, a circuit SSDC1_O, a terminal portion 112E, and a terminal portion 112O. Note that in the element substrate 101, the circuits other than the pixel portion 121 may be collectively referred to as a peripheral circuit.

The pixel portion 121 includes a plurality of pixels 21 arranged in array. The terminal portion 112E includes a plurality of terminals 111 connected to the circuit SSDC1_E, and the terminal portion 112O includes a plurality of terminals 111 connected to the circuit SSDC1_O. One or a plurality of IC chips included in a source driver circuit are connected to the terminal portion 112E. The same applies to the terminal portion 112O.

Pixel Portion, Pixel

Figure 11:
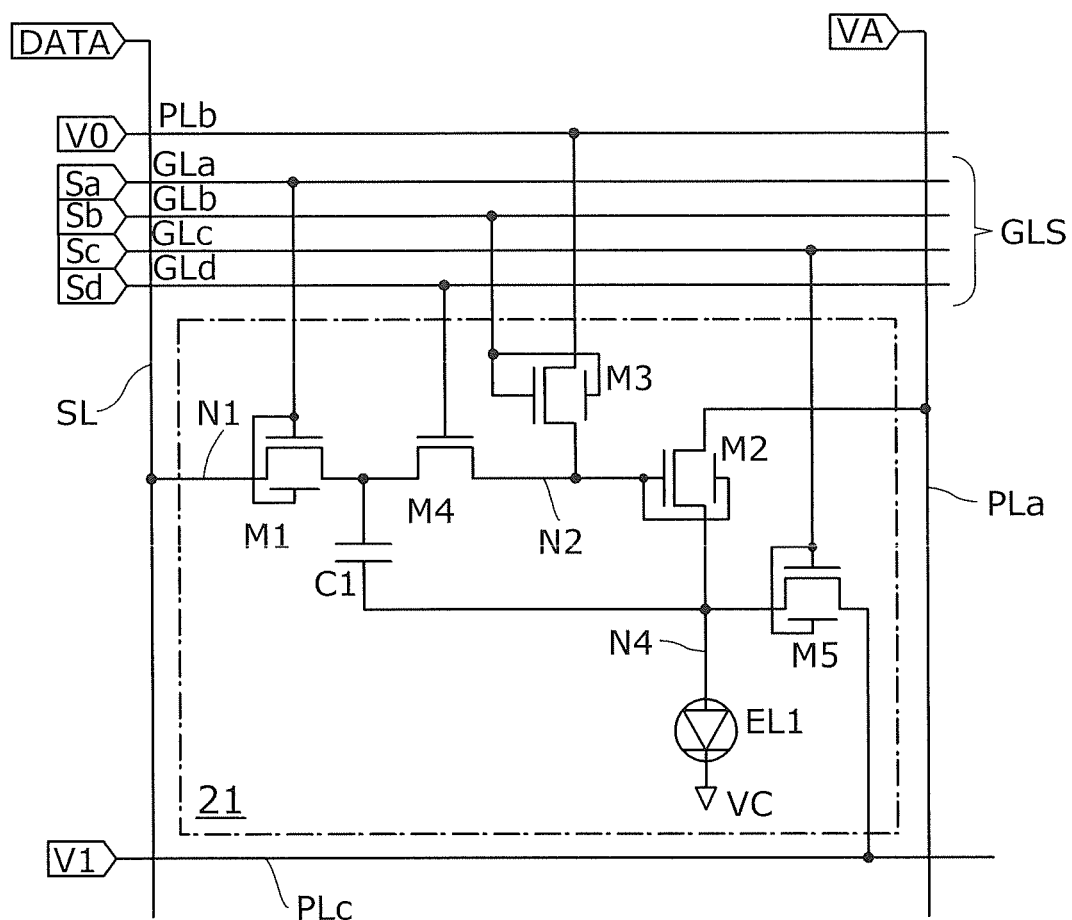
FIG. 11 shows a circuit diagram illustrating an example of a configuration of a pixel.

Examples of configurations of the pixel portion 121 and the pixel 21 are described with reference to FIG. 10 and FIG. 11. FIG. 11 is a circuit diagram illustrating an example of the configuration of the pixel 21. As illustrated in FIG. 11, the pixel 21 has a circuit configuration similar to that of the pixel 20 (FIG. 2), and is different from the pixel 20 in that the transistors (M1-M3, M5) include back gates connected to the gates. Therefore, like the pixel 20, the pixel 21 can be driven in accordance with the timing chart of FIG. 3.

By providing the back gate connected to the gate in the transistor, on-state current of the transistor can be increased. Furthermore, the field-effect mobility of the transistor can be improved. In addition, variation in electrical characteristics such as the threshold voltage of the transistor can be reduced. Moreover, the strength of the transistor can be increased by providing the back gate. That is, for deformation such as bending of a supporting substrate of the transistor, the back gate serves as a reinforcement member to prevent the transistor from being broken.

The pixel portion 121 includes a plurality of wirings (GLa, GLb, GLc, GLd) and a plurality of wirings (PLa, PLb, PLc) to correspond to the arrangement of the plurality of pixels 21. Note that for simplicity of the drawing, in FIG. 10, the wirings (GLa, GLb, GLc, GLd) are represented as a wiring group GLS, and the wirings (PLa, PLb, PLc) are omitted.

The example of FIG. 10 illustrates the element substrate 101 with a structure in which the pixels 21 serve as subpixels, and three pixels 21 which perform light emission of red (R), green (G), and blue (B) form a unit pixel 31 (hereinafter also referred to as a pixel 31). In the pixel portion 121, the pixels 21 in n rows and 2m columns are provided (n and m are integers greater than or equal to 1). The pixels 21 with the same light-emission color are provided in the same column in the pixel portion 121, resulting in RGB stripe arrangement in the vertical direction (column direction).

In this specification, in the case where components are distinguished from each other with the use of colors exhibited by pixels, identification symbols such as _R, [R], and R[1] are used. For example, a pixel 21_R represents a pixel 21 of a red color. A wiring SL_G[2] represents a wiring SL in the second row to which a data signal DATA_G of a green color is input. Note that in the case where light-emission colors of 3n wirings SL are not distinguished from each other, a wiring SL_R[k] (k is an integer greater than or equal to 1) is a wiring SL[3k−2] in the (3k−2)-th column, a wiring SL_G[k] is a wiring SL in the (3k−1)-th column, and a wiring SL_B[k] is a wiring in the 3k-th column. Furthermore the three wirings denoted by a common column number (SL_R[k], SL_G[k], and SL_B[k]) may be collectively referred to as a wiring group SLS_[k].

In the example of FIG. 10, a wiring group GLS[k] (k is an integer satisfying 1≤k≤n) is connected to both of GDL and GDR. As another configuration example, for example, any one of GDL and GDR can be provided. For example, wiring groups GLS in odd-numbered rows can be connected to GDL, and wiring groups GLS in even-numbered rows can be connected to GDR. SSDC1_O is connected to a wiring group SLS[2h−1] (h is an integer satisfying 1≤h≤m) in an odd-numbered column, and SSDC1_E is connected to a wiring group SLS[2h] in an even-numbered column.

<<Peripheral Circuit>>

Next, a configuration example and a driving method example of the peripheral circuit of the element substrate 101 are described.

<<Gate Driver Circuits GDL, GDR>>

Figure 12:
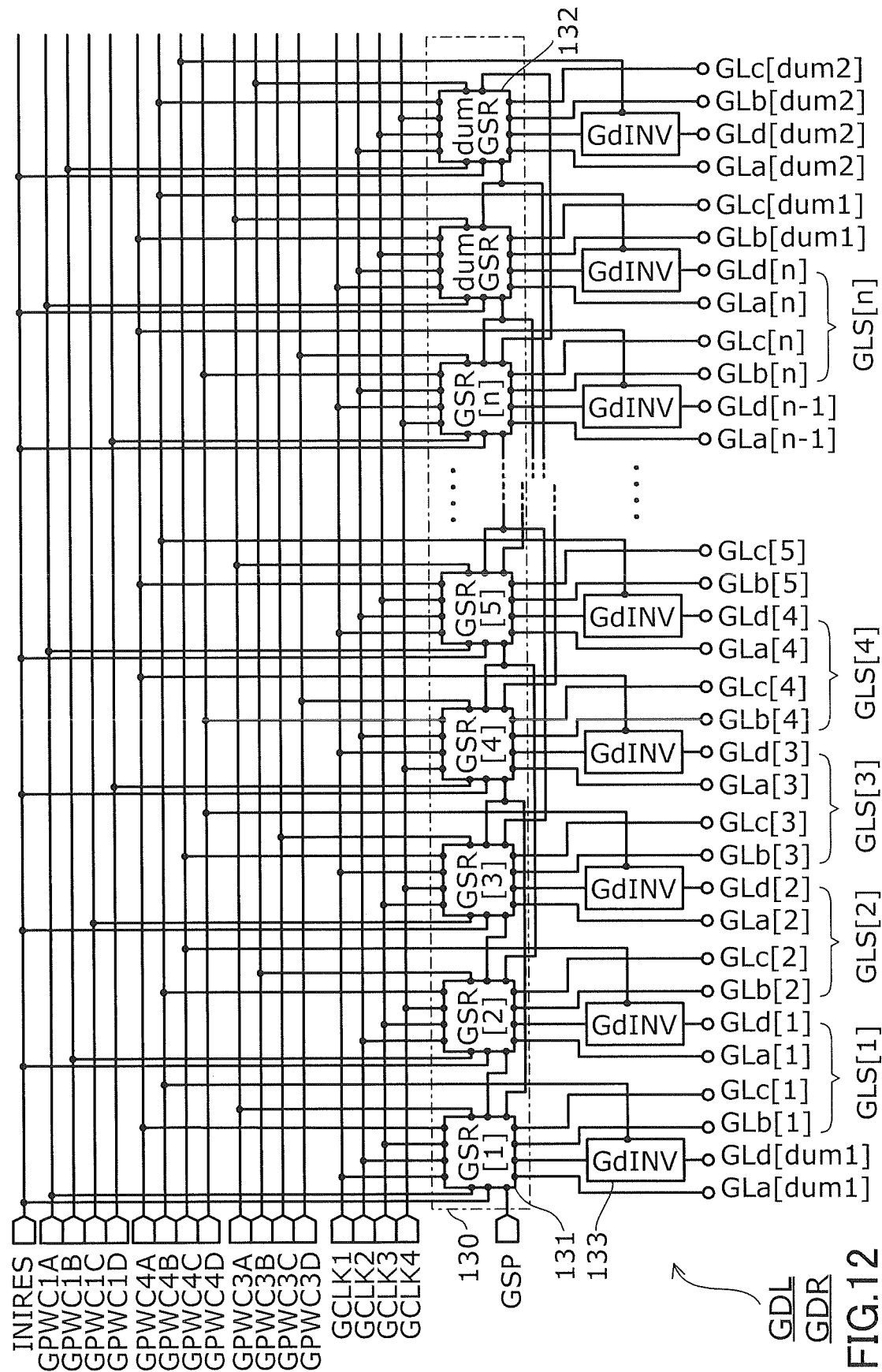
FIG. 12 shows a circuit diagram illustrating an example of a configuration of a gate driver circuit (GDL, GDR).

A configuration example and a driving method example of GDL and GDR are described with reference to FIG. 11-FIG. 17. FIG. 12 is a circuit diagram illustrating the configuration example of GDL and GDR. Here, GDL and GDR have the same circuit configuration. Although GDL is described below, the same applies to GDR.

GDL includes basic circuits (GSR) 131 of n stages, dummy basic circuits (dumGSR) 132 of two stages, and n+2 basic circuits (GdINV) 131. Note that in the following description, a GSR 131 of the h-th stage may be represented as GSR[h]. The same applies to the other circuits.

A shift register 130 includes the GSR 131 of n stages and the dumGSR of two stages. As control signals, a signal GSP, a signal INIRES, signals (GPWC1A, GPWC1B, GPWC1C, GPWC1D), signals (GPWC3A, GPWC3B, GPWC3C, GPWC3D), signals (GPWC4A, GPWC4B, GPWC4C, GPWC4D), and signals (GCLK1, GCLK2, GCLK3, GCLK4) are input to GDL. GDL has a function of generating a plurality of pulsed signals in response to these signals and outputting these to wiring groups GLS[1]-GLS[n].

Dummy wirings (GLa[dum1], GLd[dum1]) and wirings (GLb[1], GLc[1]) are electrically connected to GSR[1]. Wirings (GLa[k−1], GLd[k−1], GLb[k], GLc[k]) are electrically connected to GSR[k] (k is an integer greater than or equal to 2 and less than or equal to n). Wirings (GLa[n], GLd[n]) and dummy wirings (GLb[dum 1], GLc[dum1]) are electrically connected to a dummy circuit in the first stage (dumGSR[1]). Dummy wirings (GLa[dum2], GLd[dum2], GLb[dum2], GLc[dum2]) are connected to dumGSR[2].

The GSR 131 and the dumGSR 132 are electrically connected to the wiring GLd through the GdINV 133. The GdINV 133 has a function of generating an inverted signal of a signal input from the GSR 131 or the dumGSR 132 and outputting it.

<Basic Circuit GSR and Dummy Basic Circuit dumGSR>

Figure 13B:
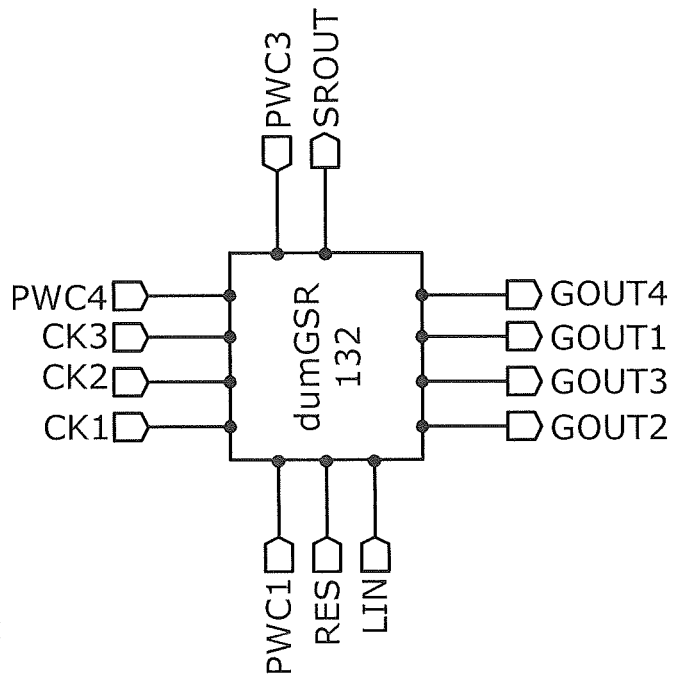
FIG. 13B shows a block diagram illustrating an example of a configuration of a dummy basic circuit thereof (dumGSR).
Figure 13A:
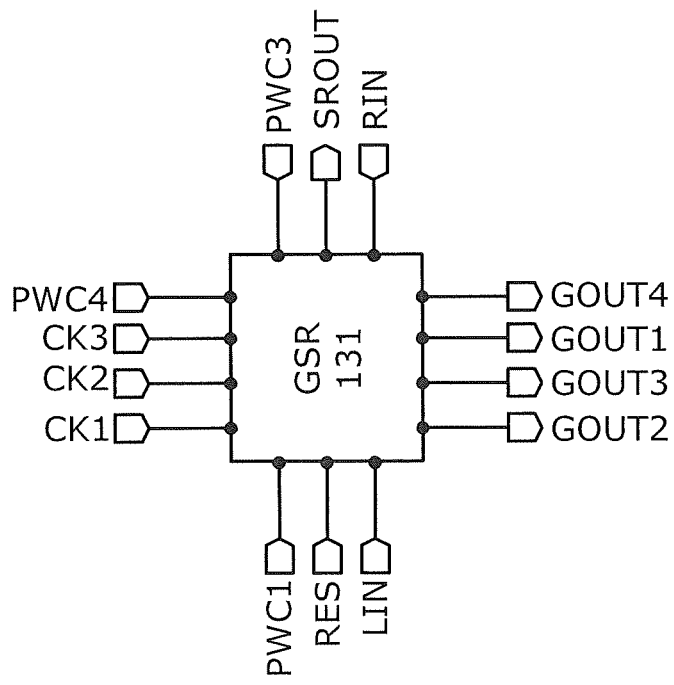
FIG. 13A shows a block diagram illustrating an example of a configuration of a basic circuit (GSR) of GDL, GDR.
Figure 14:
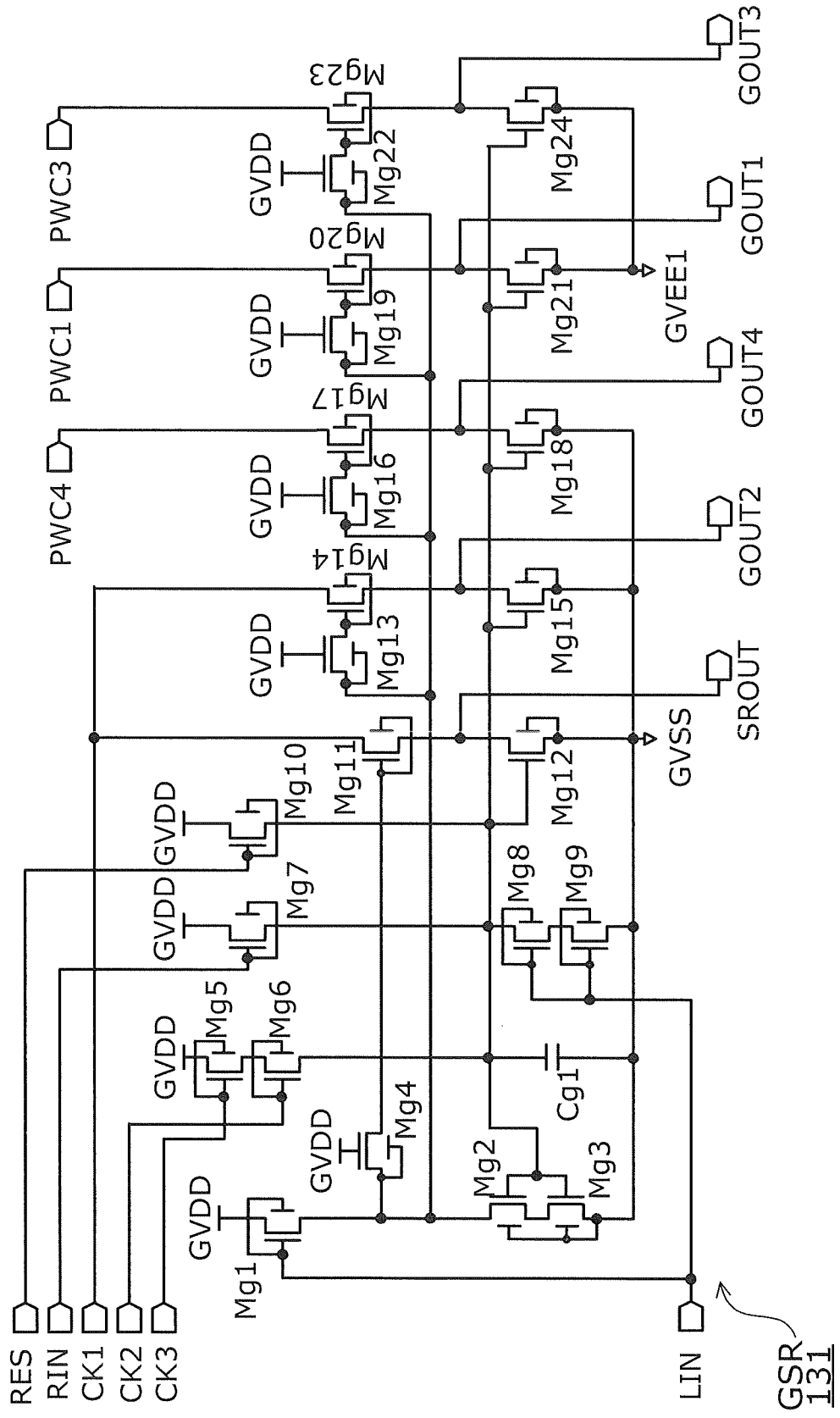
FIG. 14 shows a circuit diagram illustrating an example of a configuration of GSR.
Figure 15:
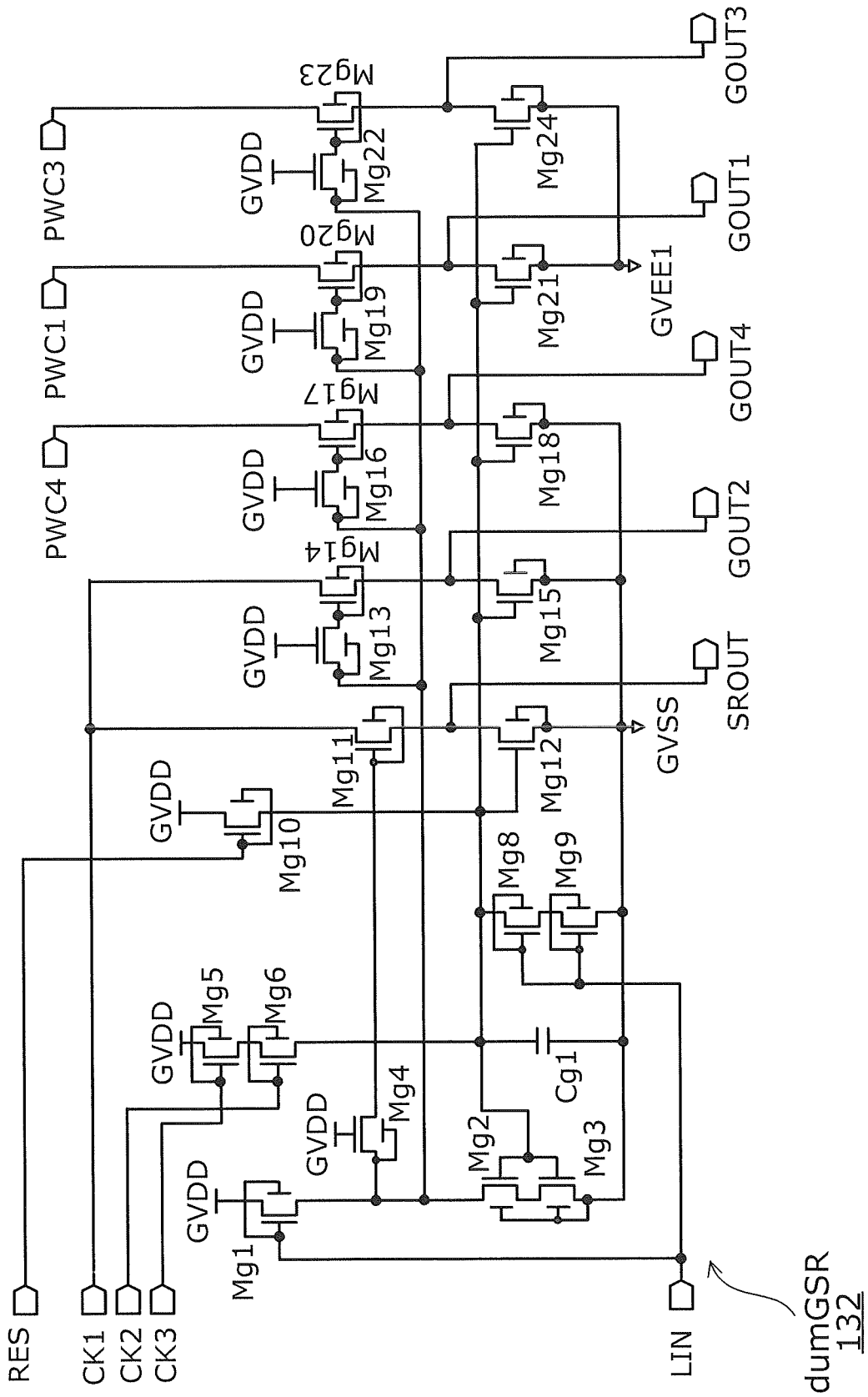
FIG. 15 shows a circuit diagram illustrating an example of a configuration of dumGSR.

FIG. 13A is a block diagram illustrating a configuration example of the GSR 131, and FIG. 13B is a block diagram illustrating a configuration example of the dumGSR 132. FIG. 14 is a circuit diagram illustrating a configuration example of the GSR 131, and FIG. 15 is a circuit diagram illustrating a configuration example of the dumGSR 132.

To the GSR 131, GVDD is input as a high power supply potential, and GVSS and GVEE1 are input as low power supply potentials. The GSR 131 includes input nodes (LIN, RES, RIN, CK1, CK2, CK3, PWC1, PWC3, PWC4), output nodes (SROUT, GOUT2, GOUT3, GOUT4), transistors (Mg1-Mg23), and a capacitor Cg1. Here, the transistors (Mg1-Mg23) are n-channel transistors, and they are provided with back gates. A transistor which does not include a back gate can be used as one or a plurality of transistors of these transistors (Mg1-Mg23).

As illustrated in FIG. 12, the input node RIN of the GSR 131 is connected to an output node SGOUT of the GSR 131 which is two stages after the current stage. The two dumGSR 132 are provided to output signals to the input nodes RIN of GSR[n−1] and GSR[n], respectively. Therefore, the dumGSR 132 itself does not need the input node RIN, and the dumGSR 132 corresponds to a circuit of the GSR 131 from which the input node RIN and the transistor Mg7 are removed.

The signal INIRES is input to the terminals RES of the GSR 131 and the dumGSR 132. The signal INIRES can function as a reset signal which resets the potential levels of the output nodes (SROUT, GOUT2, GOUT3, GOUT4) to low levels. The signal GSP is input to the input node LIN of the GSR 131 in the first stage. The signal GSP can function as a start pulse signal. The input nodes LIN of the GSR 131 in the second and sequential stages are connected to the output node SGOUT of the GSR in the previous stage.

<Basic Circuit GdINV>

Figure 16A:
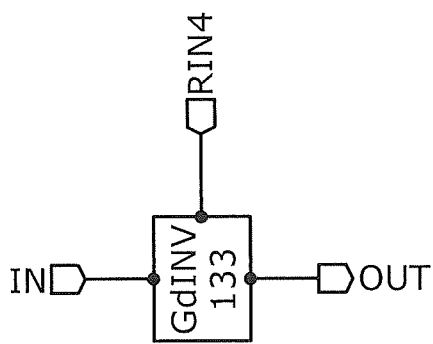
FIG. 16A shows a block diagram illustrating an example of a configuration a basic circuit (GdINV) of GDL, GDR.
Figure 16B:
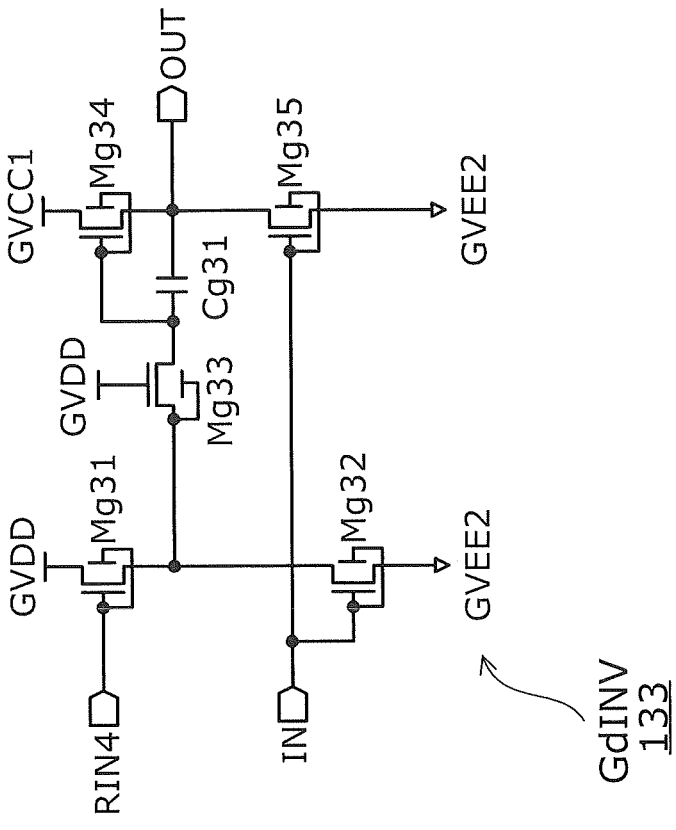
FIG. 16B shows a circuit diagram illustrating an example of a configuration of GdINV.

FIG. 16A is a block diagram illustrating a configuration example of the GdINV 133, and FIG. 16B is a circuit diagram thereof.

To the GdINV 133, GVDD is input as a high power supply potential, and GVEE2 is input to a low power supply potential. The GdINV 133 includes input nodes (IN, RIN4), an output node OUT, transistors (Mg31-Mg35), and a capacitor Cg31. Here, the transistors (Mg31-Mg35) are n-channel transistors. Furthermore, they are provided with back gates. One or a plurality of transistors of these transistors (Mg31-Mg35) can be transistors which do not include a back gate.

<<Driving Method Example of GDL, GDR>>

Figure 17:
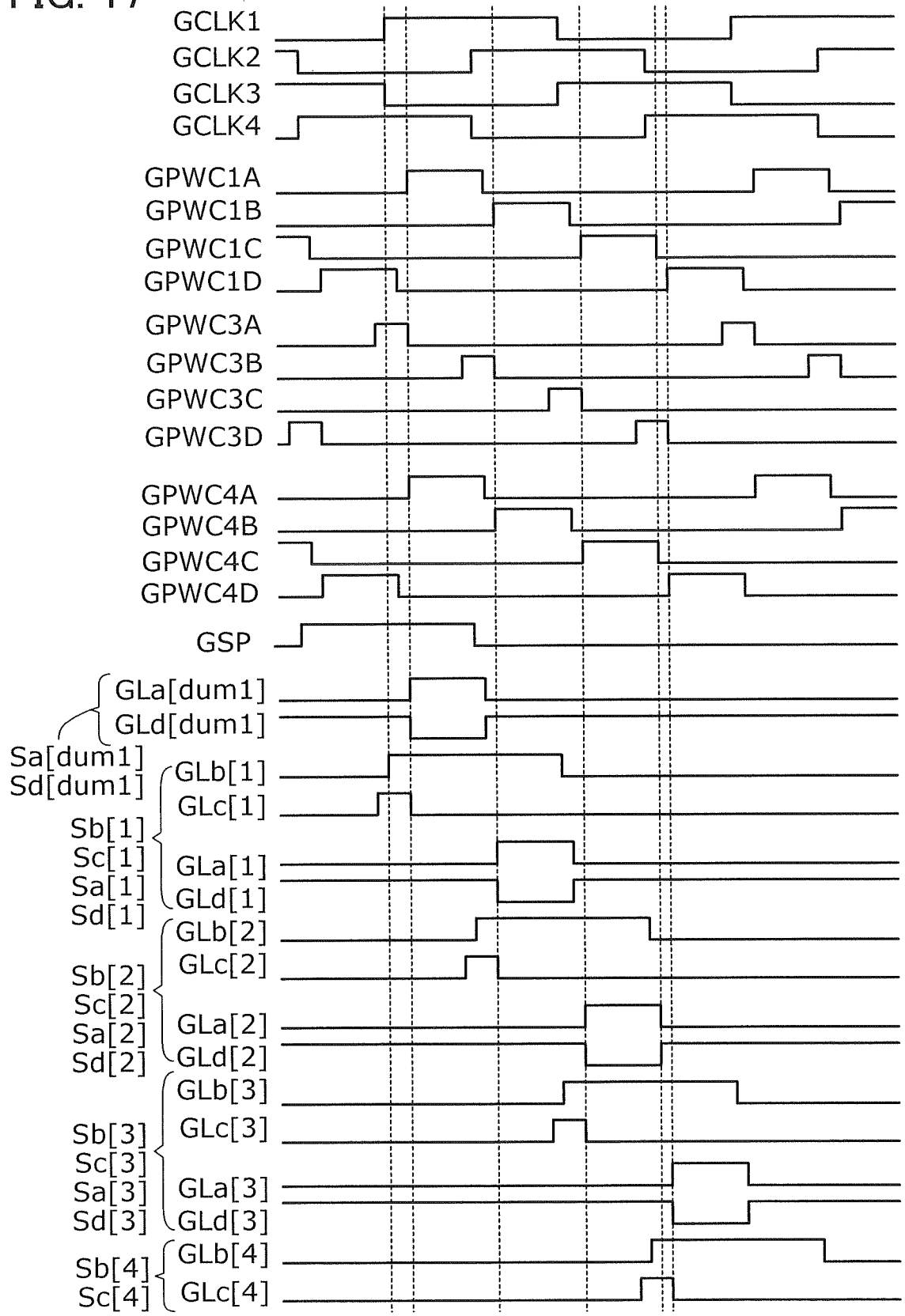
FIG. 17 shows a timing chart showing an example of a method for driving GDL, GDR.

FIG. 17 is a timing chart illustrating an example of a method for driving GDL and GDR. In FIG. 17, waveforms of a variety of signals input to GDL and GDR are illustrated. Furthermore, waveforms of output signals to wirings which are electrically connected to GSR[1]-GSR[4] are illustrated. Specifically, waveforms of signals (Sa[dum1], Sd[dum1]) output to the dummy wirings (GLa[dum1], GLd[dum1]), and signals (Sa[1]-Sa[3], Sb[1]-Sb[4], Sc[1]-Sc[4], Sd[3]-Sd[3]) output to the wiring groups GLS[1]-[4] are illustrated.

In the driving method example of FIG. 17, signals which have the same waveforms as the signals (GPWC1A, GPWC1B, GPWC1C, GPWC1D) are respectively used as the signals (GPWC4A, GPWC4B, GPWC4C, GPWC4D). Furthermore, FIG. 17 shows that the Gd1NV 133 generates an inverted signal of a signal Sa[h] input to a wiring GLa[h], and outputs it, as a signal Sd[h], to the wiring GLd[h].

<<Circuit SSDC1_E, Circuit SSDC1_O>>

Configuration examples and driving method examples of SSDC1_E and SSDC1_O are described below with reference to FIG. 10 and FIG. 18-FIG. 22.

As illustrated in FIG. 10, SSDC1_E and the circuit SSDC1_O each include m basic circuits (SSD) 141. The SSD 141 is a circuit having a function of a demultiplexer. In the example of FIG. 10, the SSD 141 includes one input node and three output nodes, and has a function of outputting a signal input to the input node to any one of the three output nodes. The SSD 141 is provided in accordance with the arrangement of the pixels 21. Here, since one SSD 141 is provided for three columns (RGB), SSDC1_E and SSDC1_O each include SSD 141 of m stages. In the example of FIG. 10, 2m SSD 141 are provided to be divided into the two circuits (SSDC1_E, SSDC1_O) in the element substrate 101; however, they may be provided as one circuit or may be provided to be divided into two or more circuits.

The input node of the SSD 141 is connected to a wiring DTL, and the wiring DTL is connected to the terminal 111. The terminal 111 is connected to a source driver circuit incorporated in an IC chip. The three output nodes of the SSD 141 are connected to respective wirings (SL_R, SL_G, SL_B). With such a connection configuration, the data signal DATA is input to the SSD 141 via the terminal 111 and the wiring DTL. The SSD 141 is capable of outputting the data signal DATA to any one of the wirings (SL_R, SL_G, SL_B).

Note that only the terminal 111 connected to the wiring DTL is illustrated in FIG. 10, the terminal is not limited thereto. In the element substrate 101, in addition to such a terminal 111, a plurality of terminals for supplying signals or potentials to GDL, GDR, the pixel portion 121, SDDC1_E, and SSDC1_O are provided.

Figure 18:
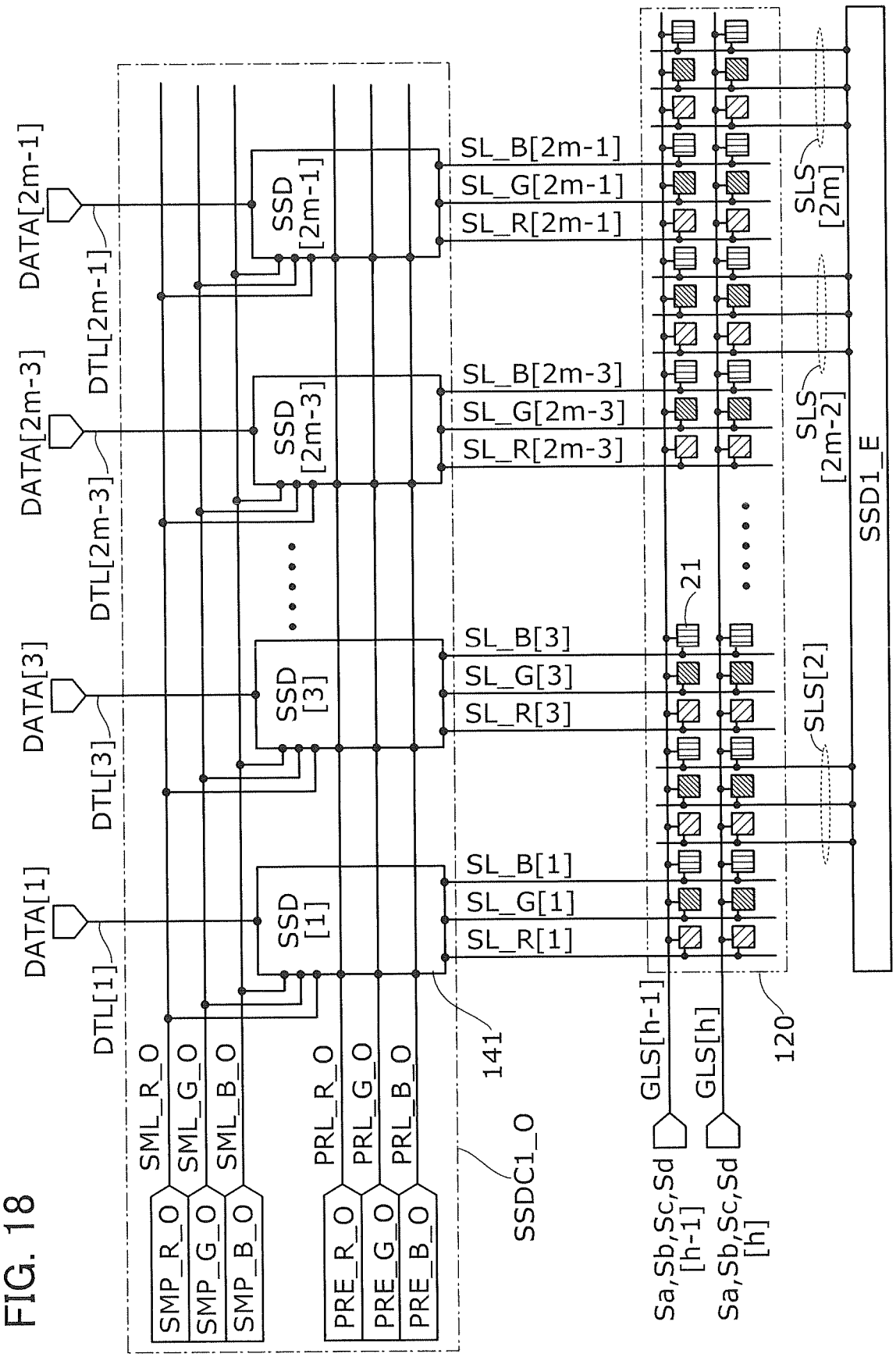
FIG. 18 shows a block diagram illustrating an example of a configuration of a circuit SSDC1_O.
Figure 19:
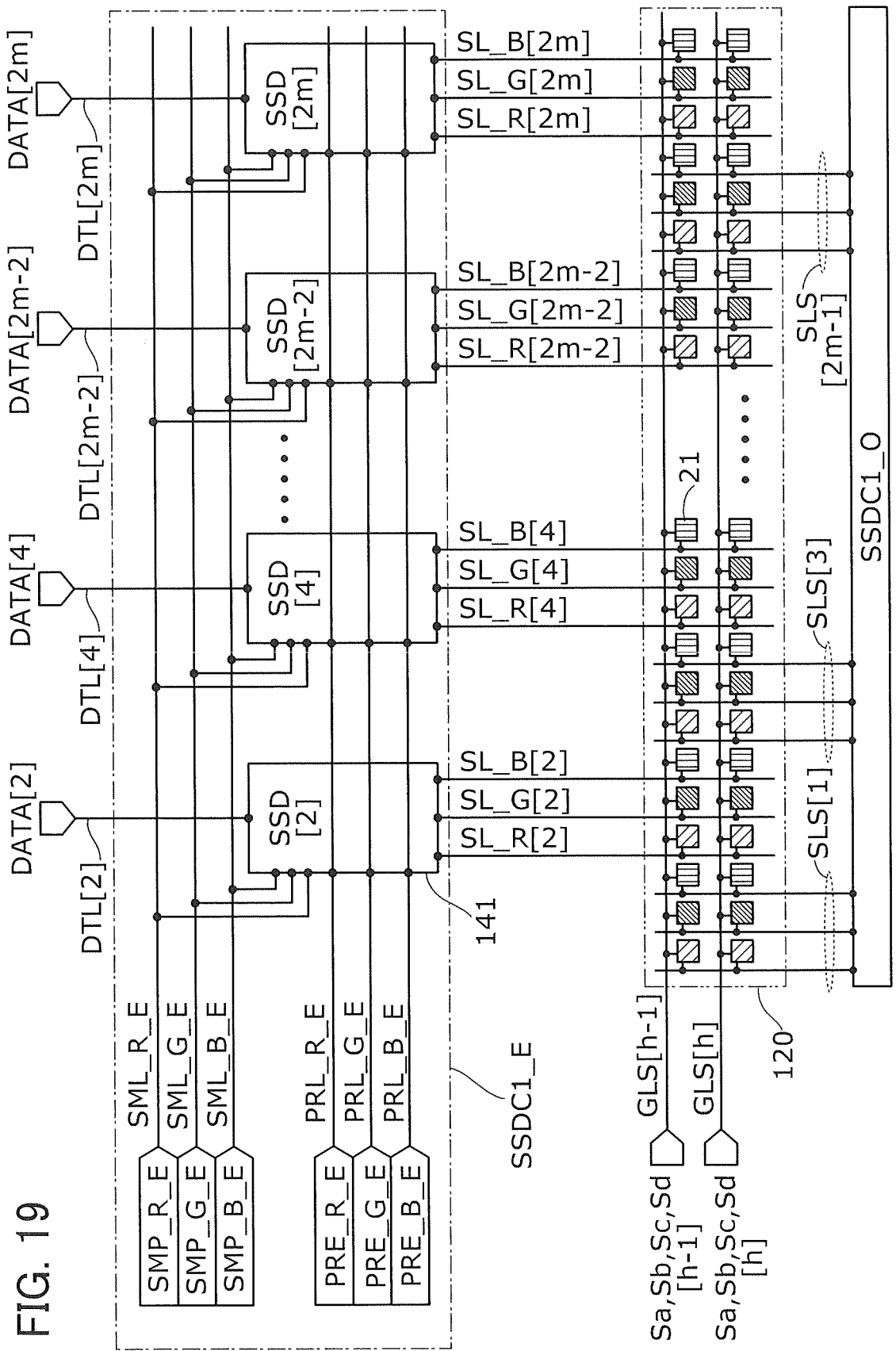
FIG. 19 shows a block diagram illustrating an example of a configuration of a circuit SSDC1_E.

FIG. 18 illustrates an example of the configuration of SDDC1_E, and FIG. 19 illustrates an example of the configuration of SSDC1_O. As illustrated in FIG. 18 and FIG. 19, SDDC1_E and SSDC1_O differ in that whether the wiring groups SLS to be controlled have odd numbers of columns or even numbers of columns, and have the same circuit configuration. Therefore, to distinguish components which are common in SDDC1_O and SSDC1_E (e.g., signals and wirings) and the like, identification symbols such as "_E" and "_O" are added.

As illustrated in FIG. 18, SSDC1_O includes wirings (SML_R_O, SML_G_O, SML_B_O), wirings (PRL_R_O, PRL_G_O, PRL_B_O), and the SSD 141 of m stages. As illustrated in FIG. 19, SSDC1_E includes wirings (SML_R_E, SML_G_E, SML_B_E), wirings (PRL_R_E, PRL_G_E, PRL_B_E), and the SSD 141 of m stages.

In SSDC1_O, signals (SMP_R_O, SMP_G_O, SMP_R_O) are input to the wirings (SML_R_O, SML_G_O, SML_B_O), respectively. The signals (SMP_R_O, SMP_G_O, SMP_B_O) can be used as control signals for selecting one wiring to be connected to the wiring DTL from the wirings (SL_R, SL_G, SL_B). Furthermore, signals (PRE_R_O, PRL_G_O, PRE_B_O) are input to the wirings (PRL_R_O, PRL_G_O, PRL_B_O), respectively. The signals (PRE_R_O, PRE_G_O, PRE_B_O) can be used as control signals for precharging the wirings (SL_R, SL_G, SL_B). As illustrated in FIG. 19, these wirings and signals are similar to those in SSDC1_E; therefore, the description of FIG. 18 is used.

<Basic Circuit SSD>

Figure 20A:
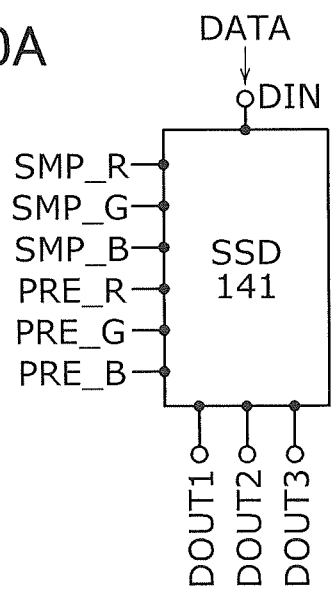
FIG. 20A shows a block diagram illustrating an example of a configuration of a basic circuit (SSD) of SSDC1_O, SSDC1_E.
Figure 20B:
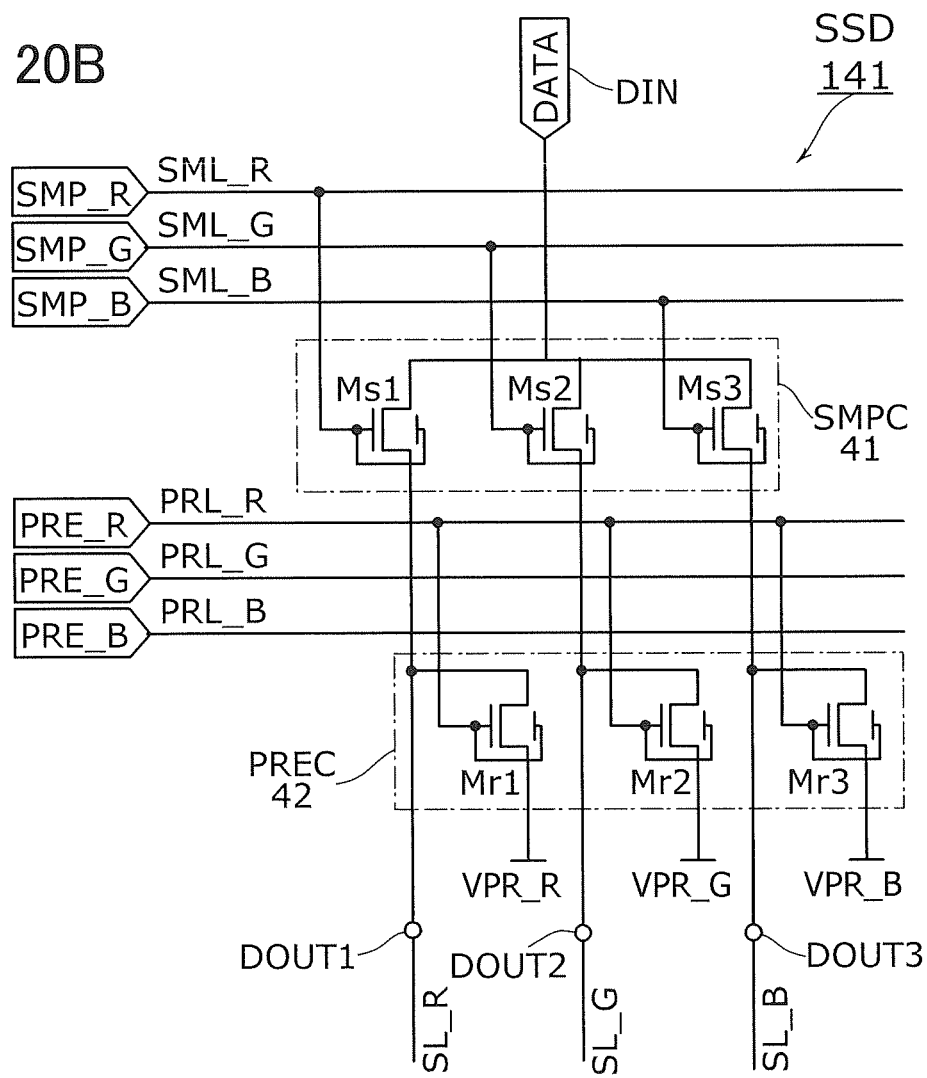
FIG. 20B shows a circuit diagram illustrating an example of a configuration of SSD.

FIG. 20A is a block diagram illustrating an example of the configuration of the SSD 141, and FIG. 20B is a circuit diagram illustrating an example of the configuration of the SSD 141.

The SSD 141 includes one input node DIN to which the data signal DATA is input, three output nodes (DOUT1, DOUT2, DOUT3) from which the data signal DATA is output, six input nodes to which the signals (SMP_R, SMP_G, SMP_B, PRE_R, PRE_G, PRE_B) are input, wirings (SML_R, SML_G, SML_B), and wirings (PRL_R, PRL_G, PRL_B). The signals (SMP_R, SMP_G, SMP_B) are input to the wirings (SML_R, SML_G, SML_B). The signals (PRE_R, PRE_G, PRE_B) are input to the wirings (PRL_R, PRL_G, PRL_B). To the node DIN, the wiring DTL is connected and the data signal DATA is input. The wirings (SL_R, SL_G, SL_B) are connected to the output nodes (DOUT1, DOUT2, DOUT3), respectively. The SSD 141 includes a circuit (SMPC) 41 which is controlled by the signals (SMP_R, SMP_G, SMP_B), and a circuit (PREC) 42 which is controlled by the signals (PRE_R, PRE_G, PRE_B).

The SMPC 41 can function as a demultiplexer. The SMPC 41 is a circuit capable of selecting a node which outputs an input signal (DATA) from the three nodes (DOUT1, DOUT2, DOUT3). The SMPC 41 is a circuit including transistors (Ms1, Ms2, and Ms3), and the transistors (Ms1, Ms2, Ms3) can each function as a switch which controls a conduction state between the nodes (DOUT1, DOUT2, DOUT3) and the node DIN. Gates of the transistors (Ms1, Ms2, Ms3) are electrically connected to the wirings (SMP_R, SML_G, SML_B). The conduction states of the transistors (Ms1, Ms2, Ms3) are controlled by the signals (SMP_R, SMP_G, SMP_B).

The PREC 42 is a circuit capable of controlling the potentials of the nodes (DOUT1, DOUT2, DOUT3), and can function as a precharge circuit, for example. The PREC 42 includes transistors (Mr1, Mr2, Mr3). Gates of the transistors (Mr1, Mr2, Mr3) are electrically connected to the wirings (PRL_R, PRL_G, PRL_B). The conduction states of the transistors (Mr1, Mr2, Mr3) are controlled by the signals (PRE_R, PRE_G, PRE_B). The transistor Mr1 can function as a switch which controls a conduction state between the node DOUT1 and a wiring to which a potential VPR_R is applied. The transistor Mr2 can function as a switch which controls a conduction state between the node DOUT2 and a wiring to which a potential VPR_G is applied. The transistor Mr3 can function as a switch which controls a conduction state between the node DOUT3 and a wiring to which a potential VPR_B is applied.

In the example of FIG. 20B, the transistors (Ms1, Ms2, Ms3) and the transistors (Mr1, Mr2, Mr3) are n-channel transistors; however, they may be p-channel transistors. Furthermore, back gates connected to the gates are provided in these transistors. Note that one or a plurality of transistors of these transistors (Ms1, Ms2, Ms3, Mr1, Mr2, Mr3) can be a transistor which does not include a back gate.

<<Driving Method Example 1 of Display Panel>>

Figure 21:
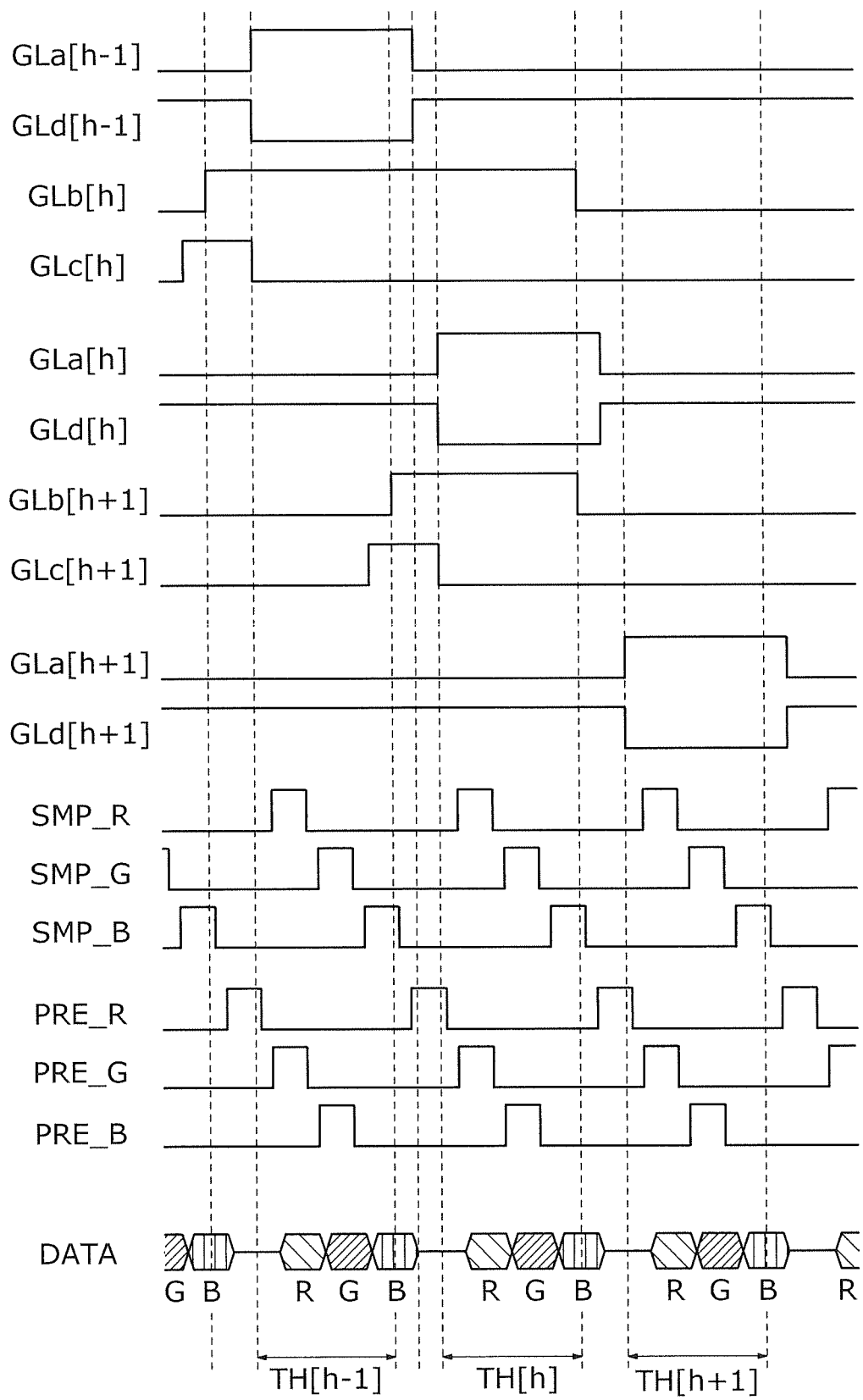
FIG. 21 shows a timing chart illustrating an example of a method for driving SSD and a display panel.
Figure 22:
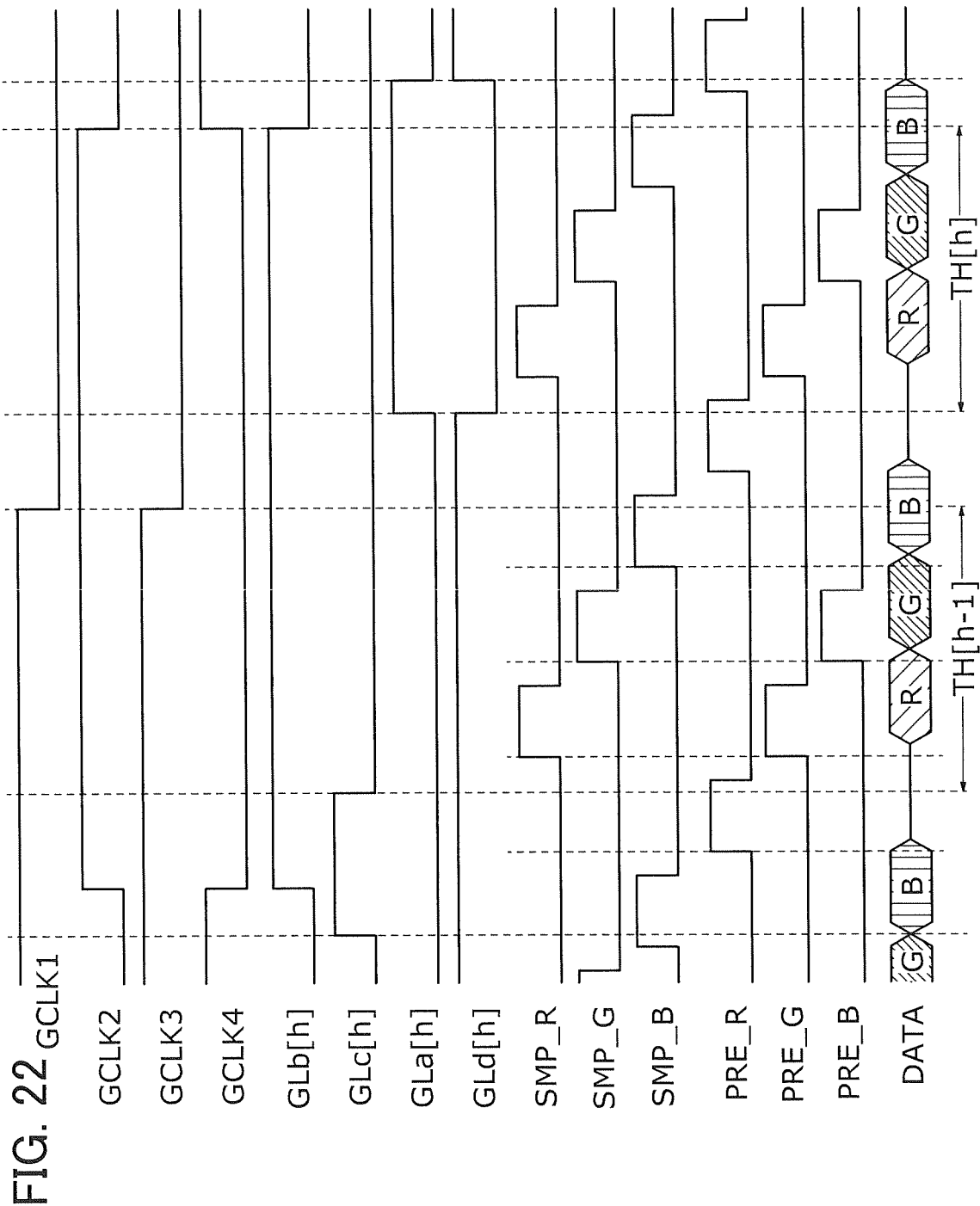
FIG. 22 shows a timing chart illustrating an example of a method for driving SSD and a display panel.

An example of a method for driving the SSD 141 and an example of a method for driving the display panel 100 are described with reference to timing charts of FIG. 21 and FIG. 22. In FIG. 21, waveforms of the input signals (DATA, SMP_R, SMP_G,SMP_B, PRE_R, PRE_G, PRE_B) of the SSD 141, and input signals to wirings (GLa, GLb, GLc, GLd) in the (h−1)-th row, the h-th row, and the (h+1)-th row are illustrated. Periods TH[h−1], TH[h], and TH[h+1] are one horizontal period of the (h−1)-th row, the h-th row, and the (h+1)-th row of the pixel portion 121, respectively. FIG. 22 corresponds to a partly enlarged timing chart of FIG. 21. In FIG. 21, in addition, waveforms of the signals (GCLK1, GCLK2, GCLK3, GCLK4) input to the gate driver circuits (GDL, GDR) are illustrated.

<Driving Method Example of SSD 141>

In one horizontal period TH, any one signal of SMP_R, SMP_G, and SMP_B becomes at a high level. Here, the SMPC 41 is controlled by the signals (SMP_R, SMP_G, SMP_B) so that two or more of the transistors (Ms1, Ms2, Ms3) are not brought into a conduction state at the same time.

The signal DATA input to the wiring DTL is input to each of the wirings (SL_R, SL_G, SL_B) in a period in which the signals (SMP_R, SMP_G, SMP_B) are at a high level. Therefore, the mode of the data signal DATA is a dot sequential drive mode in which separation is performed for each display color (RGB separation). Specifically, the data signal DATA is divided in the order of DATA_R, DATA_G, and DATA_B and input to the wiring DTL so that the signals (DATA_R, DATA_G, DATA_B) corresponding to the display colors are written in the pixels (21_R, 21_G, 21_B), respectively.

In the circuit configuration of the pixel 21, it is possible to perform the threshold-voltage correction operation and the data writing operation in different periods. That is, a combination of the SSD 141 (SSDC1_E and SSDC1_O) and the pixel 21 makes it possible to provide the display panel 100 capable of dot sequential driving and having an excellent display quality.

As illustrated in FIG. 10, in the display panel 100, the numbers of the wirings (SL_R, SL_G, SL_B) are each 2m. Owing to SSDC1_O and SSDC1_E, in the one horizontal period VH, first, 2m SL_R are selected at the same time as wirings to which the signal DATA is written, and the signal DATA_R is written. Next, 2m SL_G are selected at the same time, and the signal DATA_G is written; finally, 2m SL_B are selected at the same time, and the signal DATA_B is written. That is, in the display panel 100, by SSDC1_O and SSDC1_E, sampling can be performed on the 2m SL at the same time.

As illustrated in FIG. 10, although the display panel 100 includes the 2m×3 (RGB) wirings SL, the number of the terminals 111 for inputting the data signal DATA to these wirings SL is one third thereof, 2m. That is, by providing the SSD 141, the number of the terminals 111 can be one third of the number of the wirings SL. Therefore, when the number of the wirings SL which can be subjected to sampling by the SSD 141 is N (N is an integer greater than or equal to 2), the number of the terminals 111 can be 1/N of the total number of the wirings SL.

Furthermore, in the PREC 42 of the SSD 141, before the signal DATA is written in the wirings (SL_R, SL_G, SL_B), precharge for increasing the potentials of the wirings (SL_R, SL_G, SL_B) to predetermined potentials (VPR_R, VPR_G, VPR_B) is performed.

In the PREC 42, when the transistors (Mr1, Mr2, Mr3) are brought into a conduction state by signals (PRE_R_E PRE_G_E, PRE_B_E), the potentials (VPR_R, VPR_G, VPR_B) are applied to the wirings (SL_R, SL_G, SL_B), respectively. By performing such a precharge operation, in the period in which the signals (SMP_R, SMP_G, SMP_B) are at a high level (a period in which the wirings (SL_R, SL_G, SL_B) are selected by the SSD 141), the potentials of the wirings (SL_R, SL_G, SL_B) can be respectively set to potentials corresponding to the data signals (DATA_R, DATA_G, and DATA_B) more surely.

In the case where the period in which the wirings (SL_R, SL_G, SL_B) are selected is sufficiently longer than time needed for setting the potentials of the wirings (SL_R, SL_G, SL_B) to the potentials corresponding to the data signals DATA, the PREC 42 is not necessarily provided in the SSD 141. Alternatively, it is possible not to perform precharge operations for some wirings of the wirings (SL_R, SL_G, SL_B). For example, the signal PRE_R can be continuously at a low level even in a period in which the display panel 100 is operated. In this case, the transistor Mr1 (FIG. 19) is brought into a non-conduction state, so that precharge of the wiring SL_R is not performed.

<<Configuration Example 2 of Display Panel>>

Figure 23:
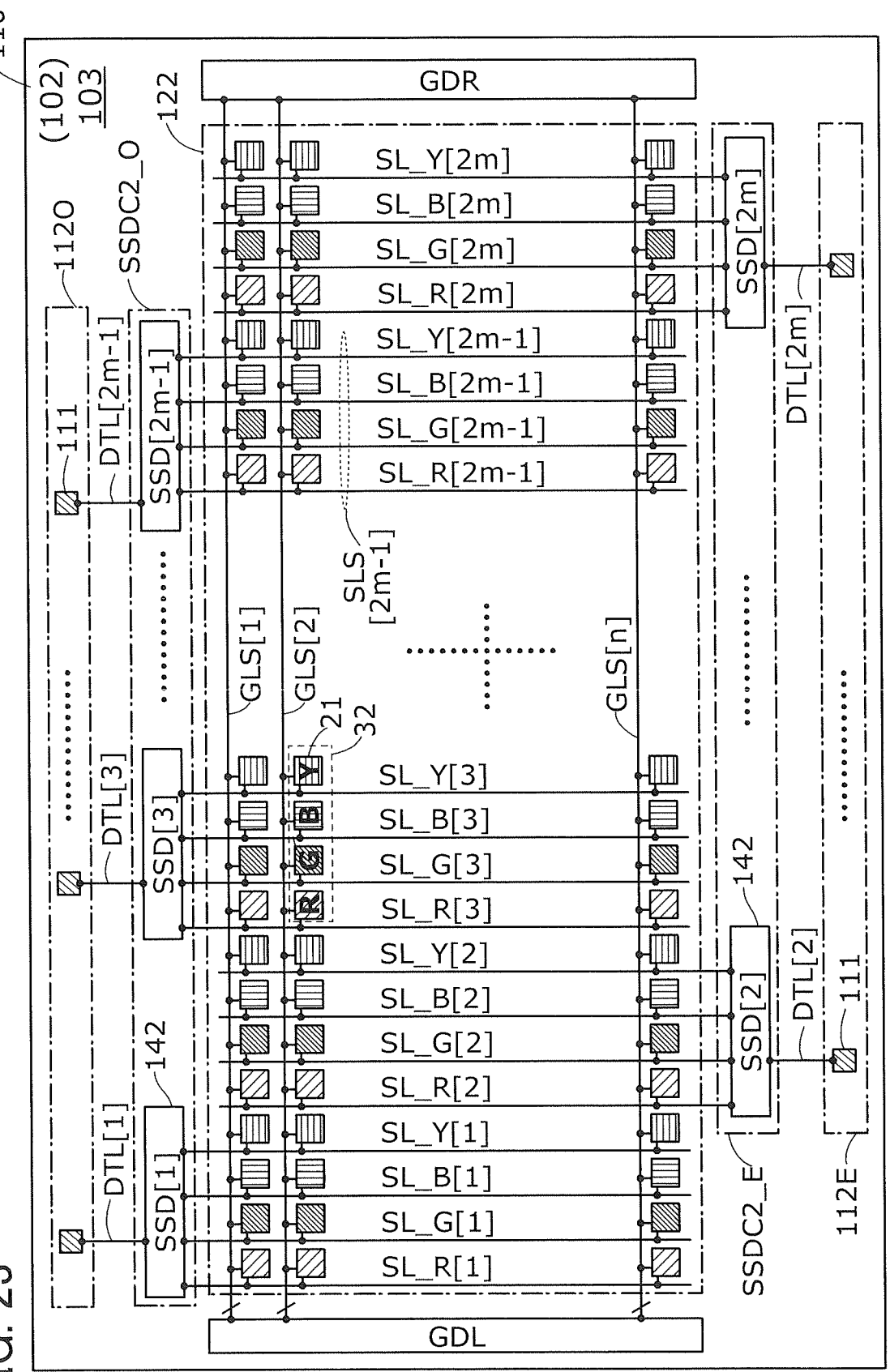
FIG. 23 shows a block diagram illustrating an example of a configuration of a display panel (element substrate).

Although FIG. 10 illustrates the example in which one unit pixel 31 is formed of three (RGB) pixels 21 (sub-pixels), the unit pixel is not limited thereto; the number of sub-pixels, the light-emission colors of the sub-pixels, arrangement of the sub-pixels in the unit pixel, and the like can be set as appropriate. For example, one unit pixel can be formed of four sub-pixels which performs light emission of red (R), green (G), blue (B), and yellow (Y). In the following description, an example of a configuration of a display panel 102 provided with such a unit pixel is illustrated in FIG. 23. Needless to say, the display colors of the sub-pixels included in a unit pixel are not limited thereto; for example, red (R), green (G), blue (B), and white (W) can be employed.

FIG. 23 is a block diagram illustrating an example of the configuration of an element substrate 103 included in the display panel 102. The element substrate 103 has a structure similar to that of the element substrate 101. The display panel 102 can be driven in a manner similar to that of the display panel 100. Different points are described below.

In a pixel portion 122 of the element substrate 103, a unit pixel 32 is formed of four pixels 21 of RGBY. In the element substrate 103, SSD2_E and SSD2_O are provided. SSD2_E and SSD2_O each include m basic circuits SSD 142.

<Basic Circuit SSD>

Figure 24A:
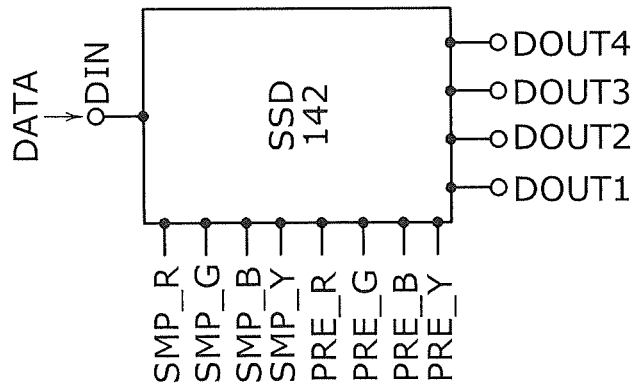
FIG. 24A shows a block diagram illustrating an example of a configuration of a basic circuit (SSD).
Figure 24B:
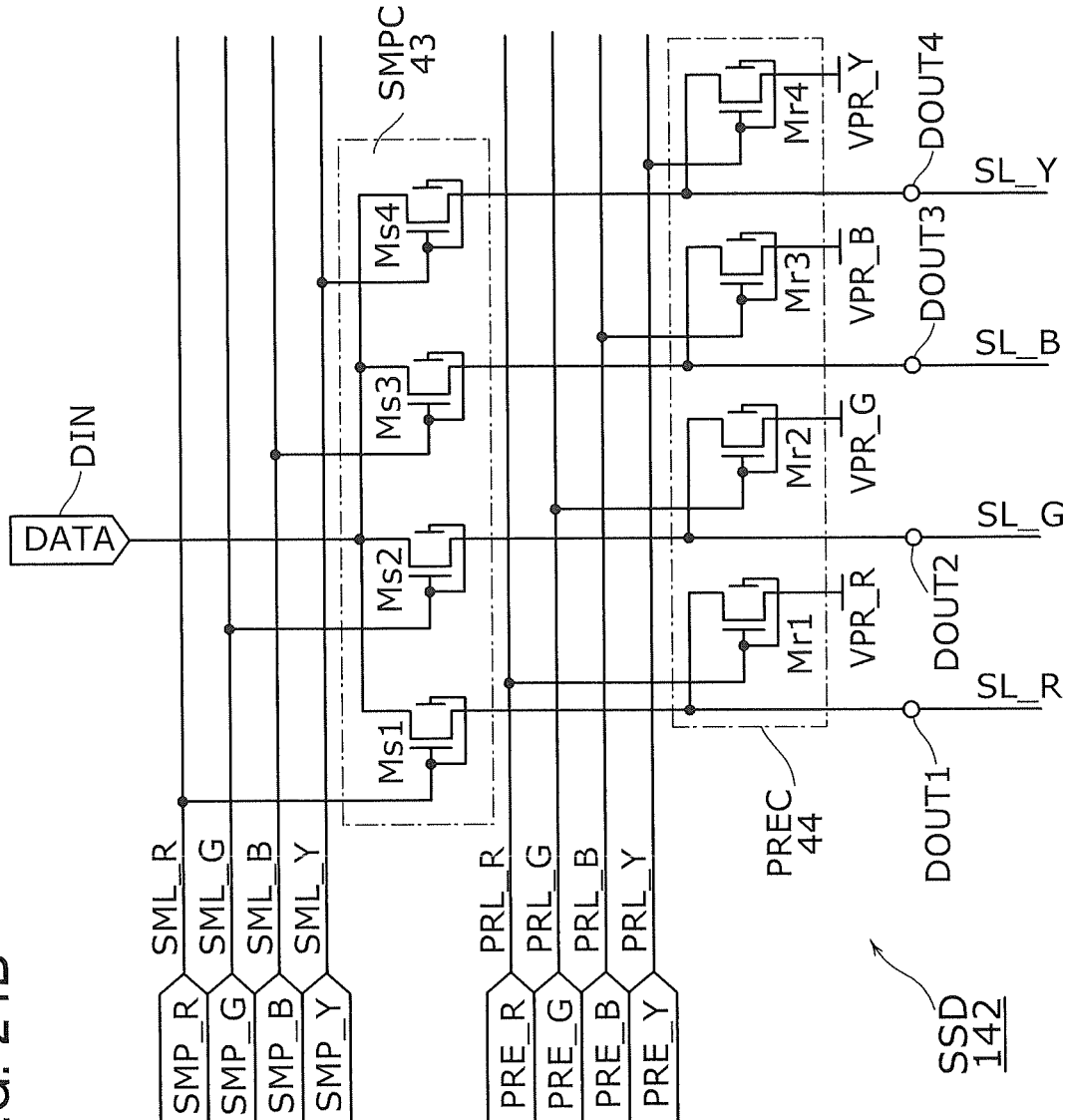
FIG. 24B shows a circuit diagram illustrating an example of a configuration of SSD.

FIG. 24A is a block diagram illustrating an example of the configuration of the SSD 142, and FIG. 24B is a circuit diagram thereof. As illustrated in FIG. 24B, the SSD 142 includes a circuit (SMPC) 43 and a circuit (PREC) 44. The SMPC 43 has a function similar to that of the SMPC 41 and corresponds to a circuit obtained by adding a wiring SML_Y and a transistor Ms4 to the SMPC 41. The circuit PREC 44 has a function similar to that of the circuit PREC 42 and corresponds to a circuit obtained by adding a wiring PRL_Y and a transistor Mr4 to the PREC 42.

As illustrated in FIG. 23, although the number of the wirings SL of the display panel 102 is larger than that of the display panel 100 by 2m, when 2m SSD 142 are provided, the number of the terminals 111 can be the same as that of the display panel 100, 2m.

As described above, application of this embodiment makes it possible to provide a display device which has a threshold-voltage correction function for transistors of pixels and is capable of dot sequential driving. Alternatively, application of this embodiment makes it possible to provide a display device with a reduced number of terminals.

As described above, in the display panel of this embodiment, the pixel portion and the other peripheral circuits can be formed using transistors having the same conductivity type (single polarity). Therefore, the number of steps for manufacturing the element substrate can be reduced, and thus the manufacturing cost of the display panel can be reduced.

Embodiment 3

In this embodiment, an active matrix display device is described as an example of a semiconductor device. As an example, a device structure of the display panel of Embodiment 2 and a manufacturing method thereof are described. More specifically, a structure example of the display panel 100 (FIG. 10) using the element substrate 101, a manufacturing method example thereof, and the like are described.

(Device Structure and the like of Semiconductor Element)

There is no particular limitation on a device structure of a semiconductor element such as a transistor included in the element substrate 101. A transistor suitable for characteristics of a circuit formed in the element substrate 101 may be selected. As the device structure of the transistor, for example, a top-gate type, a bottom-gate type, a dual-gate type provided with both a gate (front gate) and a bottom gate, and a multi-gate type including a plurality of gate electrodes for one semiconductor layer can be given. In addition, there is also no particular limitation on a semiconductor layer in which a channel of the transistor is formed. A semiconductor film included in the semiconductor layer is roughly divided into a single crystal semiconductor film and a non-single-crystal semiconductor film. As the non-single-crystal semiconductor film, a polycrystalline semiconductor film, a microcrystalline semiconductor film, an amorphous semiconductor film, and the like can be given. As a semiconductor material of the semiconductor layer, a Group 4 semiconductor including one kind or a plurality of kinds of Group 4 elements such as Si, Ge, and C (e.g., silicon or silicon carbide), an oxide semiconductor film (e.g., an In—Ga—Zn oxide), a compound semiconductor film, and the like can be given.

<<Structure Example of Display Panel>>

Figure 25:
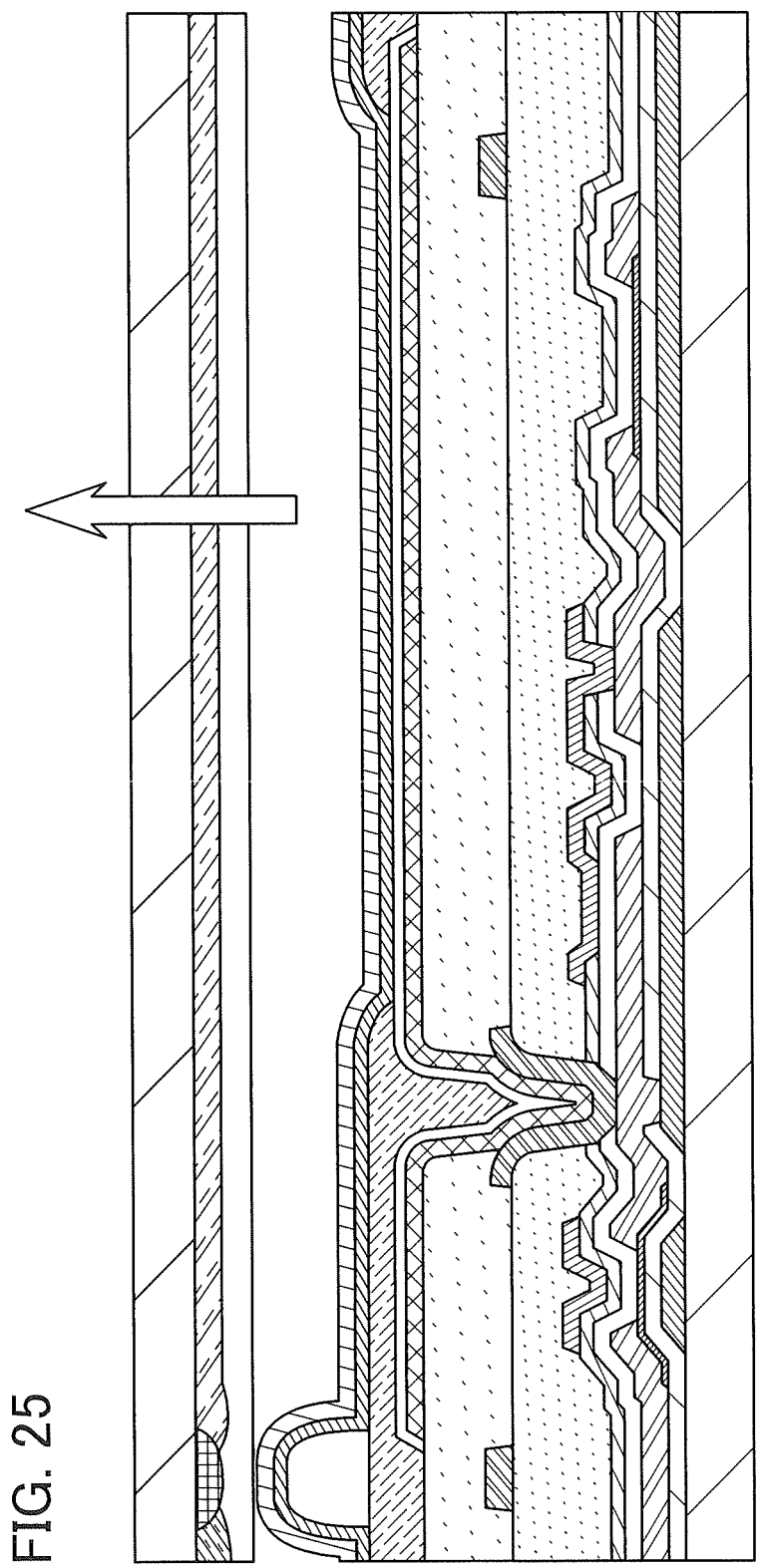
FIG. 25 shows a cross-sectional view illustrating an example of a structure of a display panel.
Figure 26B:
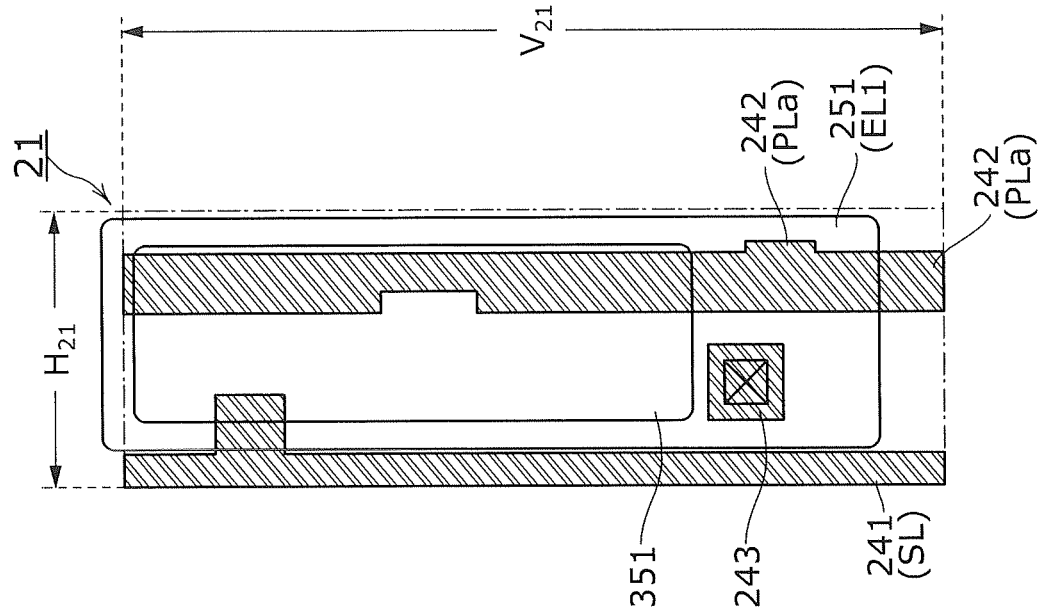
FIGS. 26A and 26B show plan views illustrating an example of a structure of a pixel.
Figure 26A:
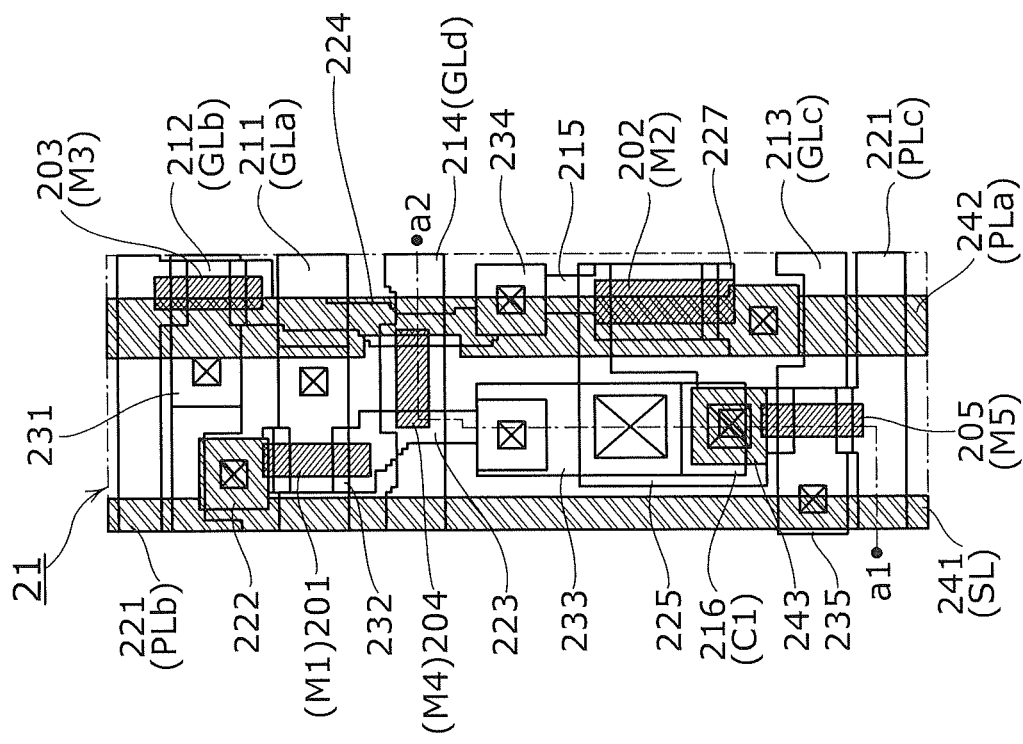

FIG. 25 is a cross-sectional view illustrating an example of the structure of the display panel. FIG. 26A and FIG. 26B are layout views illustrating an example of the structure of the pixel 21. As illustrated in FIG. 25, the display panel 100 includes the element substrate 101 and a counter substrate 171. Note that in this specification, in a display panel, a substrate facing an element substrate is referred to as a counter substrate. Note that the counter substrate may also be referred to as a color filter substrate or a sealing substrate.

Here, as an example of the display panel 100, an example in which the element substrate 101 is formed with transistors having the same conductivity type (single polarity) is described. Furthermore, an example in which the transistors of the element substrate 101 are transistors with oxide semiconductor layers including channels (referred to as OS transistors in the description below) is described.

In addition, in the example of FIG. 25, the display panel 100 has a top-emission structure in which light 180 emitted by the light-emitting element EL1 is extracted from the counter substrate 171 side. Moreover, a plurality of light-emitting elements EL1 in the pixel portion 121 are each provided with a common EL layer emitting light exhibiting white color, and the counter substrate 171 is provided with an RGB color filter, whereby color display is performed by the display panel 100. Note that the device structure of the display panel capable of color display is not limited to the structure of FIG. 25. For example, a color filter can be provided in the element substrate. Furthermore, EL layers performing light emission with different colors are formed in the pixel 21_R, the pixel 21_G, and the pixel 21_B, whereby color display is also possible. In this case, a color filter may be provided in the element substrate or the counter substrate or not provided.

<Structure Example of Element Substrate>

(Layout Example of Pixel)

A structure example of the pixel 21 is described with reference to FIG. 25 and FIG. 26. FIG. 26A illustrates a layout example of the transistors M1-M5 and the capacitor C1 of the pixel 21. FIG. 26B illustrates a layout example of a pixel electrode (conductor layer 251) of the light-emitting element EL1 stacked over these elements. FIG. 25 corresponds to a cross-sectional view along a section line a1-a2 of FIG. 26A, and reference numerals are written for some openings for clarification of the drawing. Furthermore, in FIG. 26A and FIG. 26B, for clarification of the drawings, description of some layers and reference numerals of openings are omitted, and hatch patterns are used for some layers.

The layout examples of FIG. 26 make it possible to provide the display panel 100 with a diagonal size of a display area of 13.3 inches and a resolution of 8k4k (7,680× RGB×4,320). In the specifications, the size of the pixel 21 is 12.75 µm ($H_{21}$)×8.25 µm ($V_{21}$).

The element substrate 101 is formed in such a manner that an oxide semiconductor (OS) layer, a plurality of insulating layers, a plurality of conductor layers, an oxide semiconductor (OS) layer, and the like are stacked over the substrate 110. The pixel 21 includes OS layers 201-205, first-layer conductor layers 211-216, second-layer conductor layers 221-227, third-layer conductor layers 231-235, and insulating layers 271-273. The transistors M1-M5 and the capacitor C1 are formed using these layers. The pixel 21 further includes fourth-layer conductor layers 241-243, conductor layers 251-253, an EL layer 260, and insulating layers 274-277. A portion where the conductor layers 251-253 and the EL layer 260 are stacked functions as the light-emitting element EL1.

(Peripheral Circuit)

Furthermore, in the element substrate 101, as peripheral circuits, gate driver circuits (GDL, GDR) and circuits (SSDO1, SSDE1) are formed. In these circuits, transistors and capacitors which have device structures similar to those of the pixel 21 are formed.

The conductor layers (211-216, 221-227, 231-235, 241-243, 251-253, and the like) included in the element substrate 101 can be formed with a single-layer conductive film or two or more layers of conductive films. As such conductive films, metal films of aluminum, chromium, copper, silver, gold, platinum, tantalum, nickel, titanium, molybdenum, tungsten, hafnium, vanadium, niobium, manganese, magnesium, zirconium, beryllium, and the like can be used. Furthermore, an alloy film and compound film containing these metals as components, a polycrystalline silicon film containing an impurity element such as phosphorus, a silicide film, and the like can be used. Furthermore, as the conductive film included in the element substrate 101, a light-transmitting conductive film can be used. As the light-transmitting conductive film, a film containing a metal oxide such as indium oxide containing tungsten oxide, indium zinc oxide containing tungsten oxide, indium oxide containing titanium oxide, indium tin oxide containing titanium oxide, indium tin oxide (referred to as ITO), indium zinc oxide, or indium tin oxide to which silicon oxide is added can be given.

The insulating layers (271-278) can be formed with a single-layer insulating film or two or more insulating films. As an inorganic insulating film, films formed of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium film, hafnium oxide, tantalum oxide, and the like can be given. Furthermore, as a resin film, an organic resin film of an acrylic resin, a polyimide resin, a benzocyclobutene-based resin, a siloxane-based resin, a polyamide resin, an epoxy resin, or the like can be given. Note that in this specification, an oxynitride refers to a compound that contains more oxygen than nitrogen, and a nitride oxide refers to a compound that contains more nitrogen than oxygen.

Typical examples of methods for depositing an insulating film, a conductive film, a semiconductor film, and the like included in the display panel 100 include a sputtering method and a plasma CVD method. Other methods, for example, a coating method, a nano-imprinting method, an evaporation method, a thermal CVD method, a molecular beam epitaxy (MBE) method, and the like, can be given, An MOCVD (Metal Organic Chemical Vapor Deposition) method or an ALD (Atomic Layer Deposition) method can be employed as a thermal CVD method, for example.

<Structure Example of Counter Substrate>

As illustrated in FIG. 25 and FIG. 28, the counter substrate 171 includes a substrate 170, a light-blocking layer 280, and color filter layers (281_R, 281_B, 281_G). The color filter layers (281_R, 281_B, 281_G) are each an optical filter layer for converting the light (white light) 180 emitted by the EL layer 260 into light of a different color. The light-blocking layer 280 has a function of blocking light that is transmitted through the substrate 170 and enters the display panel 100. The light-blocking layer 280 can have either a single-layer structure or a stacked-layer structure including two or more layers. As an example of a film included in the light-blocking layer 280, a film formed of a high molecule in which chromium, titanium, nickel, or carbon black is dispersed, or the like can be given. An overcoat layer 282 has functions of planarizing the surface of the counter substrate 171 and preventing diffusion of impurities (typically, water and/or oxygen) The overcoat layer 282 can be formed using, for example, a polyimide resin, an epoxy resin, an acrylic resin, or the like.

As in the display panels 71-74 (FIG. 9), also in the display panel 100, the element substrate 101 and the counter substrate 171 are fixed with a sealant. Note that in the display panel 100, it is possible to improve the extraction efficiency of the light 180 by providing an optical film or the like in the counter substrate 171. Further, the counter substrate 171 may be provided with a drying agent to prevent the light-emitting element EL1 from deteriorating. For a similar reason, a space 181 between the substrate 110 and the substrate 170 is preferably filled with an inert gas such as a nitrogen gas or an argon gas or a solid substance such as a resin material. In addition, filling the space 181 with a substance with a high refractive index (e.g., a resin) can increase the extraction efficiency of the light 180.

<Manufacturing Method Example of Element Substrate>

An example of a method for manufacturing the element substrate 101 is described below with reference to FIG. 25-FIG. 28. FIG. 27 and FIG. 28 are plan views for explaining an example of a method for manufacturing the pixels (21_R, 21_G, 21_B). Furthermore, in the element substrate 101, the peripheral circuit portions (GDL, GDR, SSDO1, SSDE1) and the terminal portions (112O, 112E) are formed at the same time through steps for manufacturing the pixel 21.

(First-layer Conductor Layer)

A single-layer or a stacked-layer conductive film is formed over the substrate 110. Here, as the conductor film, a copper film with a thickness of 170 nm to 230 nm, and a tantalum nitride film with a thickness of 5 nm to 15 nm as a base film of the copper film are formed. A resist mask RM1 (not illustrated) is formed over the copper film. A stacked-layer film of the tantalum nitride film and the copper film is etched using the resist mask RM1 to form the first-layer conductor layers 211-216 (FIG. 27A). The conductor layer 211 is included in the wiring GLa and includes a region functioning as a gate electrode of the transistor M1. The conductor layer 212 is included in the wiring GLb and includes a region functioning as a gate electrode of the transistor M3. The conductor layer 213 is included in the wiring GLc and includes a region functioning as a gate electrode of the transistor M5. The conductor layer 214 is included in the wiring GLd and includes a region functioning as a gate electrode of the transistor M4. The conductor layer 215 includes a region functioning as a gate electrode of the transistor M2. The conductor layer 216 includes a region functioning as a terminal (electrode) of the capacitor C1.

The insulating layer 271 is formed to cover the conductor layers 211-216. The insulating layer 271 includes a region functioning as gate insulating layers of the transistors M1-M5 and a region functioning as a dielectric layer of the capacitor C1. Here, an insulating film with a two-layer structure is formed as the insulating layer 271. For example, a silicon nitride film with a thickness of 300 nm to 500 nm is used as the first layer, and a silicon oxynitride film with a thickness of 20 nm to 100 nm is formed as the second layer. These films can be formed by a PE (plasma-enhanced) CVD method.

(OS Layer)

An oxide semiconductor film is formed over the insulating layer 271. As the oxide semiconductor film, a semiconductor film formed of a metal oxide such as an In—Ga oxide, an In—Zn oxide, an In-M-Zn oxide (M is Al, Ti, Ga, Y, Zr, La, Ce, Nd, or Hf) can be formed. Here, an In—Ga—Zn oxide film with a thickness of 30 nm to 50 nm is deposited by a sputtering method. The In—Ga—Zn oxide film is etched using a resist mask RM2 (not illustrated) to form the OS layers 201-205 (FIG. 27B). The OS layers 201-205 are serve as semiconductor layers including channel formation regions of the transistors M1-M5, respectively.

(Second-layer Conductor Layer)

To form an opening 301 and an opening 302 in the insulating layer 271, the insulating layer 271 is etched using a resist mask RM3 (not illustrated) to form the opening 301 reaching the conductor layer 215 and the opening 302 reaching the conductor layer 216 (FIG. 27C).

A conductive film is formed over the insulating layer 271 and the OS layers 201-205. Here, a conductive film with a three-layer structure is formed. A tungsten film with a thickness of 30 nm to 80 nm is formed as the first layer, an aluminum film with a thickness of 200 nm to 500 nm is formed as the second layer, and a titanium film with a thickness of 70 nm to 150 nm is formed as the third layer. These films can be formed by a sputtering method. This conductive film with the three-layer structure is etched using a resist mask RM4 (not illustrated) to form the conductor layers 221-226 (FIG. 27C).

The conductor layer 221 is included in the wiring PLb and includes a region functioning as a source electrode or a drain electrode of the transistor M3. The conductor layer 222 includes a region functioning as a source electrode or a drain electrode of the transistor M1. The conductor layer 223 includes regions functioning as source electrodes or drain electrodes of the transistors M1 and M4, and is in contact with the conductor layer 216 in the opening 302. The conductor layer 224 includes regions functioning as source electrodes or drain electrodes of the transistors M4 and M5, and is in contact with the conductor layer 215 in the opening 301. The conductor layer 225 includes regions functioning as source electrodes or drain electrodes of the transistors M2 and M5 and a region functioning as an electrode of the capacitor C 1. The conductor layer 226 is included in the wiring PLc and includes a region functioning as the source electrode or the drain electrode of the transistor M5. The conductor layer 227 includes a region functioning as the source electrode or the drain electrode of the transistor M2.

(Third-layer Conductor Layer)

The insulating layer 272 is formed to cover the OS layers 201-205 and the conductor layers 221-227. As the insulating layer 272, for example, a silicon oxynitride film with a thickness of 300 nm to 500 nm is formed by a PECVD method. The insulating layer 272 is etched using a resist mask RM5 (not illustrated) to form an opening 305 reaching the conductor layer 225 (FIG. 27D). Furthermore, by this etching step, the insulating layer 272 (silicon oxynitride film) and the second layer (silicon oxynitride film) of the insulating layer 271 in regions where openings 311-313 are to be formed are removed.

The insulating layer 273 is formed to cover the insulating layer 272. As the insulating layer 273, for example, a silicon nitride film with a thickness of 75 nm to 125 nm is formed.

The insulating layers 271-273 are etched using a resist mask RM6 (not illustrated) to form the openings 311-313, an opening 321, and an opening 322 (FIG. 27D). The openings 311-313 are openings reaching the conductor layers 211-213. The opening 321 is an opening reaching the conductor layer 223, and the opening 322 is an opening reaching the conductor layer 224.

A conductive film is formed over the insulating layer 273. Here, a single-layer light-transmitting conductive film is formed. Here, an indium tin oxide (ITO) film which contains silicon oxide (SiOx) and has a thickness of 75 nm to 125 nm is formed by a sputtering method. A resist mask RM7 (not illustrated) is formed over the light-transmitting conductive film, and the light-transmitting conductive film is etched to form the conductor layers 231-235 (FIG. 27D).

The conductor layer 231 includes a region functioning as a back gate electrode of the transistor M1 and is in contact with the conductor layer 211 in the opening 311. The conductor layer 232 includes a region functioning as a back gate electrode of the transistor M3 and is in contact with the conductor layer 212 in the opening 312. The conductor layer 233 includes a region functioning as a back gate electrode of the transistor M5 and is in contact with the conductor layer 213 in the opening 313. The conductor layer 234 includes a region functioning as a back gate electrode of the transistor M2 and is in contact with the conductor layer 215 through the opening 322. The conductor layer 235 includes a region functioning as an electrode of the capacitor C1 and is in contact with the conductor layer 223 in the opening 321.

Through the above steps, the transistors M1-M5 and the capacitor C1 are manufactured. As illustrated in FIG. 25, the capacitor C1 includes the conductors (216, 224, 225, 235) in the electrodes, and the insulating layer 271 and the insulating layer 272 as dielectrics. In addition, the size or sizes (channel length L, channel width W) of one or a plurality of transistors of the transistors M1-M5 may differ between the pixel 21_R, the pixel 21_G, and the pixel 21_B. For example, L/W (the ratio of the channel length and the channel width) of the transistors M2 may be set so that the pixel 21_R>the pixel 21_G>the pixel 21_B. Accordingly, Id2 flowing in the transistor M2 can be varied depending on the light-emission color of the pixel 21 even when the gate-source voltages Vgs2 are the same (see Formulae (3) and (4) in Embodiment 1 described above).

(Fourth-Layer Conductor Layer)

The insulating layer 274 is formed to cover the insulating layer 273 and the conductor layers 231-235. The insulating layer 274 is preferably formed as a planarization film for planarizing unevenness due to the transistors M1-M5 and the capacitor C1 in the pixel 21. As the insulating layer 274, a resin film is preferable. Here, a polyimide film with a thickness of 1.5 μm to 2.5 μm is formed by a coating method. Here, the insulating layer 274 including openings 331-333 is formed by performing a light exposure step using a mask MK8 (not illustrated) (FIG. 27E). The opening 311 is an opening reaching the conductor layer 222, the opening 332 is an opening reaching the conductor layer 227, and the opening 333 is an opening reaching the conductor layer 225. The second-layer conductor layer and the fourth-layer conductor layer are electrically connected through these openings.

A conductive film is formed over the insulating layer 274. Here, a conductive film having a three-layer structure is formed. Titanium films with a thickness of 75 nm to 125 nm are used as the first layer and the third layer, and an aluminum film with a thickness of 350 nm to 450 nm is used as the second layer. The titanium film and the aluminum film can be formed by a sputtering method or the like. The conductive film having a three-layer structure is etched using a resist mask RM9 (not illustrated) to form the conductor layers 241-243 (FIG. 27E). The conductor layer 241 is included in the wiring SL and in contact with the conductor layer 222 in the opening 331. The conductor layer 242 includes a region functioning as the wiring PLa and is in contact with the conductor layer 227 in the opening 332. The conductor layer 243 includes a region functioning as an electrode for electrically connecting the pixel electrode (conductor layer 251) of the light-emitting element EL1 and the transistor M2 or the like. The conductor layer 243 is in contact with the conductor layer 225 in the opening 333.

(Light-Emitting Element EL1)

The insulating layer 275 is formed to cover the insulating layer 274 and the conductor layers 241-243. The insulating layer 275 can be formed in a similar manner to the insulating layer 274. A polyimide film with a thickness of 1.5 µm to 2.5 µm is formed by a coating method. The insulating layer 275 including an openings 341 is formed by performing a light exposure step using a mask MK10 (not illustrated) (FIG. 28A). A light-reflective conductive film capable of reflecting the light 180 is formed over the insulating layer 275. Here, a metal film with a three-layer structure is formed. A titanium film with a thickness of 30 nm to 70 nm is used as the first layer, an aluminum film with a thickness of 175 nm to 225 nm is used as the second layer, and a titanium film with a thickness of 5 nm to 10 nm is used as the third layer. The conductive film having a three-layer structure is etched using a resist mask RM10 (not illustrated) to form the conductor layer 251 (FIG. 28A). The conductor layer 251 functions as a pixel electrode and functions as the anode of the light-emitting element EL1 The conductor layer 251 is in contact with the conductor layer 243 in the opening 341.

The conductor layer 252 is formed to overlap with the conductor layer 251 (FIG. 28B). The conductor layer 251 is formed of a light-transmitting conductive film. The conductor layer 252 is provided in order that the light-emitting element EL1 has a microcavity structure. The thickness of the conductor layer 252 functioning as an adjustment layer for adjusting an optical path between the conductor layer 251 and the conductor layer 253 is adjusted in accordance with the wavelength (color) of light extracted from the pixel 21. For example, the thickness of the conductor layer 252 may be adjusted within the range of 5 nm to 100 nm. Here, the conductor layer 252 is formed using an indium tin oxide film containing silicon oxide (here, referred to as an "SiOx-containing ITO film" for convenience). Furthermore, as the wavelength of the light 180 is increased, the thickness of the conductor layer 252 is increased. Here, the thickness of the conductor layer 252 is adjusted by the number of stacked layers of the light-transmitting conductive film.

First, a first-layer SiOx-containing ITO film is formed and this SiOx-containing ITO film is etched using a resist mask RM11 (not illustrated) to form a first-layer light-transmitting conductor layer in the pixels (21_R, 21_G, 21_B). Thus, the conductor layer 252 of the pixel 21_B is completed. Next, a second-layer SiOx-containing ITO film is formed and this SiOx-containing ITO film is etched using a resist mask RM12 (not illustrated) to form a second-layer light-transmitting conductor layer of the pixel 21_R and the pixel 21_G. Through the step, the conductor layer 252 of the pixel 21_G is completed. Finally, a third-layer SiOx-containing ITO film is formed and this is etched using a resist mask RM13 (not illustrated) to form a third-layer light-transmitting conductor layer in the pixel 21_R. Through the step, the conductor layer 252 of the pixel 21_R is completed.

An insulating layer 276 is formed over the insulating layer 275. A polyimide film with a thickness of 0.8 µm to 1.2 µm is formed by a coating method. The insulating layer 276 including an openings 351 is formed by performing a light exposure step using a mask MK14 (not illustrated) (FIG. 28C, FIG. 25). A surface of the conductor layer 252 is exposed in the opening 351.

The insulating layer 277 functioning as a spacer is formed over the insulating layer 276 (FIG. 25, FIG. 28D). The insulating layer 277 can be formed in a similar manner to the insulating layer 276. Here, a polyimide film with a thickness of 1.5 µm to 2.2 µm is formed as the insulating layer 277 by performing a coating step and a light exposure step using a mask MK15 (not illustrated). As illustrated in FIG. 28D, the insulating layer 277 is formed as a band-like structure along the wiring SL so as to partly overlap with the conductor layer 251 (pixel electrode).

The EL layer 260 is formed over the entire pixel portion 121 to cover the insulating layer 277, the insulating layer 276, and the conductor layer 252. The EL layer 260 includes at least one or more light-emitting layers containing a light-emitting substance, and may have a structure in which a layer other than the light-emitting layer is stacked. As the layer other than the light-emitting layer, for example, a layer containing a substance having a high hole-injection property, a substance having a high hole-transport property, a substance having a poor hole-transport property (a substance which blocks holes), a substance having a high electron-transport property, a substance having a high electron-injection property, and a substance having a bipolar property (a substance having a high electron-transport property and a high hole-transport property) can be given. Here, two or more light-emitting layers are provided in the EL layer 260 so that the light-emitting element EL1 emits the light 180 of white color.

The conductor layer 253 is formed over the entire pixel portion 121 to cover the EL layer 260. The conductor layer 253 functions as a common electrode of the pixel portion 121 and functions as the cathode of the light-emitting element EL1. A region where the conductor layers 251-253 and the EL layer 260 are stacked in the opening 351 of the insulating layer 276 functions as a light-emitting region (light-emitting element EL1). The conductor layer 253 is formed using a light-transmitting conductive film which transmits the light 180 (visible light). Alternatively, the conductor layer 253 can be formed as a semi-transmissive electrode (transflective electrode) having both a light-reflecting property and a light-transmitting property. In this case, the conductor layer 253 can be formed of a stacked-layer film of a thin metal film (preferably having a thickness of less than or equal to 20 nm, further preferably less than or equal to 10 nm) and the light-transmitting conductive film. As the metal thin film, a film with a single-layer structure or a stacked-layer structure using silver, magnesium, or an alloy containing these metal materials can be used.

Through the above steps, the element substrate 101 can be manufactured.

<<Manufacturing Method Example of Counter Substrate>>

An example of a method for manufacturing the counter substrate 171 is described with reference to FIG. 25 and FIG. 28. First, the light-blocking layer 280 functioning as a black matrix is formed over the substrate 170. Next, the color filter layers (281_R, 281_G, 281_B) are formed. As illustrated in FIG. 28E, the color filter layers (281_R, 281_G, 281_B) corresponding to RGB are formed into band-like shapes along the wiring SL (conductor layer 241).

Note that although here, the sizes of the pixel 21_R, the pixel 21_G, and the pixel 21_B ($H_{21}$, $V_{21}$) (FIG. 26B) are equal to each other, they may be different depending on the light-emission colors. For example, as for $V_{21}$, the pixel 21_R, the pixel 21_G, and the pixel 21_B can be equal in size; and as for $H_{21}$, the pixel 21_B can be the largest in length, and the pixel 21_G and the pixel 21_B can be equal in length.

<<Assembly of Display Panel>>

Through the above steps, the counter substrate 171 is completed. The element substrate 101 and the counter substrate 171 overlap with each other in a state where they face each other. In this state, a sealant is provided on the periphery thereof, so that the counter substrate 171 is fixed to the element substrate 101. Furthermore, necessary assembly steps such as attachment of an optical member to the counter substrate 171, attachment of a touch panel, and attachment of an FPC are performed to complete the display panel 100.

(Substrate)

As a substrate which can be used as the substrate 110 and the substrate 170, for example, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, or a base film can be given. As an example of a glass substrate, a barium borosilicate glass substrate, an aluminoborosilicate glass substrate, a soda lime glass substrate, or the like can be given. As an example of a flexible substrate, a flexible synthetic resin such as plastics typified by polyethylene terephthalate (PET), polyethylene naphthalate (PEN), and polyether sulfone (PES), or acrylic can be given. As an example of an attachment film, polypropylene, polyester, polyvinyl fluoride, polyvinyl chloride, or the like is given. As an example of a base film, polyester, polyamide, polyimide, aramid, epoxy, an inorganic vapor a deposition film, paper or the like is given. Note that in the example of FIG. 25, a substrate that transmits the light 180 (visible light) is used as the substrate 170.

The substrate 110 is not necessarily a supporting substrate (such as a glass substrate) used for manufacturing the element substrate 101. After the pixel 21 and the like are formed, a supporting substrate is separated, and a flexible substrate may be attached with an adhesive layer. Furthermore, similarly, the substrate 170 is not necessarily a supporting substrate (such as a glass substrate) used for manufacturing the color filter layers (281_R, 281_B, 281_G) and the like, and after formation of the overcoat layer 282, a supporting substrate is separated and a flexible substrate may be attached with an adhesive layer. Such a manufacturing method example is described later in Embodiment 5.

Embodiment 4

In this embodiment, some structure examples of transistors included in a semiconductor device are described.

<<Structure Example 1>>

Here, an example of a structure of an OS transistor is described. FIG. 29A and FIG. 29B illustrate top views (layout views) of transistors (TA1, TA2) having different device structures. FIG. 29C and FIG. 29D are cross-sectional views of the transistors (TA1, TA2). Cross-sectional views of the transistor TA1 along an x1-x2 line and a y1-y2 line, and cross-sectional views of the transistor TA2 along an x3-x4 line and a y3-y4 line are illustrated in FIG. 29C and FIG. 29D. That is, cross-sectional structures of the transistors (TA1, TA2) in the channel length direction are illustrated in FIG. 29C, and cross-sectional structures thereof in the channel width direction are illustrated in FIG. 29D.

As illustrated in FIG. 29C and FIG. 29D, the transistors (TA1, TA2) are integrated over the same insulating surface (a substrate 600) and these transistors can be formed in the same manufacturing process. Note that for clarity of the device structures, electrical connection with a wiring for supplying a signal or potential to a gate (G), a source (S), and a drain (D) of each transistor is omitted. Furthermore, in this structure example, the channel length of an OS transistor corresponds to the distance between a source electrode and a drain electrode. In addition, the channel width of the OS transistor corresponds to the width of the source electrode or the drain electrode in a region where an oxide semiconductor layer and a gate electrode overlap with each other. For example, as illustrated in FIG. 29A and FIG. 29B, the channel lengths of the transistors TA1 and TA2 are La1, and the channel widths are Wa1.

The transistor TA1 (FIG. 29A) and the transistor TA2 (FIG. 29B) are transistors including gates (G) and back gates (BG). The transistor TA1 and the transistor TA2 have a structure in which the back gate is connected to the gate. Note that it is possible not to provide BG in the transistor TA1 and the transistor TA2.

<Transistor TA1>

The transistor TA1 is formed over the substrate 600 and includes a gate electrode GE1, a source electrode SE1, a drain electrode DE1, a back gate electrode BGE1, and an oxide semiconductor layer OS1.

The layer OS1 overlaps with the electrode GE1 with an insulating layer 621 provided therebetween. The pair of electrodes (SE1, DE1) is formed in contact with the top surface and the side surfaces of the layer OS1. As illustrated in FIG. 29A, the layer OS1 includes a region overlapping with neither the electrode GE1 nor the pair of electrodes (SE1, DE1). In the layer OS1, the length in the channel length direction is longer than the channel length La1, and the length in the channel width direction is longer than the channel width Wa1.

An insulating layer 622 and an insulating layer 623 are formed to cover the layer OS1, the electrode GE1, the electrode SE1, and the electrode DE1. The electrode BGE1 is formed over the insulating layer 623. The electrode BGE1 is provided to overlap with the layer OS1 and the electrode GE1. Here, as an example, in the layout diagram, the electrode BGE1 is provided so as to have the same shape as the electrode GE1 and be located in the same position. The electrode BGE1 is in contact with the electrode GE1 through an opening CG1 which penetrates the insulating layers 621-623 and the insulating film. With this structure, the gate (G) and the back gate (BG) of the transistor TA1 are electrically connected to each other.

As illustrated in the cross-sectional view in the channel width direction of FIG. 29D, the transistor TA1 has a device structure in which a channel formation region (channel) is surrounded by the electrode GE1 and the electrode BGE1. Accordingly, the channel formation region of TA1 is influenced by an electric field formed by not only the electrode GE1 but also the electrode BGE1. Therefore, when the back gate electrode BGE1 is connected to the gate electrode GE1, the on-state current of the transistor TA1 can be increased. In addition, the field-effect mobility of the transistor TA1 can be improved. Furthermore, variation in electrical characteristics such as the threshold voltage of the transistor TA1 can be inhibited.

Moreover, the strength of the transistor TA1 can be improved by providing the back gate electrode BGE1. Against deformation of the substrate 600 like bending, the electrode BGE1 serves as a reinforcement member to prevent the transistor TA1 from being broken.

The layer OS1 including a channel formation region has a multilayer structure; here, a three-layer structure formed of three oxide semiconductor films (631, 632, 633) is employed as an example. The oxide semiconductor films forming the layer OS1 are preferably metal oxide films containing at least one common metal element, more preferably containing In. As metal oxide containing In which can be used for the semiconductor layer of the transistor, an In-Ga oxide film and an In-M-Zn oxide film (M is Al, Ga, Y, Zr, La, Ce, or Nd) are typical examples. Furthermore, a film obtained by adding another element or material to such a metal oxide film can be used.

The oxide semiconductor film 632 is a film which serves as a channel formation region of the transistor TA1. In addition, the oxide semiconductor film 633 serves as a channel formation region of the transistors TA2, which is described later. Accordingly, the atomic ratio of metal elements that are main components of the oxide semiconductor films 631-633 is preferably adjusted so that a channel is formed in the oxide semiconductor film 632 in the transistor TA1 and in the oxide semiconductor film 633 in the transistor TA2.

Since a channel is formed in the oxide semiconductor film 632 in the transistor TA1, the channel formation region is not in contact with the insulating layer 621 and the insulating layer 622. Furthermore, when the oxide semiconductor films 631-633 are metal oxide films containing at least one common metal element, interface scattering is unlikely to occur at the interface between the oxide semiconductor film 632 and the oxide semiconductor film 631 and the interface between the oxide semiconductor film 632 and the oxide semiconductor film 633. Thus, the field-effect mobility of the transistor TA1 can be thus higher than those of the transistor TA2, and in addition, the drain current in an on-state (on-state current) can be increased.

<Transistor TA2>

The transistor TA2 includes a gate electrode GE2, a source electrode SE2, a drain electrode DE2, a back gate electrode BGE2, and an oxide semiconductor layer OS2. The electrode BGE2 is in contact with the electrode GE2 through an opening GC2 penetrating the insulating layers 621-623. The transistor TA2 is a variation of the transistor TA1 and is different from the transistor TA1 in that the layer OS2 is a single-layer structure formed of the oxide semiconductor film 633, and other points are the same. Here, a channel length La2 and a channel width Wa2 of the transistor TA2 are set equal to the channel length La1 and the channel width Wa1 of the transistor TA1.

[Insulating Layer]

The insulating layer 621, the insulating layer 622, and the insulating layer 623 are films formed over the entire regions where the transistors (TA1, TA2) are formed. The insulating layers 621, 622, and 623 is formed of a single or plurality of films. The insulating layer 621 is a film serving as a gate insulating layer of the transistors (TA1, TA2). The insulating layer 622 and the insulating layer 623 are films serving as gate insulating layers of the transistors (TA1, TA2) on the backchannel side. Furthermore, the insulating layer 623, which is the uppermost film, is preferably formed using a material that can function as a protective film of the transistor formed over the substrate 600. The insulating layer 623 may be provided as appropriate. In order to insulate the electrode BGE1 in the third layer from the electrodes (SE1, DE1) in the second layer, at least one insulating film is formed therebetween.

[Oxide Semiconductor Film]

Here, oxide semiconductor films forming semiconductor layers of the transistors (TA1, TA2) are described. In the case where the semiconductor layer is multilayer like the layer OS1, the oxide semiconductor films forming them are preferably metal oxide films containing at least one common metal element, preferably containing In.

For example, when the oxide semiconductor film 631 is an In—Ga oxide film, the atomic proportion of In is set smaller than the atomic proportion of Ga. In the case of an In-M-Zn oxide film, the atomic proportion of In is set smaller than the atomic proportion of M. In this case, the atomic proportion of Zn can be the largest.

For example, when the oxide semiconductor film 632 is an In-Ga oxide film, the atomic proportion of In is set larger than the atomic proportion of Ga. In the case of an In-M-Zn oxide film (M is Al, Ga, Y, Zr, La, Ce, or Nd), the atomic proportion of In is set larger than the atomic proportion of M. In the case of an In-M-Zn oxide film, the atomic proportion of In is preferably set larger than the atomic proportions of M and Zn.

For example, when the oxide semiconductor film 633 is an In-Ga oxide film, the atomic proportion of In is set equal to or smaller than the atomic proportion of Ga. In the case of an In-M-Zn film, the atomic proportion of In is set equal to the atomic proportion of M. In this case, the atomic proportion of Zn can be larger than those of In and M. Here, the oxide semiconductor film 633 is also a film serving as the channel formation region of the transistor TA2 described later.

When deposition is performed by a sputtering method, the atomic proportions of the oxide semiconductor films 631-633 can be adjusted by adjusting the atomic ratio or the like of the target compositions. When deposition is performed by a CVD method, it is possible by adjusting the flow rates of source gases or the like. A target used for deposition is described below using, as an example, a case where In-M-Zn oxide films are formed by a sputtering method as the oxide semiconductor films 631-633.

When the atomic ratio of metal elements of a target for the oxide semiconductor film 631 is In:M:Zn=$x_1$:$y_1$:$z_1$, $x_1$/y1 is preferably greater than or equal to 1/6 and less than 1. Furthermore, $z_1$/y1 is preferably greater than or equal to 1/3 and less than or equal to 6, further preferably greater than or equal to 1 and less than or equal to 6.

Typical examples of the atomic ratio of the metal elements of the target include In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

When the atomic ratio of metal elements of a target for the oxide semiconductor film 632 is In:M:Zn=x2:y2:z2, x2/y2 is preferably greater than 1 and less than or equal to 6; z2/y2 is preferably greater than 1 and less than or equal to 6. Typical examples of the atomic ratio of the metal elements in the target include In:M:Zn=2:1:1.5, In:M:Zn=2:1:2.3, In:M:Zn=2:1:3, In:M:Zn=3:1:2, In:M:Zn=3:1:3, and In:M:Zn=3:1:4.

When the atomic ratio of metal elements of a target for the oxide semiconductor film 633 is In:M:Zn=x3:y3:z3, x3/y3 is preferably greater than or equal to 1/6 and less than or equal to 1; Furthermore, z3/y3 is greater than or equal to 1/3 and less than or equal to 6, more preferably greater than or equal to 1 and less than or equal to 6. Typical examples of the atomic ratio of the metal elements in the target include In:M:Zn=1:1:1, In:M:Zn=1:1:1.2, In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

When the atomic ratio of metal elements of a deposition target for an In-M-Zn oxide film is In:M:Zn=x:y:z, $1 \leq z/y \leq 6$ is preferably satisfied because a CAAC-OS film is easily formed as an In-M-Zn oxide film. Note that the CAAC-OS film is described later.

An oxide semiconductor film with low carrier density is used as the oxide semiconductor films 631-633. For example, as the oxide semiconductor films 631-633, an oxide semiconductor film whose carrier density is $1 \times 10^{17}/cm^3$ or lower, preferably $1 \times 10^{15}/cm^3$ or lower, further preferably $1 \times 10^{13}/cm^3$ or lower, still further preferably $1 \times 10^{11}/cm^3$ or lower is used.

As the oxide semiconductor films 631-633, oxide semiconductor films each having a low impurity concentration and a low density of defect states are used, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability. As the impurities, hydrogen, nitrogen, alkali metal, alkaline earth metal, and the like are given.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor which contains hydrogen is likely to be normally on.

Accordingly, it is preferable that hydrogen be reduced as much as possible as well as the oxygen vacancies in the oxide semiconductor films 631-633. Specifically, in the oxide semiconductor films 631-633, the concentration of hydrogen which is obtained by secondary ion mass spectrometry (SIMS) is set to lower than or equal to $5 \times 10^{19}$ atoms/cm³, further preferably lower than or equal to $1 \times 10^{19}$ atoms/cm³, lower than $5 \times 10^{18}$ atoms/cm³, preferably lower than or equal to $1 \times 10^{18}$ atoms/cm³, further preferably $5 \times 10^{17}$ atoms/cm³, still further preferably lower than or equal to $1 \times 10^{16}$ atoms/cm³.

When the oxide semiconductor films 631-633 contain silicon or carbon, which is an element belonging to Group 14, oxygen vacancies in the films are increased, so that these films becomes an n-type. Thus, the concentration of silicon or carbon (the concentration is measured by secondary ion mass spectrometry) in the oxide semiconductor films 631-633 is lower than or equal to $2 \times 10^{18}$ atoms/cm³, preferably lower than or equal to $2 \times 10^{17}$ atoms/cm³.

Furthermore, the concentration of alkali metals or alkaline earth metals in the oxide semiconductor films 631-633, which is measured by secondary ion mass spectrometry, is lower than or equal to $1 \times 10^{18}$ atoms/cm³, preferably lower than or equal to $2 \times 10^{16}$ atoms/cm³. Alkali metal and alkaline earth metal might generate carriers when bonded to an oxide semiconductor, which may increase the off-state current of the transistor. Thus, it is preferable to reduce the concentration of alkali metal or alkaline earth metal of the oxide semiconductor films 631-633.

When containing nitrogen, the oxide semiconductor films 631-633 each easily have an n-type region by generation of electrons serving as carriers and an increase of carrier density. Thus, a transistor including an oxide semiconductor which contains nitrogen is likely to be normally on, and therefore, the content of nitrogen in the oxide semiconductor films 631-633 is preferably reduced as much as possible; for example, the nitrogen concentration which is obtained by secondary ion mass spectrometry is preferably, for example, lower than or equal to $5 \times 10^{18}$ atoms/cm³.

Without limitation to the oxide semiconductor films 631-633 described above, other oxide semiconductor films with appropriate compositions may be used depending on required semiconductor characteristics and electrical characteristics (e.g., field-effect mobility and threshold voltage) of transistors. In addition, to obtain the required semiconductor characteristics and electrical characteristics of the transistor, it is preferable that the carrier density, the impurity concentration, the defect density, the atomic ratio between a metal element and oxygen, the interatomic distance, the density, and the like of the oxide semiconductor films 631-633 be set to appropriate values.

The field-effect mobility of the transistor TA1 can be increased because a channel is formed in the oxide semiconductor film 632 in which the atomic proportion of In is larger than the atomic proportion of Ga or M (M is Al, Ga, Y, Zr, La, Ce, or Nd). Typically, the field-effect mobility is higher than 10 cm²/Vs and lower than 60 cm²/Vs, preferably higher than or equal to 15 cm²/Vs and lower than 50 cm²/Vs. The transistor TA1 is thus preferably used in a driver circuit which needs to operate at high speed in an active matrix display device.

The field-effect mobility of the transistor TA2 in which a channel formation region is formed in the oxide semiconductor film 633 is approximately 3 cm²/Vs or higher and 10 cm²/Vs or lower, which is lower than that of the transistor TA1. Because the transistor TA2 does not include the oxide semiconductor film 632, it is less degraded by light than the transistor TA1 and thus the amount of off-state current increased by light irradiation is small. For this reason, the transistor TA2 in which a channel formation region is formed using the oxide semiconductor film 633 is preferably used for a pixel portion, which is irradiated with light. The transistors which has such a field-effect mobility of approximately 10 cm²/Vs or lower can have a channel length of 2.5 μm or more.

The amount of current in an off state is likely to increase in the transistor TA1 as compared to the transistor TA2 not including the oxide semiconductor film 632. This is a reason why the transistor TA1 is suitable for a peripheral circuit of a pixel portion (e.g., a driver circuit), which is less influenced by light than a pixel portion, which cannot be sufficiently shielded from light. Furthermore, needless to say, a transistor like the transistor TA2 can be provided in a circuit outside the pixel portion, such as a driver circuit.

Without limitation to the transistors (TA1, TA2) which are described above, the structure of the transistor can be changed depending on the required semiconductor characteristics and electrical characteristics of the transistor. For example, the presence or absence of a back gate electrode, a stacked-layer structure of an oxide semiconductor layer, the shapes and positions of an oxide semiconductor layer, a gate electrode, and source and drain electrodes, and the like can be appropriately changed.

<<Structure Example 2 of Transistor>>

Figure 30A:
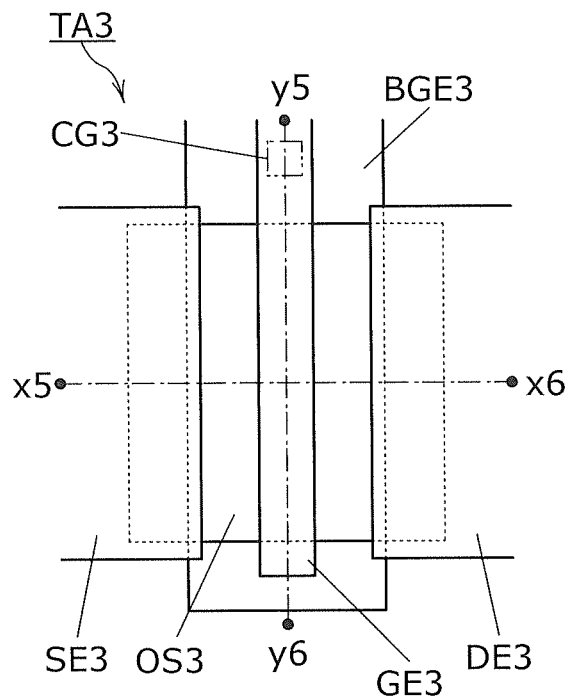
FIGS. 30A and 30B show plan views illustrating examples of a structure of a transistor.
Figure 30B:
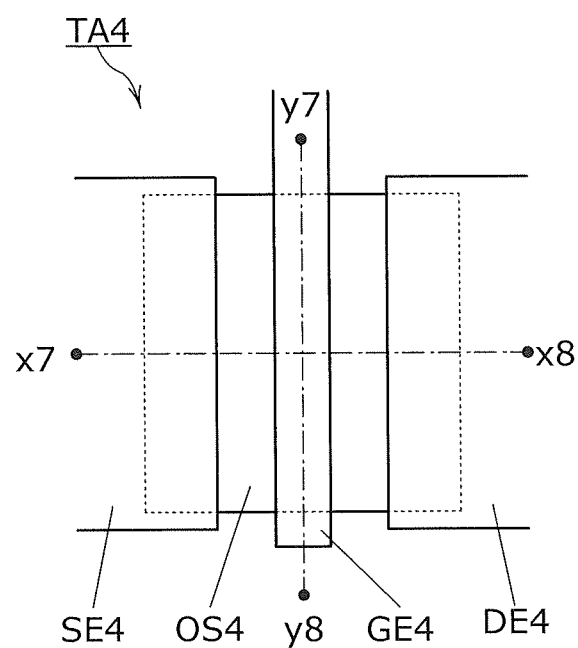
Figure 31A:
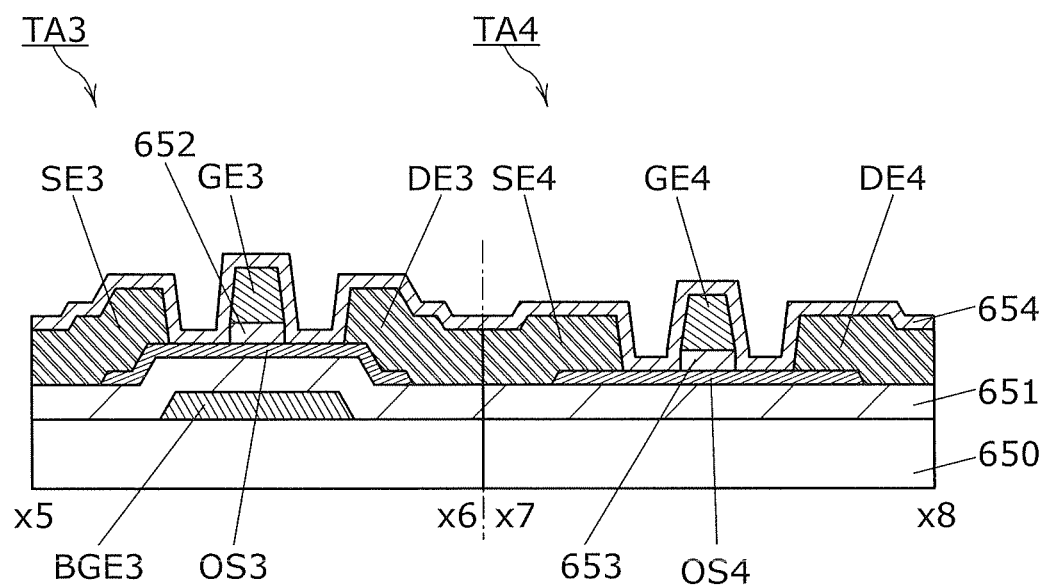
FIGS. 31A and 31B show cross-sectional views illustrating examples of a structure of a transistor.
Figure 31B:
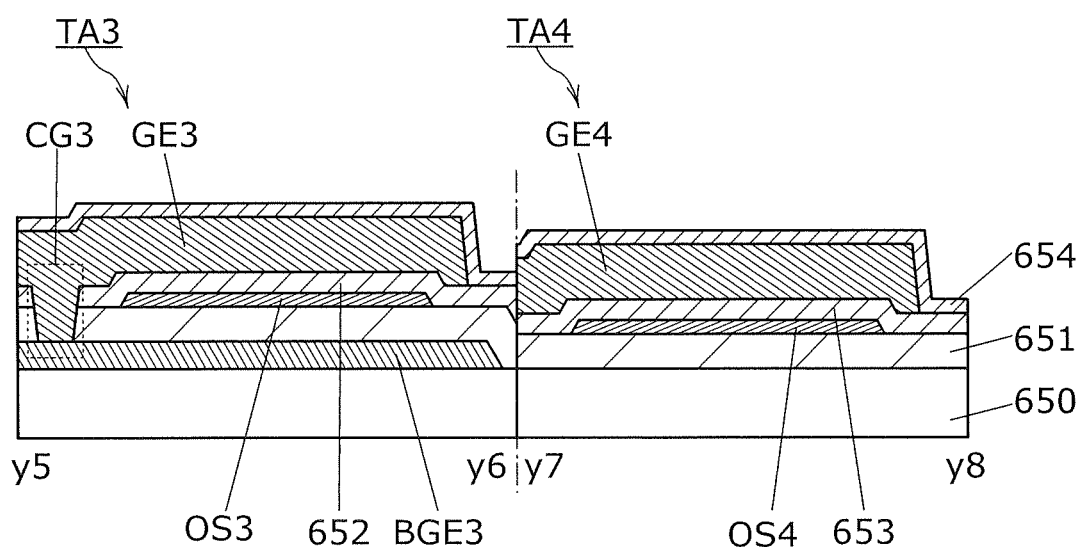

FIG. 30 and FIG. 31 illustrate examples of a top-gate OS transistor. FIG. 30A and FIG. 30B illustrate top views (layout views) of transistors (TA3, TA4) having different device structures. FIG. 31 is cross-sectional views of the transistors (TA3, TA4). Cross-sectional views of the transistor TA3 along an x5-x6 line and a y5-y6 line, and cross-sectional views of the transistor TA4 along an x7-x8 line and a y7-y8 line are illustrated in FIGS. 31A and 31B. Cross-sectional structures of the transistors (TA3, TA4) in the channel length direction are illustrated in FIG. 31A, and cross-sectional structures thereof in the channel width direction are illustrated in FIG. 31B.

The transistors TA3 and TA4 are formed over a substrate 650. The transistor TA3 includes a back gate electrode BGE3, an oxide semiconductor layer OS3 over an insulating layer 651, a source electrode SE3, a drain electrode DE3, an insulating layer 652, and a gate electrode GE3. The transistor TA4 includes an oxide semiconductor layer OS4, a source electrode SE4, a drain electrode DE4, an insulating layer 653, and a gate electrode GE4. Note that the transistors TA3 and TA4 are covered with an insulating layer 654. The insulating layer 653 and the insulating layer 652 function as gate insulating films. The oxide semiconductor layer OS3 and the oxide semiconductor layer OS4 are formed using a single-layer oxide semiconductor film or a stacked layer of oxide semiconductor films.

The gate electrode GE3 is in contact with the back gate electrode BGE3 in an opening CG3. The gate electrode GE3 and the back gate electrode BGE3 are not connected to each other and different potentials are applied thereto, whereby the threshold voltage of the transistor TA3 can be controlled. Alternatively, as illustrated in FIG. 31B, the gate electrode GE3 and the back gate electrode BGE3 are connected to each other and the same potential is applied thereto, whereby it is possible to increase the on-state current, reduce initial-characteristic variation, inhibit degradation in a -GBT stress test, and inhibit change in rising voltage of the on-state current at different drain voltages.

In the transistor TA4 and the transistor TA3, the gate electrode GE4, and the source electrode SE4 and the drain electrode DE4 do not overlap with each other, whereby parasitic capacitance between the gate electrode GE4, and the source electrode SE4 and the drain electrode DE4 can be reduced. In addition, the gate electrode GE3, and the source electrode SE3 and the drain electrode DE3 do not overlap with each other, whereby parasitic capacitance between the gate electrode GE3, and the source electrode SE3 and the drain electrode DE3 can be reduced. As a result, in the case where a large-sized substrate is used as the substrate 650, signal delay in the source electrode SE4, the drain electrode DE4, and the gate electrode GE4, and the source electrode SE3, the drain electrode DE3, and the gate electrode GE3 can be reduced.

In the transistor TA3, an impurity element is added to the oxide semiconductor layer OS3 using the source electrode SE3, the drain electrode DE3, and the gate electrode GE3 as masks, whereby a region including oxygen vacancies is formed. In the transistor TA4, a rare gas element is added to the oxide semiconductor layer OS4 using the source electrode SE4, the drain electrode DE4, and the gate electrode GE4 as masks, whereby a region including oxygen vacancies is formed. In the case where the insulating layer 654 is formed using an insulating film containing hydrogen, since the region including oxygen vacancies is in contact with the insulating layer 654 containing hydrogen in the transistors TA3 and TA4, hydrogen contained in the insulating layer 654 is diffused to the region including oxygen vacancies to form a low-resistance region. That is, the low-resistance region can be formed in a self-aligned manner.

<Oxide Semiconductor Film>

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes an amorphous oxide semiconductor film, a microcrystalline oxide semiconductor film, a polycrystalline oxide semiconductor film, a CAAC-OS (C Axis Aligned Crystalline Oxide Semiconductor) film, and the like. An oxide semiconductor layer of an OS transistor may be a stacked-layer film including two or more kinds of an amorphous oxide semiconductor film, a microcrystalline oxide semiconductor film, and a CAAC-OS film, for example.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The CAAC-OS film has a feature of a density of defect states lower than that of the microcrystalline oxide semiconductor film. The CAAC-OS film is described in detail below.

Observation of the CAAC-OS film with a transmission electron microscope (TEM) shows that a boundary between crystal parts, that is, a grain boundary is not clearly observed. Thus, in the CAAC-OS film, a reduction in electron mobility due to the grain boundary is less likely to occur.

In the TEM observation of the CAAC-OS film in a direction substantially parallel to a sample surface (cross-sectional TEM observation), metal atoms are arranged in a layered manner in the crystal parts. Each metal atom layer has a morphology which reflects unevenness of a surface over which the CAAC-OS film is formed (also referred to as a formation surface) or a top surface of the CAAC-OS film, and is arranged parallel to the formation surface or the top surface of the CAAC-OS film.

On the other hand, in the TEM observation of the CAAC-OS film in a direction substantially perpendicular to the sample surface (plan-view TEM observation), metal atoms are arranged in a triangular or hexagonal configuration in the crystal parts. However, there is no regularity of arrangement of metal atoms between different crystal parts.

From the cross-sectional TEM observation and the plan-view TEM observation, alignment is found in the crystal parts in the CAAC-OS film.

When a CAAC-OS film is subjected to structural analysis with an X-ray diffraction (XRD) apparatus, for example, in an analysis of the CAAC-OS film including an $InGaZnO_4$ crystal by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. When analysis (φ scan) is performed under conditions where the sample is rotated around a normal vector of a sample surface as an axis (φ axis) with 2θ fixed at around 56°, in the case of a single-crystal oxide semiconductor film of $InGaZnO_4$, six peaks derived from crystal planes equivalent to the (110) plane are observed. On the other hand, in the case of a CAAC-OS film, a peak is not clearly observed even when O scan is performed with 2θ fixed at around 56°.

According to the above results, in the CAAC-OS film, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM observation corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where the shape of the CAAC-OS film is changed by etching or the like, the c-axis of the crystal might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

In a transistor using the CAAC-OS film, variation in electrical characteristics due to irradiation with visible light or ultraviolet light is small. Thus, the transistor has high reliability.

<<Structure Example 3 of Transistor>>

A transistor used in the semiconductor device of one embodiment of the present invention may include a channel formation region in a semiconductor film or a semiconductor substrate of silicon, germanium, or the like that is amorphous, microcrystalline, polycrystalline, or single crystal. The transistor can also be formed using a thin silicon film. Here, a structure example of a transistor in which a semiconductor layer including a channel formation region is formed using a silicon film. As the silicon film, amorphous silicon formed by a sputtering method or a vapor phase growth method such as a plasma CVD, polycrystalline silicon obtained by crystallization of amorphous silicon by treatment such as laser annealing, or single crystal silicon obtained by separation of a surface portion by implantation of hydrogen ions or the like into a single crystal silicon wafer.

Figure 32:
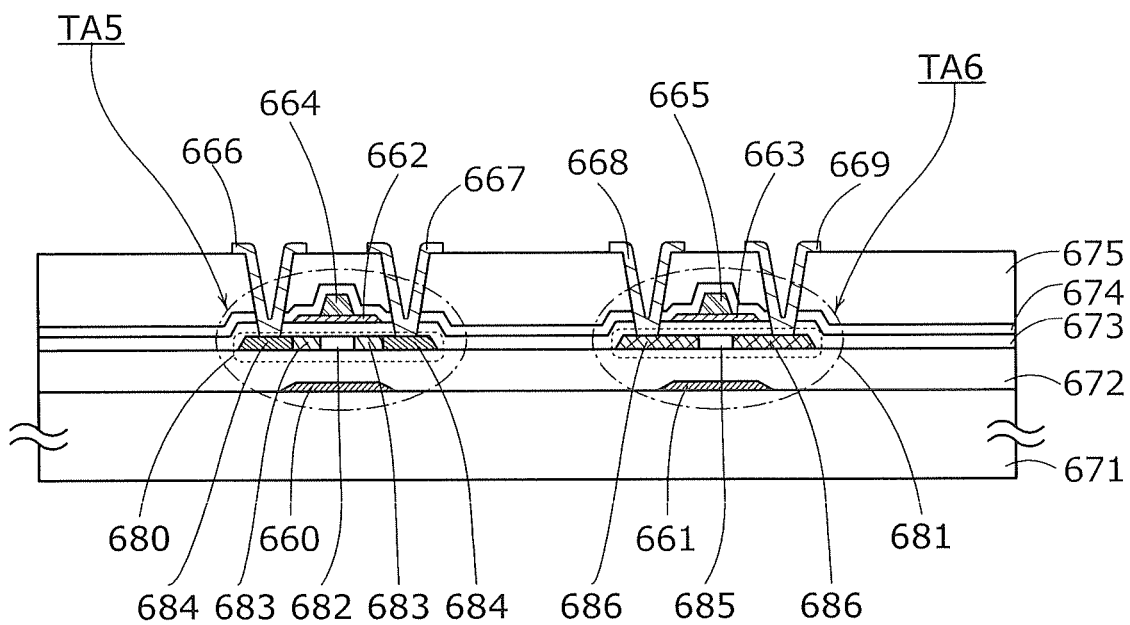
FIG. 32 shows a cross-sectional view illustrating an example of a structure of a transistor.

FIG. 32 illustrates an example of structures of top-gate transistors (TA5, TA6). The transistor TA5 is an n-channel transistor, and the transistor TA6 is a p-channel transistor. The transistors TA5 and TA6 are formed over a substrate 671 having an insulating surface.

The transistor TA5 includes a conductor layer 660, a conductor layer 662, a conductor layer 664, a conductor layer 666, a conductor layer 667, the substrate 671, an insulating layer 672, an insulating layer 673, an insulating layer 674, and a semiconductor layer 680. The transistor TA6 includes a conductor layer 661, a conductor layer 663, a conductor layer 665, a conductor layer 668, a conductor layer 669, the substrate 671, the insulating layer 672, the insulating layer 673, the insulating layer 674, and a semiconductor layer 681.

The insulating layer 672 includes regions functioning as insulating layers of the transistor TA5 and the transistor TA6. The semiconductor layer 680 includes a channel formation region 682, a pair of LDD (Light Doped Drain) regions 683, and a pair of impurity regions 684. The channel formation region 682 is a region which overlaps with the conductor layer 664 of the semiconductor layer 680. The pair of impurity regions 684 function as a source region and a drain region. An impurity element imparting n-type conductivity to the semiconductor layer 680, such as boron (B), aluminum (Al), or gallium (Ga), is added to the LDD regions 683 and the impurity regions 684. The semiconductor layer 681 includes a channel formation region 685 and a pair of impurity regions 686. The channel formation region 685 is a region which overlaps with the conductor layer 665 of the semiconductor layer 681. The pair of impurity regions 686 function as a source region and a drain region. An impurity element imparting p-type conductivity to the semiconductor layer 681, such as phosphorus (P) or arsenic (As), is added to the impurity regions 686.

The semiconductor layer 680 or the semiconductor layer 681 may be crystallized by a variety of techniques. As a crystallization method, for example, a laser crystallization method using a laser beam or a crystallization method using a catalytic element can be given. Alternatively, a crystallization method using a catalytic element and a laser crystallization method may be combined. When a heat-resistant substrate such as quartz is used as the substrate 671, it is possible to use a combination of a thermal crystallization method which uses an electrically-heated furnace, a lump anneal crystallization method which uses infrared light, a crystallization method which uses a catalytic element, and high-temperature annealing at approximately 950° C.

The conductor layer 660 and the conductor layer 661 are first-layer conductor layers. The conductor layer 660 includes a region functioning as a back gate electrode of the transistor TA5, and the conductor layer 661 includes a region functioning as a back gate electrode of the transistor TA6. The conductor layer 662 and the conductor layer 663 are second-layer conductor layers, and the conductor layer 664 and the conductor layer 665 are third-layer conductor layers. The conductor layer 664 has a smaller width in the channel length direction than the conductor layer 662, and the conductor layer 665 has a smaller width in the channel length direction than the conductor layer 663. In the conductor layer 662 and the conductor layer 664, a region which overlaps the semiconductor layer 680 with the insulating layer 672 positioned therebetween functions as a gate electrode of the transistor TA5.

The conductor layers 666-669 are fourth-layer conductor layers. The conductor layer 666 and the conductor layer 668 include regions functioning as a source electrode and a drain electrode of the transistor TA5 and are in contact with the semiconductor layer 680 in openings provided in the insulating layer 673 and the insulating layer 674. The conductor layer 668 and the conductor layer 669 include regions functioning as a source electrode and a drain electrode of the transistor TA6 and are in contact with the semiconductor layer 681 in openings provided in the insulating layer 673 and the insulating layer 674.

For example, the conductor layer 662 and the conductor layer 663 are formed integrally, the conductor layer 664 and the conductor layer 665 are formed integrally, and the conductor layer 667 and the conductor layer 668 are formed integrally, whereby a CMOS inverter can be formed.

Embodiment 5

As described in Embodiment 3, after part or the whole of a semiconductor device is completed, the semiconductor device can be separated from a substrate used for manufacture and transferred to another substrate. When such a manufacturing method is used, a transistor can be transferred to a substrate having low heat resistance or a flexible substrate.

Examples of a transfer substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, a transistor with excellent properties or a transistor with low power consumption can be formed, a device with high durability, high heat resistance can be provided, or reduction in weight or thickness can be achieved.

The substrate for transfer can be a substrate which can be deformed in use of the semiconductor device, such as a flexible substrate. Alternatively, the substrate for transfer may be a substrate which is not deformed in use; in this case, it is not limited to over a flat plate and may be a substrate having a curved portion.

Such a method for manufacturing a semiconductor device is described below with reference to drawings. Here, an example in which the display panel 400 is manufactured as a semiconductor device is described.

<<Manufacturing Method Example 1>>

An example of a method for manufacturing the display panel 400 is described with reference to FIG. 33 and FIG. 34.

Figure 33A:
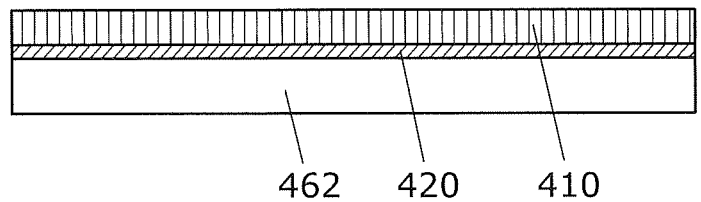
FIGS. 33A to 33D show cross-sectional views illustrating an example of a method for manufacturing a display panel.

An insulating layer 420 is formed over a substrate 462, and an element layer 410 is formed over the insulating layer 420 (FIG. 33A). A semiconductor element such as a transistor is formed in the element layer 410. Alternatively, a display element or part of the display element such as a pixel electrode may also be formed in the element layer 410 in addition to the semiconductor element. Here, a pixel portion, a peripheral circuit, and a terminal portion are formed in the element layer 410.

It is necessary that the substrate 462 have at least heat resistance high enough to withstand heat treatment performed later. For example, a glass substrate, a ceramic substrate, a quartz substrate, a sapphire substrate, or the like may be used as the substrate 462.

In the case where a glass substrate is used as the substrate 462, an insulating film such as a silicon oxide film, a silicon oxynitride film, a silicon nitride film, or a silicon nitride oxide film is preferably formed between the substrate 462 and the insulating layer 420, in which case contamination from the glass substrate can be prevented.

For the insulating layer 420, an organic resin film of an epoxy resin, an aramid resin, an acrylic resin, a polyimide resin, a polyamide resin, a polyamide-imide resin, or the like can be used, for example. It is particularly preferable to use a polyimide resin, which has high heat resistance. For example, in the case where a polyimide resin is used for the insulating layer 420, the thickness of the polyimide resin is greater than or equal to 3 nm and less than or equal to 20 μm, preferably greater than or equal to 500 nm and less than or equal to 2 μm. In the case where a polyimide resin is used for the insulating layer 420, it can be formed by a spin coating method, a dip coating method, a doctor blade method, or the like. In the case where a polyimide resin is used for the insulating layer 420, for example, the insulating layer 420 with a desired thickness can be obtained by removing part of a film containing the polyimide resin by a doctor blade method.

Note that a temperature during the process of manufacturing the element layer 410 is preferably higher than or equal to room temperature and lower than or equal to 300° C. For example, the deposition temperature of an insulating film or a conductive film which is formed in the element layer 410 using an inorganic material is higher than or equal to 150° C. and lower than or equal to 300° C., preferably higher than or equal to 200° C. and lower than or equal to 270° C. Furthermore, an insulating film or the like formed in the element layer 410 using an organic resin material is preferably formed at a temperature higher than or equal to room temperature and lower than or equal to 100° C.

In the case where an OS transistor is employed as the transistor included in the element layer 410, the CAAC-OS film described above is preferably used as an oxide semiconductor film thereof. In the case where the CAAC-OS film is used, for example, when the display panel 400 is bent, a crack or the like is less likely to be generated in a channel formation region, resulting in higher resistance against bending. Indium tin oxide to which silicon oxide is added is preferably used for the conductive film included in the element layer 410 because a crack or the like is less likely to be generated in the conductive film when the display panel 400 is bent.

Figure 33B:
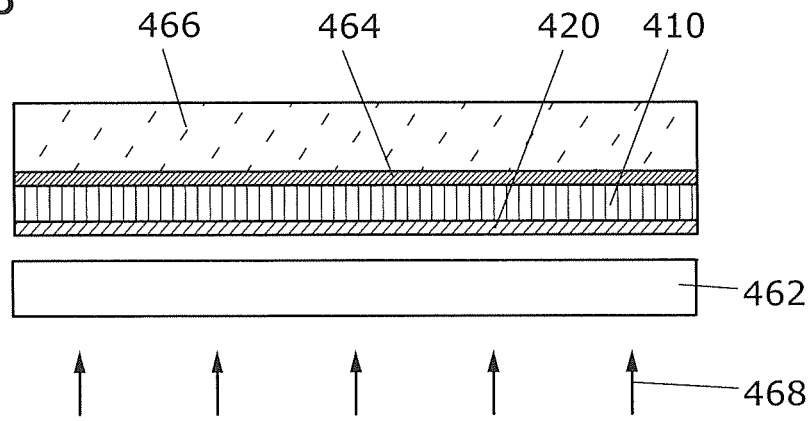

The element layer 410 and a temporary supporting substrate 466 are attached with an adhesive 464 for separation, and then the insulating layer 420 and the element layer 410 are separated from the substrate 462. Thus, the insulating layer 420 and the element layer 410 are provided on the temporary supporting substrate 466 side (FIG. 33B). As the temporary supporting substrate 466, a glass substrate, a quartz substrate, a sapphire substrate, a ceramic substrate, a metal substrate, or the like can be used. Alternatively, a plastic substrate that can withstand a processing temperature of this embodiment may be used, or a flexible film-like substrate may be used. An adhesive with which the temporary supporting substrate 466 and the element layer 410 can be chemically or physically separated when necessary, such as an adhesive that is soluble in water or a solvent or an adhesive which is capable of being plasticized upon irradiation of UV light or the like, is used as the adhesive 464 for separation.

Various methods can be used as appropriate as the process of transfer to the temporary supporting substrate 466. For example, the substrate 462 and the insulating layer 420 can be separated from each other in such a manner that the insulating layer 420 is irradiated with laser light 468 from a side of the substrate 462 where the insulating layer 420 is not formed, i.e., from the bottom side in FIG. 33B to make the insulating film 420 weak. Furthermore, a region where adhesion between the substrate 462 and the insulating layer 420 is low and a region where adhesion between the substrate 462 and the insulating layer 420 is high may be formed by adjustment of the irradiation energy density of the laser light 468, and then separation may be performed.

Although the method in which separation is caused at the interface between the substrate 462 and the insulating layer 420 is described, the separation method is not limited thereto. For example, separation may be caused at the interface between the insulating layer 420 and the element layer 410. Alternatively, the insulating layer 420 may be separated from the substrate 462 by filling the interface between the substrate 462 and the insulating layer 420 with a liquid. Alternatively, the element layer 410 may be separated from the insulating layer 420 by filling the interface between the insulating layer 420 and the element layer 410 with a liquid. As the liquid, water, a polar solvent, or the like can be used, for example. The interface along which the insulating layer 420 is separated, specifically, the interface between the substrate 462 and the insulating layer 420 or the interface between the insulating layer 420 and the element layer 410 is filled with a liquid, whereby an influence of static electricity and the like generated owing to the separation on the element layer 410 can be reduced.

Figure 33C:
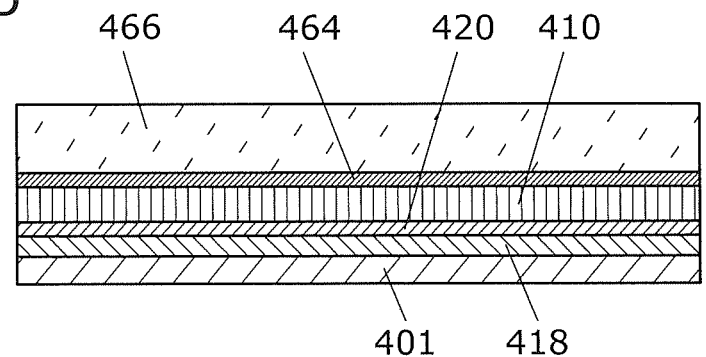
Figure 33D:
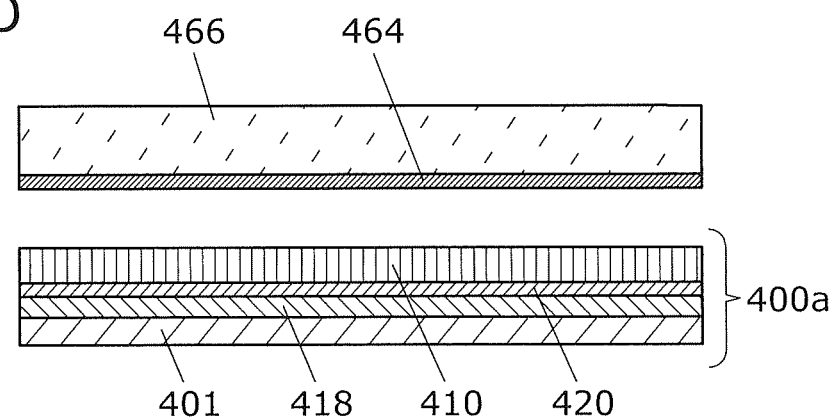

Next, a substrate 401 is attached to the insulating layer 420 using an adhesive layer 418 (FIG. 33C). Then, the adhesive 464 for separation and the temporary supporting substrate 466 are detached from the element layer 410 by dissolving or plasticizing the adhesive 464 for separation (see FIG. 33D). The adhesive 464 for separation is preferably removed by water, a solvent, or the like to expose the surface of the element layer 410. In this manner, an element substrate 400a including the element layer 410 can be manufactured over the substrate 401.

Figure 34A:
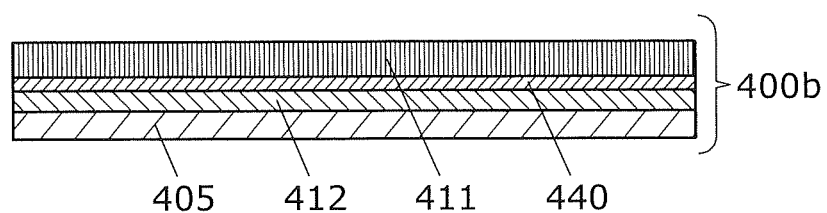
FIGS. 34A and 34B show cross-sectional views illustrating an example of a method for manufacturing a display panel.

An adhesive layer 412, an insulating layer 440 over the adhesive layer 412, and an element layer 411 are formed over a substrate 405 by a process similar to that illustrated in FIG. 33 (FIG. 34A). The insulating layer 440 included in the element layer 411 can be formed using a material similar to that of the insulating layer 420, here, using an organic resin film. For example, a color filter layer and a light-blocking layer may be provided as the element layer 411. Through the steps, an element substrate (counter substrate) 400b can be manufactured.

Figure 34B:
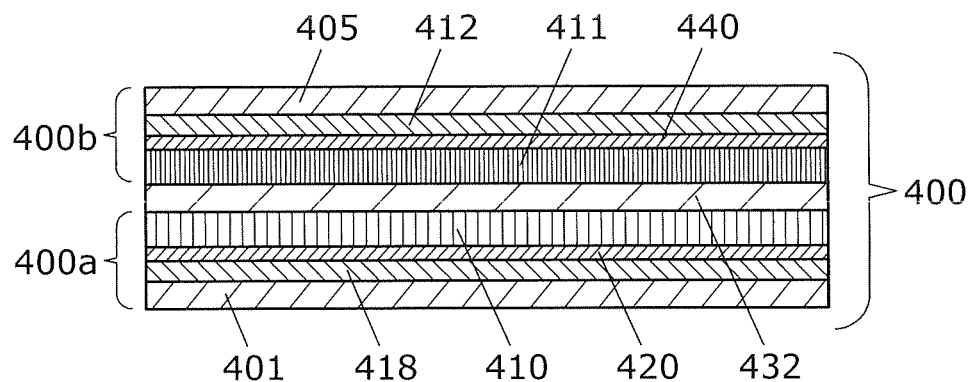

Next, a sealing layer 432 fills between the element layer 410 and the element layer 411, so that the element layer 410 and the element layer 411 are attached to each other (FIG. 34B). With the sealing layer 432, for example, solid sealing is possible. Note that the sealing layer 432 is preferably flexible. For example, for the sealing layer 432, a glass material such as a glass frit; or a resin material such as a resin that is curable at room temperature, for example, a two-component-mixture-type resin, a light curable resin, or a thermosetting resin can be used. In this manner, the display panel 400 including the element substrate 400a and the element substrate (counter substrate) 400b can be manufactured.

<<Manufacturing Method Example 2>>

Another method for manufacturing the display panel 400 of one embodiment of the present invention is described with reference to FIG. 35. Note that a structure in which inorganic insulating films are used as the insulating layer 420 and the insulating layer 440 is described in FIG. 35.

Figure 35A:
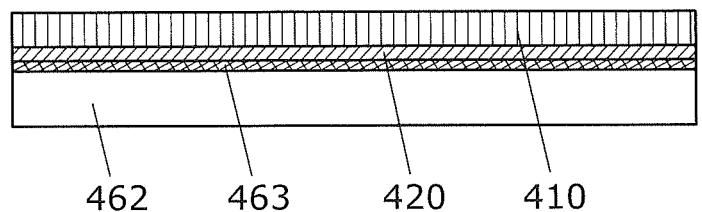
FIGS. 35A to 35D show cross-sectional views illustrating an example of a method for manufacturing a display panel.

First, a separation layer 463 is formed over the substrate 462. Then, the insulating layer 420 is formed over the separation layer 463, and the element layer 410 is formed over the insulating layer 420 (FIG. 35A).

The separation layer 463 contains, for example, an element selected from tungsten, molybdenum, titanium, tantalum, niobium, nickel, cobalt, zirconium, zinc, ruthenium, rhodium, palladium, osmium, iridium, and silicon; an alloy material containing the element; or a compound material containing the element, and can employ a single-layer or a stacked-layer structure. In the case of a layer containing silicon, a crystal structure of the layer containing silicon may be amorphous, microcrystal, polycrystal, or single crystal. The separation layer 463 can be formed by a sputtering method, a PECVD method, a coating method, a printing method, or the like. Note that a coating method includes a spin coating method, a droplet discharge method, and a dispensing method.

In the case where the separation layer 463 has a single-layer structure, a layer containing tungsten, molybdenum, or a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. It is to be noted that a mixture of tungsten and molybdenum corresponds to an alloy of tungsten and molybdenum, for example.

Furthermore, when the separation layer 463 has a stacked-layer structure including a layer containing tungsten and a layer containing an oxide of tungsten, it may be utilized that the layer containing tungsten is formed and an insulating layer formed of oxide is formed thereover so that a layer containing an oxide of tungsten is formed at the interface between the tungsten layer and the insulating layer. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Furthermore, plasma treatment or heat treatment may be performed in an atmosphere of oxygen, nitrogen, or nitrous oxide alone, or a mixed gas of any of these gasses and another gas. Surface condition of the separation layer 463 is changed by the plasma treatment or heat treatment, whereby adhesion between the separation layer 463 and the insulating layer 420 formed later can be controlled.

As the insulating layer 420, an inorganic insulating film with low moisture permeability, such as a silicon oxide film, a silicon nitride film, a silicon oxynitride film, a silicon nitride oxide film, or an aluminum oxide film can be used. The inorganic insulating film can be formed by a sputtering method or a PECVD method, for example.

Figure 35B:
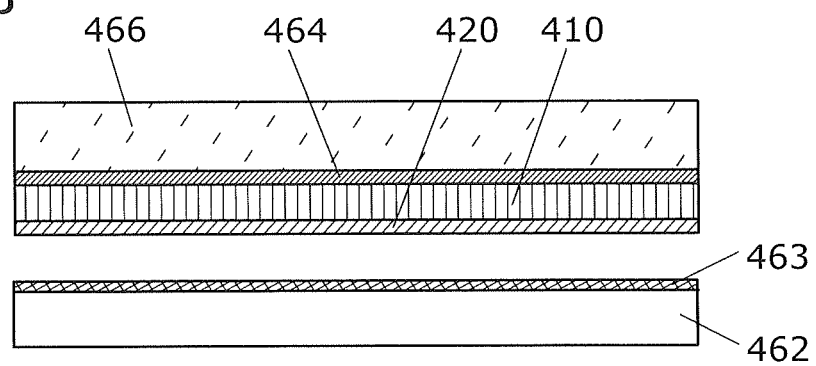

Next, the element layer 410 and the temporary supporting substrate 466 are attached with the adhesive 464 for separation, and then the insulating layer 420 and the element layer 410 are separated from the separation layer 463. Thus, the insulating film 420 and the element layer 410 are provided on the temporary supporting substrate 466 side (FIG. 35B).

Note that various methods can be used as appropriate in the process of transfer to the temporary supporting substrate 466. For example, in the case where a layer including a metal oxide film is formed at the interface between the separation layer 463 and the insulating layer 420, the metal oxide film is made to be weakened by crystallization, so that the insulating layer 420 can be separated from the separation layer 463. Alternatively, in the case where the separation layer 463 is formed using a tungsten film, separation may be performed in such a manner that the tungsten film is etched using a mixed solution of ammonia water and a hydrogen peroxide solution.

Alternatively, the insulating layer 420 may be separated from the separation layer 463 by filling the interface between the separation layer 463 and the insulating layer 420 with a liquid. As the liquid, water, a polar solvent, or the like can be used, for example. The interface along which the insulating layer 420 is separated, specifically, the interface between the separation layer 463 and the insulating layer 420 is filled with a liquid, whereby an influence of static electricity and the like generated owing to the separation on the element layer 410 can be reduced.

Figure 35C:
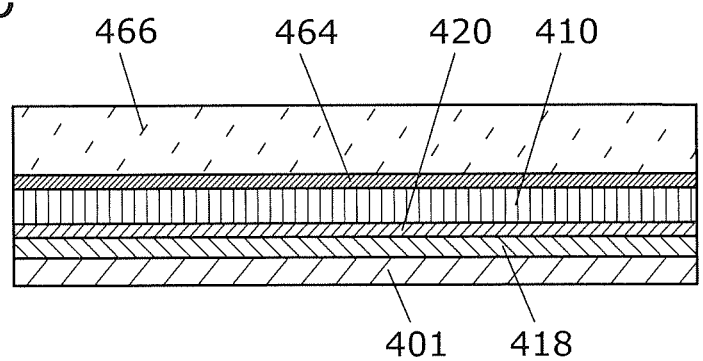
Figure 35D:
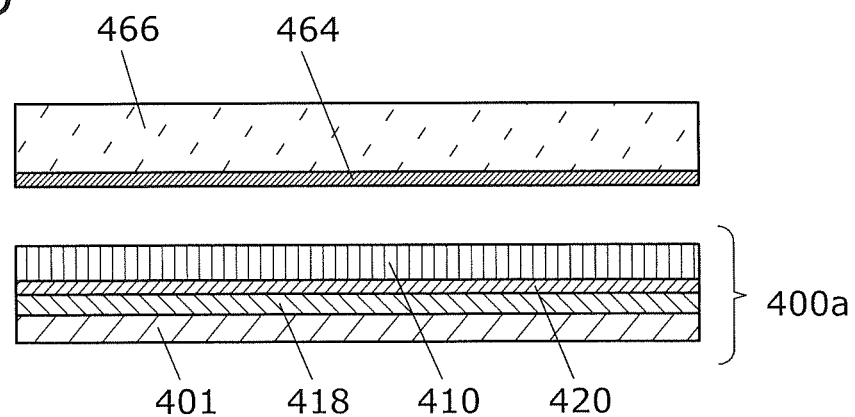

Next, the substrate 401 is attached to the insulating layer 420 using the adhesive layer 418 (FIG. 35C). Then, the adhesive 464 for separation and the temporary supporting substrate 466 are removed from the element layer 410 by dissolving or plasticizing the adhesive 464 for separation (see FIG. 35D). Note that the adhesive 464 for separation is preferably removed by water, a solvent, or the like to expose the surface of the element layer 410. In the above manner, the element substrate 400a including the element layer 410 can be manufactured over the substrate 401.

Next, by a manufacturing method similar to the steps illustrated in FIG. 35, the substrate 405, the adhesive layer 412 over the substrate 405, the insulating layer 440 over the adhesive layer 412, and the element substrate (counter substrate) 400b including the element layer 411 are formed. Then, as illustrated in FIG. 31D, the sealing layer 432 fills between the element layer 410 and the element layer 411, so that the element layer 410 and the element layer 411 are attached to each other Through the above steps, the display panel 400 can be manufactured.

In the display panel 400 illustrated in FIG. 31D, an FPC may be connected to a terminal portion of the element layer 410 with an anisotropic conductive film. Furthermore, an IC chip or the like may be mounted as necessary.

Embodiment 6

In this embodiment, a display device, an electric appliance provided with a display portion (display device), and the like are described as examples of a semiconductor device. The display device (or the display panel) described in Embodiment 1 and the like can be used for a display portion of an electronic appliance.

<<Display Device>>

Figure 36A:
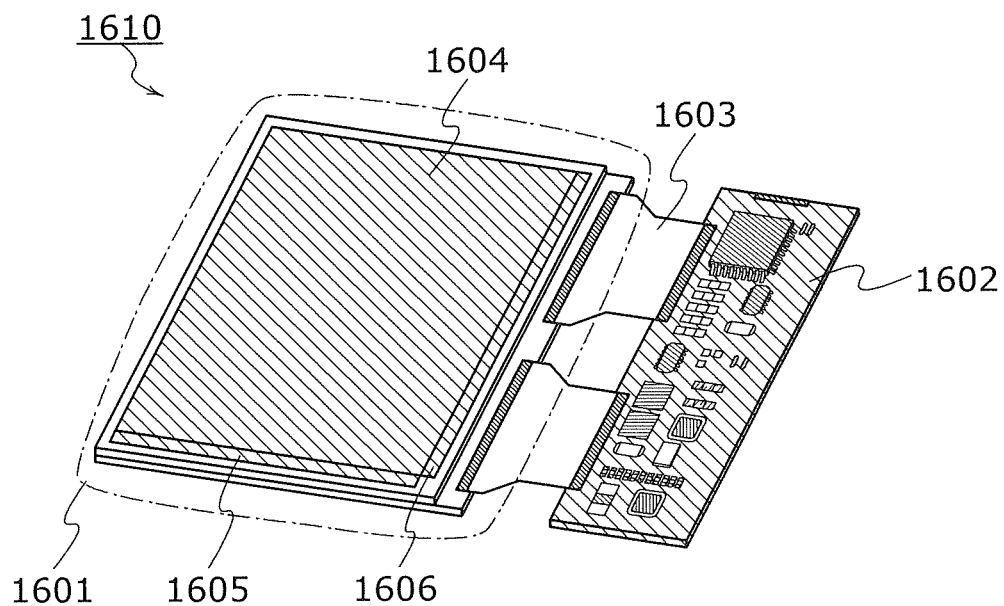
FIGS. 36A and 36B show diagrams explaining examples of a structure of a display device.

FIG. 36A is a perspective view illustrating an example of an external view of a display device. As illustrated in FIG. 36A, a display device 1610 includes a panel 1601, a circuit board 1602, and joints 1603. The panel 1601 includes a pixel portion 1604 provided with a plurality of pixels, a driver circuit 1605 that selects pixels row by row, and a driver circuit 1606 that controls input of an image signal Sig to the pixels in a selected row. The circuit board 1602 includes a controller, a power supply circuit, an image processing circuit, an image memory, a CPU, and the like.

A variety of signals and power supply potentials are input from the circuit board 1602 to the panel 1601 through the joints 1603. As the joint 1603, an FPC or the like can be used. The chip-mounted FPC is referred to as a COF tape, and use of a COF tape enables higher-density packaging in a smaller area. Furthermore, in the case where a COF tape is used as the joint 1603, part of circuits in the circuit board 1602 or part of the driver circuit 1605 or the driver circuit 1606 included in the panel 1601 may be formed on a chip separately prepared, and the chip may be connected to the COF tape by a COF method.

Figure 36B:
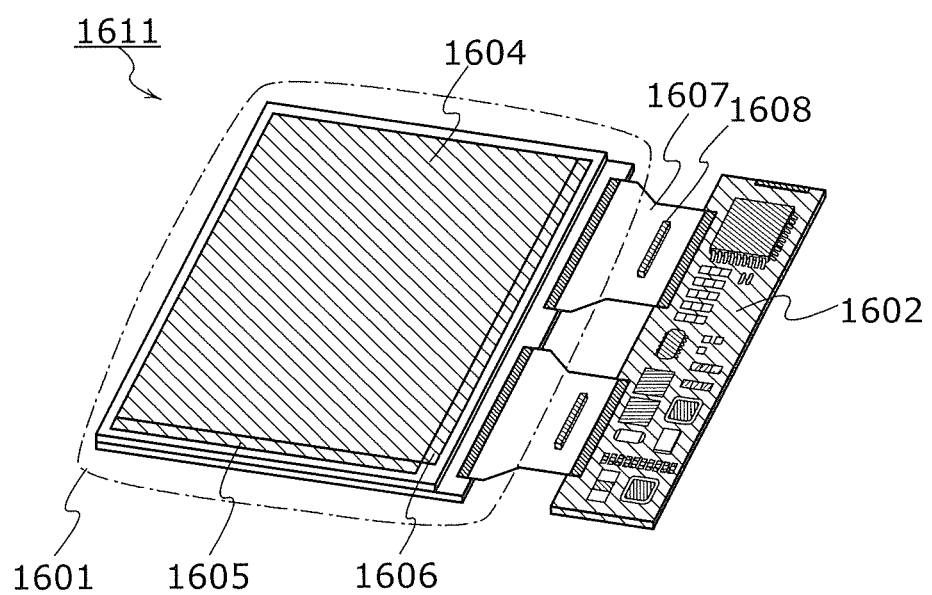

In addition, FIG. 36B illustrates a perspective view of an example of the appearance of a display device using a COF tape 1607. As illustrated in FIG. 36B, in a display device 1611, a chip 1608 is a semiconductor bare chip including a terminal such as bump on its surface (e.g., IC or LSI). Furthermore, CR components can also be mounted on the COF tape 1607, so that the area of the circuit board 1602 can be reduced. There is a plurality of wiring patterns of a flexible substrate depending on a terminal of a mounted chip. The chip 1608 is mounted using a bonder apparatus or the like in such a manner that the position is determined and arrangement is performed over the flexible substrate having a wiring pattern and thermocompression bonding is performed.

Although FIG. 36B illustrates the example in which one COF tape 1607 is mounted on one chip 1608, it is not particularly limited thereto. Chips may be mounted in a plurality of lines on one side or both sides of one COF tape 1607; however, for cost reduction, the number of lines is preferably one in order to reduce the number of mounted chips, and the number of mounted chips is further preferably one.

<Structural Example of Circuit Board>

Figure 37:
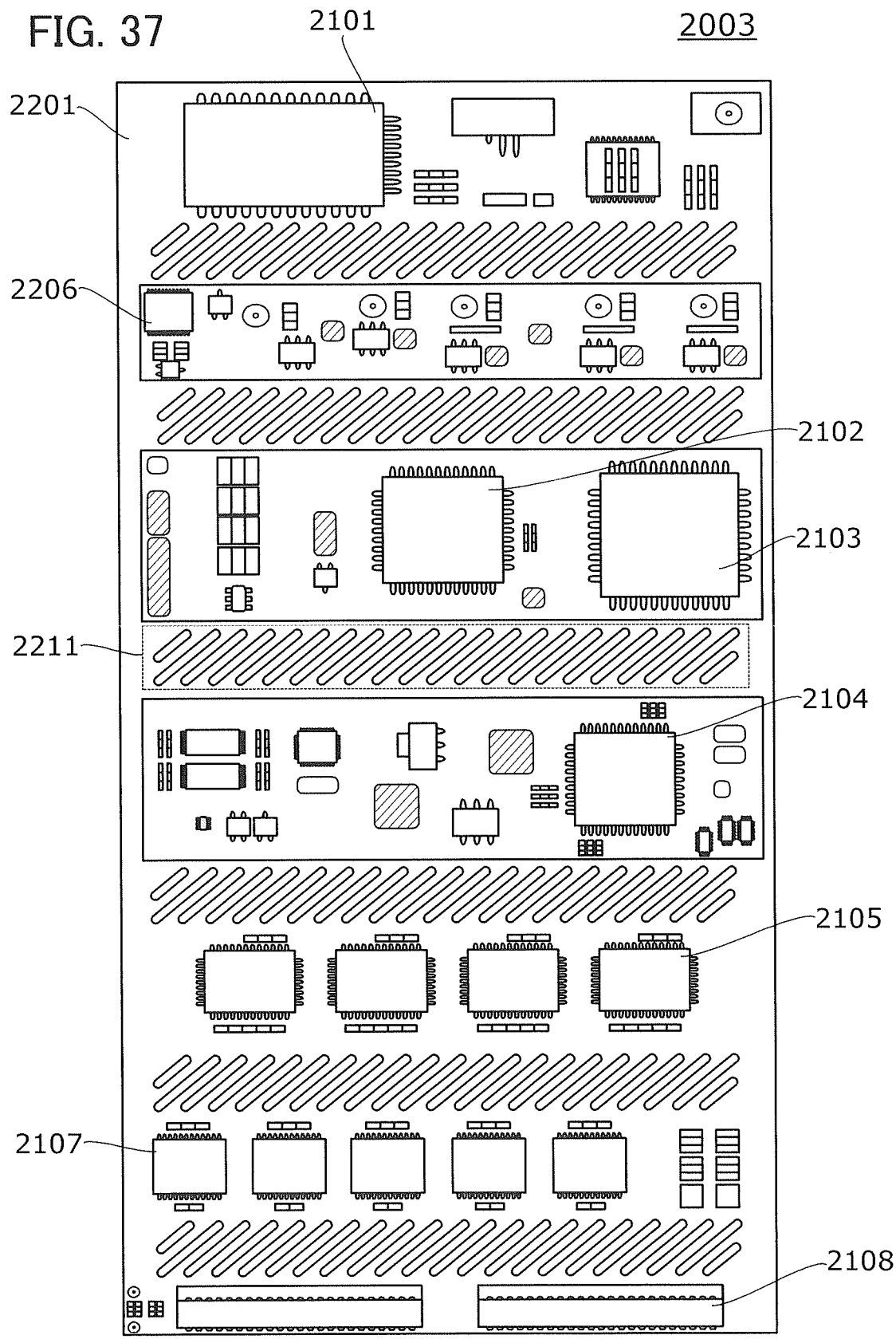
FIG. 37 shows a diagram illustrating an example of a structure of a circuit board of a display device.

FIG. 37 is an external view of a circuit board 2003. The circuit board 2003 has a structure in which, on an FPC 2201 having a slit 2211, a communication device 2101 conforming to Bluetooth (registered trademark, the same as IEEE802.15.1) standards, a microcomputer 2012, a storage device 2103, an FPGA 2104, a DA converter 2105, a charge control IC 2106, and a level shifter 2107 are provided. Furthermore, the circuit board 2003 is electrically connected to a display device of one embodiment of the present invention through an input-output connector 2108. In addition, the slit 2211 is provided for the FPC 2201, whereby the flexibility of the circuit board 2003 using the FPC 2201 can be increased.

When a flexible substrate is used in the display device, the display device can be bent together with the circuit board 2003. Thus, the display device including a flexible substrate and the circuit board 2003 can be bent repeatedly along the shape of a wearing portion; therefore, they are suitable for use in electronic appliances that can be worn on arms, legs, and the like.

<<Structure Example of Data Processing Device>

Figure 38A:
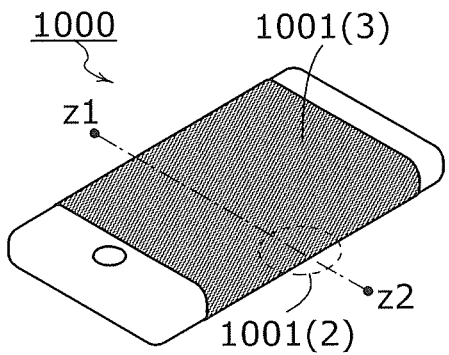
FIGS. 38A to 38E show diagrams illustrating examples of a structure of a data processing device.
Figure 38B:
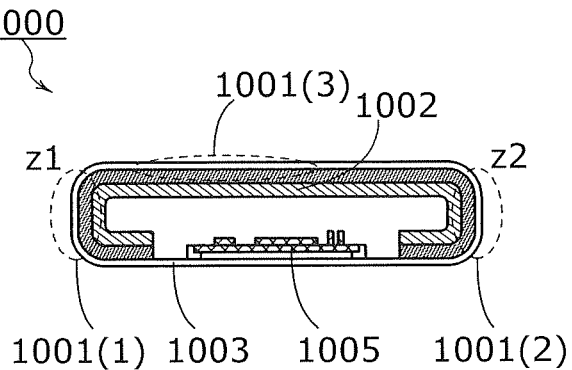
Figure 38C:
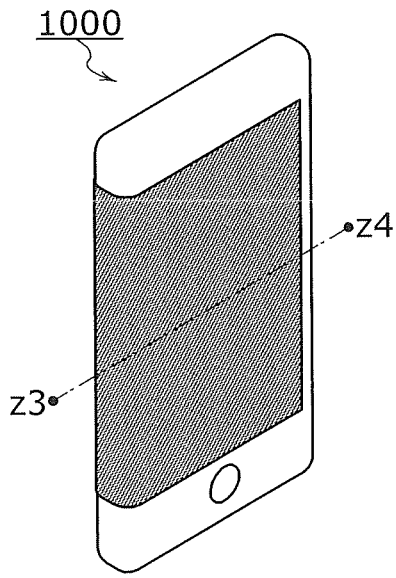
Figure 38D:
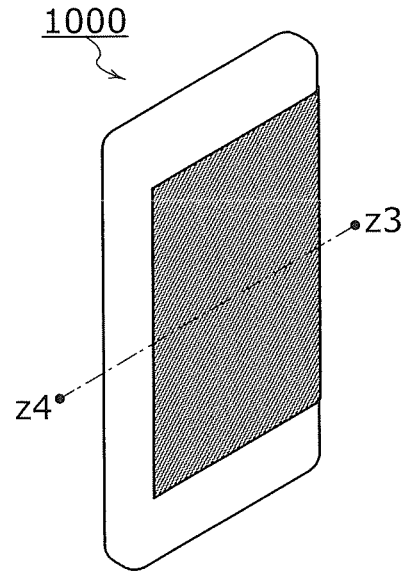
Figure 38E:
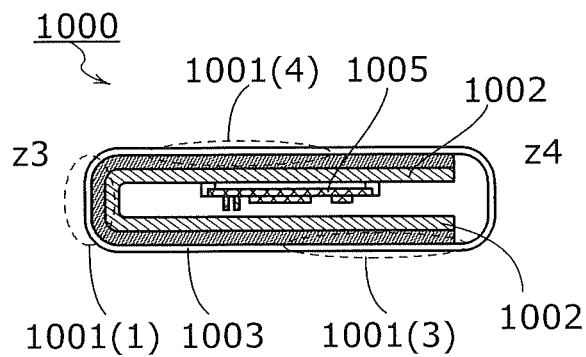

FIG. 38A is a schematic view illustrating the appearance of a data processing device 1000, and FIG. 38B is a schematic view illustrating a cross-sectional structure along a z1-z2 line in FIG. 38A. FIG. 38C and FIG. 38D are schematic views illustrating the appearance of the data processing device 1000, and FIG. 38E is a schematic view illustrating a cross-sectional structure along a z3-z4 line in FIG. 38C and FIG. 38D. FIG. 38C is a schematic view illustrating a front surface of the data processing device 1000, and FIG. 38D is a schematic view illustrating a back surface of the data processing device 1000.

As illustrated in FIG. 38C and FIG. 38D, a position input portion 1001 or a display portion 1002 may be provided not only on the front but also on the side and back of the data processing device 1000. Alternatively, the position input portion 1001 or the display portion 1002 may be provided on the top surface of the data processing device 1000. Alternatively, the position input portion 1001 or the display portion 1002 may be provided on the bottom surface of the data processing device 1000.

Note that in addition to the position-input portion 1001, a hardware button, an external connection terminal, or the like may be provided on the surface of a housing 1003.

With such a structure, display can be performed not only on a surface parallel to the top surface of the housing 1003, as in conventional data processing devices, but also on a surface parallel to a side surface of the housing 1003. In particular, a display region is preferably provided along two or more side surfaces of the housing 1003 because the variety of display is further increased.

A display region provided along the front surface of the data processing device and display regions provided along the side surface may be independently used as display regions to display different images or the like, or two or more of the display regions may display one image or the like. For example, a continuous image may be displayed on the display region provided along the front surface of the data processing device and the display region provided along the side surface of the data processing device and the like.

Furthermore, an arithmetic device 1005 is provided inside the housing 1003. In FIG. 38B, the arithmetic device 1005 is provided to be apart from the display portion 1002. In FIG. 38E, the arithmetic device 1005 is provided to overlap with the display portion 1002.

The position-input portion 1001 has flexibility to be folded such that, for example, a first region 1001(1), a second region 1001(2) facing the first region 1001(1), and a third region 1001(3) between the first region 1001(1) and the second region 1001(2) are formed (see FIG. 38B). Alternatively, as another example, the position-input portion 1001 has flexibility to be folded such that, the first region 1001(1), the third region 1001(3), and a fourth region 1001(4) facing the third region 1001(3) are formed (see FIG. 38E).

Alternatively, for another example, it may have flexibility to be folded, such that the third region 1001(3), a fifth region 1001(5), and the fourth region 1001(4) facing the third region 1001(3) are formed.

Note that the position of the second region 1001(2) facing the first region 1001(1) is not limited to a position confronting the first region 1001(1), and includes a position facing the first region 1001(1) with an inclination. Furthermore, the position of the fourth region 1001(4) facing the third region 1001(3) is not limited to a position confronting the third region 1001(3), and includes a position facing the third region 1001(3) with an inclination.

The display portion 1002 overlaps with at least part of the first region 1001(1), the second region 1001(2), the third region 1001(3), or the fourth region 1001(4).

The data processing device 1000 includes the flexible position-input portion 1001 sensing proximity or touch of an object. In addition, the position-input portion 1001 can be bent such that the first region 10001(1), the second region 1001(2) facing the first region 1001(1), and the third region 1001(3) positioned between the first region 1001(1) and the second region 1001(2) and overlapping with the display portion 1002 are formed, for example. Thus, for example, whether or not a palm or a finger is proximate to or touches the first region 1001(1) or the second region 1001(2) can be determined. As a result, a human interface with high operability can be provided. Furthermore, a novel data-processing device with high operability can be provided.

For the substrate used in the display portion 1002, a resin that is thin enough to have flexibility can be used. As the resin, for example, polyester, polyolefin, polyamide, polyimide, aramid, epoxy, polycarbonate, and an acrylic resin can be given. Additionally, as a normal non-flexible substrate, a glass substrate, a quartz substrate, a semiconductor substrate, or the like can be used.

<<Structure Example of Electronic Appliance>>

A semiconductor device of one embodiment of the present invention can be used for display devices, notebook personal computers (PCs), and image reproducing devices provided with recording media (typically, devices which reproduce recording media such as DVDs: Digital Versatile Discs and have displays for displaying the images). Other than the above, as electronic appliances which can use the semiconductor device of one embodiment of the present invention, mobile phones, portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIG. 39 illustrate specific examples of these electronic appliances.

Figure 39A:
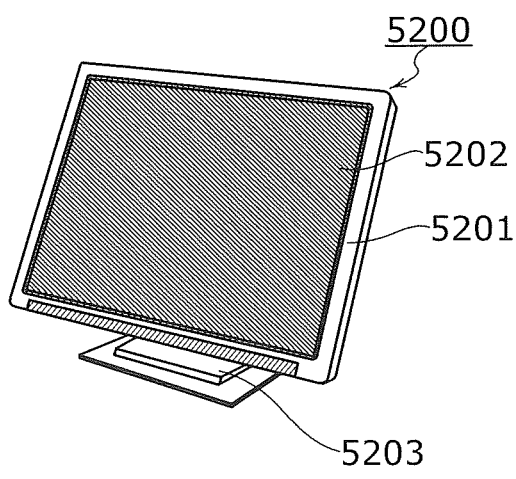
FIGS. 39A to 39F show diagrams illustrating examples of a structure of an electronic appliance.

FIG. 39A illustrates an example of the structure of a display device. A display device 5200 includes a housing 5201, a display portion 5202, a supporting base 5203, and the like. Note that there is no particular limitation on applications of the display device 5200; for example, all of display devices for displaying information such as those for personal computers, TV broadcast reception, and advertisement display are included.

Figure 39B:
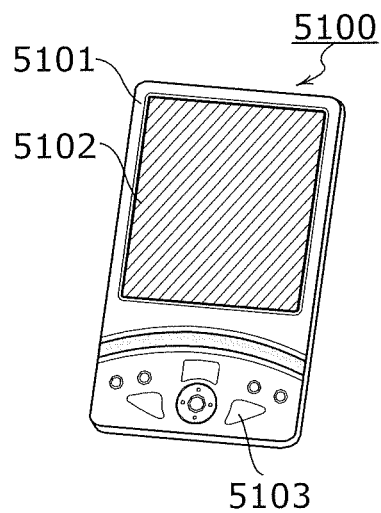

FIG. 39B illustrates an example of the structure of a portable information terminal. A portable information terminal 5100 includes a housing 5101, a display portion 5102, operation keys 5103, and the like.

Figure 39C:
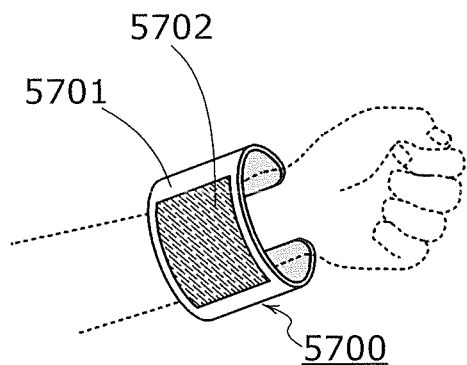

FIG. 39C illustrates an example of the structure of a display device. A display device 5700 includes a housing 5701, a display portion 5702, and the like. The display portion 5702 is supported by the housing 5701 with a curved surface. A display panel using a flexible substrate is provided in the display portion 5702; therefore, the display device 5700 which is flexible, lightweight, and user-friendly can be provided.

Figure 39D:
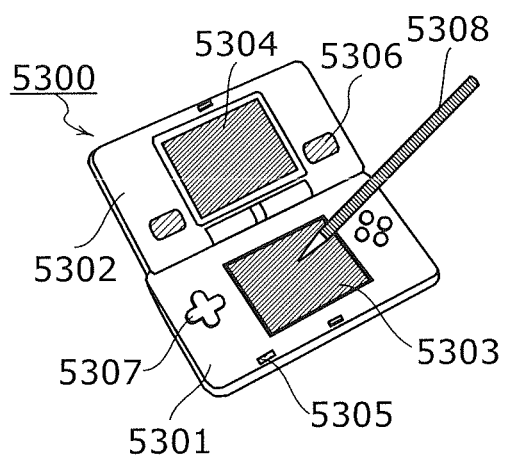

FIG. 39D illustrates an example of the structure of a portable game machine. A portable game machine 5300 includes a housing 5301, a housing 5302, a display portion 5303, a display portion 5304, a microphone 5305, a speaker 5306, an operation key 5307, a stylus 5308, and the like. Although the portable game machine 5300 includes two display portions 5303 and 5304, the number of display portions are not limited thereto, and may be one or three or more.

Figure 39E:
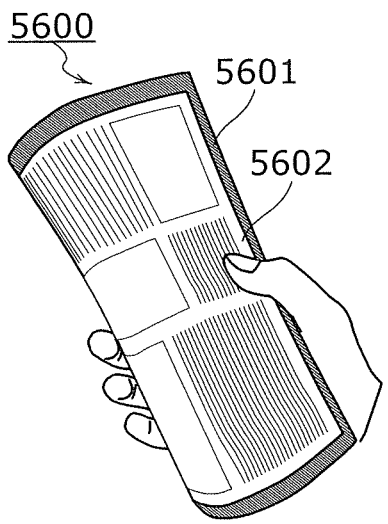

FIG. 39E illustrates an example of the structure of an e-book reader. An e-book reader 5600 includes a housing 5601, a display portion 5602, and the like. A display panel using a flexible substrate is provided in the display portion 5602. Thus, the e-book reader 5600 which is flexible, lightweight, and user-friendly can be provided.

Figure 39F:
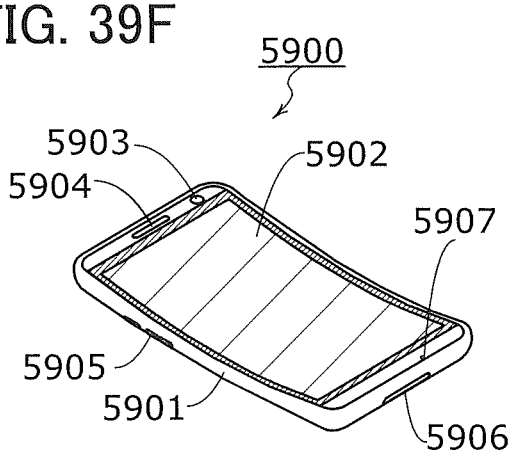

FIG. 39F illustrates an example of the structure of an information terminal 5900. The information terminal 5900 includes a display portion 5902, a microphone 5907, a speaker portion 5904, a camera 5903, an external connection portion 5906, an operation button 5905, and the like in a housing 5901. A display panel using a flexible substrate is provided in the display portion 5902. The information terminal 5900 can be used as, for example, a smartphone, a mobile phone, a tablet information terminal, a tablet PC, or an e-book reader.

REFERENCE NUMERALS 10, 20, 21 pixel
M1, M2, M3, M4, M5 transistor
C1 capacitor
EL1 light-emitting element This application is based on Japanese Patent Application serial no. 2014-037156 filed with Japan Patent Office on Feb. 27, 2014, the entire contents of which are hereby incorporated by reference.

What is claimed is:

1. A driving method of a semiconductor device, the semiconductor device comprising:
   first to fifth transistors;
   a capacitor comprising first and second electrodes;
   a pixel electrode; and
   first to fourth wirings,
   wherein the second transistor, the fourth transistor, and the third transistor are electrically connected in series between the first wiring and the third wiring,
   wherein one of a source and a drain of the first transistor is electrically connected to the second wiring supplied with a first potential,
   wherein the other of the source and the drain of the first transistor is electrically connected to the pixel electrode,
   wherein one of a source and a drain of the second transistor is electrically connected to the first wiring supplied with a data signal,
   wherein the other of the source and the drain of the second transistor is electrically connected to a first node to which a first electrode of the capacitor and the fourth transistor are electrically connected,
   wherein one of a source or drain of the third transistor is electrically connected to the third wiring supplied with a second potential,
   wherein the other of the source and the drain of the third transistor is electrically connected to a second node to which the fourth transistor and a gate of the first transistor are electrically connected,
   wherein one of a source and a drain of the fifth transistor is electrically connected to the fourth wiring supplied with a third potential, and
   wherein the other of the source and the drain of the fifth transistor is electrically connected to a third node to which a second electrode of the capacitor and the pixel electrode are connected,
the driving method of the semiconductor device comprising:
   an initializing operation, a threshold voltage correction operation after the initializing operation, a data writing operation after the threshold voltage correction operation,
   wherein the initializing operation comprises:
      turning the first transistor ON, turning the second transistor OFF, turning the third transistor ON, turning the fourth transistor ON, and turning the fifth transistor ON so that the first potential is supplied to the first node and the second node and the third potential is supplied to the third node;
   wherein the threshold voltage correcting operation comprises:
      turning the fifth transistor OFF and charging the capacitor with a drain current of the first transistor until the first transistor turning OFF,
      wherein the second transistor is OFF, and the first transistor, the third transistor, and the fourth transistor are ON during the threshold voltage correcting operation, and
   wherein the data writing operation comprises:
      turning the second transistor ON and turning the fifth transistor OFF, and inputting a potential of the data signal to the first node,
      turning the third transistor OFF after the potential of the data signal is inputted to the first node, and then turning the second transistor OFF,
      wherein the first transistor and the fourth transistor are OFF during the data writing operation.

2. The driving method according to claim 1, further comprising a light emitting operation after the data writing operation,
   wherein the light emitting operation comprises turning the fourth transistor ON,
   wherein the second transistor, the third transistor and the fifth transistor are OFF during the light emitting operation.

3. The driving method according to claim 1,
   wherein the first to fifth transistors comprises an oxide semiconductor layer including a region in which a channel is formed.

4. A driving method of a semiconductor device, the semiconductor device comprising:
   first to fifth transistors;
   a capacitor comprising first and second electrodes;
   a pixel electrode;
   first to fourth wirings; and
   first to fourth gate wirings,
   wherein the second transistor, the fourth transistor, and the third transistor are electrically connected in series between the first wiring and the third wiring, wherein one of a source and a drain of the first transistor is electrically connected to the second wiring supplied with a first potential, wherein the other of the source and the drain of the first transistor is electrically connected to the pixel electrode, wherein one of a source and a drain of the second transistor is electrically connected to the first wiring supplied with a data signal, wherein the other of the source and the drain of the second transistor is electrically connected to a first node to which a first electrode of the capacitor and the fourth transistor are electrically connected, wherein one of a source or drain of the third transistor is electrically connected to the third wiring supplied with a second potential, wherein the other of the source and the drain of the third transistor is electrically connected to a second node to which the fourth transistor and a gate of the first transistor are electrically connected, wherein one of a source and a drain of the fifth transistor is electrically connected to the fourth wiring supplied with a third potential, and wherein the other of the source and the drain of the fifth transistor is electrically connected to a third node to which a second electrode of the capacitor and the pixel electrode are connected, wherein the first to fourth gate wirings are electrically connected to gates of the second transistor, the third transistor, the fifth transistor, and the fourth transistor, respectively, the driving method of the semiconductor device comprising:

an initializing operation, a threshold voltage correction operation after the initializing operation, a data writing operation after the threshold voltage correction operation, wherein the initializing operation comprises:

turning the first transistor ON, turning the second transistor OFF, turning the third transistor ON, turning the fourth transistor ON, and turning the fifth transistor ON so that the first potential is supplied to the first node and the second node and the third potential is supplied to the third node;

wherein the threshold voltage correcting operation comprises:

turning the fifth transistor OFF and charging the capacitor with a drain current of the first transistor until the first transistor turning OFF, wherein the second transistor is OFF, and the first transistor, the third transistor, and the fourth transistor are ON during the threshold voltage correcting operation, and wherein the data writing operation comprises:

turning the second transistor ON and turning the fifth transistor OFF, and inputting a potential of the data signal to the first node, turning the third transistor OFF after the potential of the data signal is inputted to the first node, and then turning the second transistor OFF, wherein the first transistor and the fourth transistor are OFF during the data writing operation.

5. The driving method according to claim 4, further comprising a light emitting operation after the data writing operation, wherein the light emitting operation comprises turning the fourth transistor ON, wherein the second transistor, the third transistor and the fifth transistor are OFF during the light emitting operation.

6. The driving method according to claim 4, wherein the first to fifth transistors comprises an oxide semiconductor layer including a region in which a channel is formed.

* * * * *